(12) United States Patent
Niu et al.

(10) Patent No.: US 12,488,746 B2
(45) Date of Patent: Dec. 2, 2025

(54) ARRAY SUBSTRATE AND DISPLAY APPARATUS

(71) Applicant: BOE Technology Group Co., Ltd., Beijing (CN)

(72) Inventors: Jinfei Niu, Beijing (CN); Ning Cong, Beijing (CN); Can Zhang, Beijing (CN); Can Wang, Beijing (CN); Jingjing Zhang, Beijing (CN); Longfei Fan, Beijing (CN); Minghua Xuan, Beijing (CN); Xiaochuan Chen, Beijing (CN); Jiakui Yan, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/292,531

(22) PCT Filed: Feb. 24, 2023

(86) PCT No.: PCT/CN2023/078023
§ 371 (c)(1),
(2) Date: Jan. 26, 2024

(87) PCT Pub. No.: WO2024/174196
PCT Pub. Date: Aug. 29, 2024

(65) Prior Publication Data
US 2025/0322790 A1    Oct. 16, 2025

(51) Int. Cl.
*G09G 3/3233* (2016.01)
*H10D 86/40* (2025.01)
(Continued)

(52) U.S. Cl.
CPC ......... *G09G 3/3233* (2013.01); *H10D 86/441* (2025.01); *H10D 86/60* (2025.01);
(Continued)

(58) Field of Classification Search
CPC ..... G09G 3/3233; H10K 59/131; H10D 86/60
See application file for complete search history.

(56) References Cited

U.S. PATENT DOCUMENTS

| | | |
|---|---|---|
| 9,196,195 B2 | 11/2015 | Tamura et al. |
| 10,672,346 B2 | 6/2020 | Kang |

(Continued)

FOREIGN PATENT DOCUMENTS

| | | |
|---|---|---|
| CN | 1971695 A | 5/2007 |
| CN | 101211026 A | 7/2008 |

(Continued)

OTHER PUBLICATIONS

International Search Report & Written Opinion mailed Jun. 23, 2023, regarding PCT/CN2023/078023.

*Primary Examiner* — Kevin M Nguyen
(74) *Attorney, Agent, or Firm* — Intellectual Valley Law, P.C.

(57) ABSTRACT

An array substrate is provided. The array substrate includes pixels arranged in a plurality of repeating units. The array substrate includes a plurality of source electrode connecting lines and a plurality of data connecting pads in the repeating unit, and a plurality of data lines. A respective source electrode connecting line of the plurality of source electrode connecting lines connects first electrodes of a first transistor and a second transistor in a respective pixel driving circuit together. The respective source electrode connecting line is further connected to a respective data connecting pad of the plurality of data connecting pads. The respective data connecting pad is connected to a respective data line of the plurality of data lines. A maximum width of the respective source electrode connecting line is greater than at least 75% of a maximum width of a respective anode.

20 Claims, 52 Drawing Sheets

(51) Int. Cl.
    *H10D 86/60*     (2025.01)
    *H10K 59/121*     (2023.01)
    *H10K 59/131*     (2023.01)

(52) U.S. Cl.
    CPC ..... *H10K 59/1213* (2023.02); *H10K 59/1216* (2023.02); *H10K 59/131* (2023.02); *G09G 2300/0426* (2013.01); *G09G 2300/0842* (2013.01); *G09G 2330/06* (2013.01)

(56) References Cited

U.S. PATENT DOCUMENTS

| | | |
|---|---|---|
| 2003/0117388 A1 | 6/2003 | Koyama |
| 2007/0285345 A1 | 12/2007 | Nishino et al. |
| 2008/0204434 A1 | 8/2008 | Lee et al. |
| 2009/0284679 A1 | 11/2009 | Kim et al. |
| 2019/0095017 A1 | 3/2019 | Zhao et al. |
| 2020/0035941 A1* | 1/2020 | Yoo .................. H10K 50/16 |
| 2021/0193766 A1 | 6/2021 | Liu et al. |
| 2022/0246567 A1 | 8/2022 | Lin et al. |
| 2023/0138949 A1 | 5/2023 | Wang et al. |
| 2023/0139990 A1 | 5/2023 | Lu |

FOREIGN PATENT DOCUMENTS

| | | |
|---|---|---|
| CN | 102622965 A | 8/2012 |
| CN | 105280141 A | 1/2016 |
| CN | 107479760 A | 12/2017 |
| CN | 111490068 A | 8/2020 |
| CN | 112863445 A | 5/2021 |
| CN | 112992055 A | 6/2021 |
| CN | 113192986 A | 7/2021 |
| CN | 113539130 A | 10/2021 |
| CN | 114843248 A | 8/2022 |
| CN | 115152027 A | 10/2022 |
| WO | 2022226785 A1 | 11/2022 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/078023, filed Feb. 24, 2023, the contents of which are incorporated by reference in the entirety.

TECHNICAL FIELD

The present invention relates to display technology, more particularly, to an array substrate and a display apparatus.

BACKGROUND

With the development of virtual reality imaging technology, more and more demands have been placed on resolution of a display panel. Typically, organic light emitting diode display panel have been used for image display.

SUMMARY

In one aspect, the present disclosure provides an array substrate, comprising pixels arranged in a plurality of repeating units; wherein a respective repeating unit of the plurality of repeating units comprises a plurality of pixels, a respective pixel comprising one or more subpixels; wherein the array substrate comprises a plurality of source electrode connecting lines and a plurality of data connecting pads in the repeating unit, and a plurality of data lines; a respective source electrode connecting line of the plurality of source electrode connecting lines connects first electrodes of a first transistor and a second transistor in a respective pixel driving circuit together; the respective source electrode connecting line is further connected to a respective data connecting pad of the plurality of data connecting pads; and the respective data connecting pad is connected to a respective data line of the plurality of data lines; wherein the array substrate further comprises a plurality of anodes; a respective anode of the plurality of anodes has a first width along a direction substantially parallel to a first direction; and a width of the respective source electrode connecting line along the direction substantially parallel to the first direction is greater than at least 75% of the first width.

Optionally, in the repeating unit, a number of pixel driving circuits is N, N being an integer equal to or greater than 1; a number of data lines configured to provide data signals to the repeating unit is (N/2); a number of data connecting pads in the repeating unit is (N/2); and a number of source electrode connecting lines in the repeating unit is (N/2).

Optionally, in the repeating unit, first electrodes of four transistors respectively in two pixel driving circuits respectively in two adjacent pixels in the same column are connected to a same source electrode connecting line; and wherein the four transistor comprises a first transistor and a second transistor in a first pixel driving circuit in a first adjacent pixel in the same column, and a first transistor and a second transistor in a second pixel driving circuit in a second adjacent pixel in the same column.

Optionally, the array substrate further comprises a plurality of drain electrode connecting lines in the repeating unit; and a respective drain electrode connecting line of the plurality of drain electrode connecting lines connects second electrodes of the first transistor and the second transistor in the respective pixel driving circuit together.

Optionally, the array substrate further comprises a plurality of first node connecting lines in the repeating unit; the respective drain electrode connecting line is connected to a respective first node connecting line of the plurality of first node connecting lines; and the respective first node connecting line is electrically connected to a gate electrode of a driving transistor in the respective pixel driving circuit.

Optionally, in the repeating unit, a number of transistors having second electrodes connected to a first node in the repeating unit is 2N; a number of drain electrode connecting lines in the repeating unit is N; and a number of first node connecting lines in the repeating unit is N.

Optionally, the array substrate further comprises a plurality of first connecting pads, a plurality of first connecting pads, and a plurality of first capacitor electrodes in the repeating unit; the respective first node connecting line is connected to a respective first connecting pad of the plurality of first connecting pads; and a respective first connecting pad of the plurality of first connecting pads is connected to a respective first capacitor electrode of the plurality of first capacitor electrodes.

Optionally, the array substrate further comprises a plurality of second node connecting lines, a plurality of second connecting pads, and a plurality of anode connecting pads in the repeating unit; a respective second node connecting line of the plurality of second node connecting lines is connected to a second electrode of a driving transistor in the respective pixel driving circuit; the respective second node connecting line is connected to a respective second connecting pad of the plurality of second connecting pads; the respective second connecting pad is connected to a respective anode connecting pad of a plurality of anode connecting pads; and the respective anode connecting pad is connected to an anode of a respective subpixel.

Optionally, the array substrate further comprises a low voltage signal network configured to be provided with a low voltage signal; wherein the low voltage signal network comprises a first interference prevention block configured to shield at least portions of active layers of the first transistor and a driving transistor from electromagnetic interference; wherein the first interference prevention block is in a same layer as the active layers of the first transistor and the driving transistor.

Optionally, the low voltage signal network further comprises a third interference prevention block configured to shield at least portions of active layers of the first transistor and the driving transistor from electromagnetic interference; wherein the third interference prevention block is connected to the first interference prevention block, and in a layer different from the first interference prevention block; and an orthographic projection of the third interference prevention block on a base substrate at least partially overlaps with an orthographic projection of active layers of multiple driving transistors in the repeating unit on the base substrate.

Optionally, the low voltage signal network further comprises a ground plate connected to the third interference prevention block, and in a layer different from the first interference prevention block or the third interference prevention block; wherein the ground plate in the repeating unit extends throughout at least 50% of the repeating unit; and an orthographic projection of the ground plate on the base substrate at least partially overlaps with an orthographic projection of the third interference prevention block in the repeating unit on the base substrate; and at least partially overlaps with an orthographic projection of the first interference prevention block in the repeating unit on the base substrate.

Optionally, the low voltage signal network further comprises a plurality of ground lines connected to the ground plate, and in a layer different from the ground plate, the first interference prevention block, or the third interference prevention block; wherein the plurality of ground lines are in a same layer as a plurality of data lines; and the plurality of ground lines and the plurality of data lines extend along a direction substantially parallel to a second direction.

Optionally, the low voltage signal network further comprises a second capacitor electrode connected to the plurality of ground lines, and in a layer different from the plurality of ground lines, the ground plate, the first interference prevention block, or the third interference prevention block.

Optionally, the array substrate further comprises an interconnected voltage supply network; wherein the interconnected voltage supply network comprises a plurality of first voltage supply lines and a plurality of voltage supply connecting lines; the plurality of first voltage supply lines extend along a direction substantially parallel to the first direction; the plurality of voltage supply connecting lines extend along a direction substantially parallel to the second direction; the plurality of first voltage supply lines are in a layer different from the plurality of voltage supply connecting lines; a respective voltage supply connecting line of the plurality of voltage supply connecting lines is connected to a respective first voltage supply line of the plurality of first voltage supply lines through one or more vias; and two adjacent voltage supply connecting lines of the plurality of voltage supply connecting lines and two adjacent first voltage supply lines of the plurality of first voltage supply lines substantially surround pixel driving circuits of the repeating unit.

Optionally, the array substrate further comprises a plurality of second voltage supply lines and a plurality of anode connecting pads in a same layer, and a cathode on a side of the plurality of second voltage supply lines away from a base substrate; wherein a respective second voltage supply line of the plurality of second voltage supply lines is connected to the cathode through one or more via.

Optionally, the array substrate further comprises a peripheral second voltage supply line in a peripheral area of the array substrate; the plurality of second voltage supply lines are connected to the peripheral second voltage supply line; and the peripheral second voltage supply line substantially surrounds a display area of the array substrate.

Optionally, the repeating unit comprises four pixels; and a respective pixel of the four pixels in the repeating unit comprises at least three subpixels.

Optionally, corresponding layers of pixel driving circuits in adjacent pixels in the repeating unit have a substantially mirror symmetry with respect to each other about a plane perpendicular to a main surface of the array substrate and substantially parallel to a plurality of data lines.

Optionally, the respective pixel driving circuit comprises a driving transistor, a first transistor, and a second transistor; and a storage capacitor having a first capacitor electrode and a second capacitor electrode; wherein a gate electrode of the driving transistor is connected to second electrodes of the first transistor and the second transistor, and is connected to the first capacitor electrode; a first electrode of the driving transistor is connected to a respective first voltage supply line of a plurality of first voltage supply lines; a second electrode of the driving transistor is connected to an anode of a light emitting element; a gate electrode of the first transistor is connected to a respective first gate line of a plurality of first gate lines; a gate electrode of the second transistor is connected to a respective second gate line of a plurality of second gate lines; first electrodes of the first transistor and the second transistor are connected to a respective data line of the plurality of data lines; and the second capacitor electrode is configured to be provided with a low voltage signal.

Optionally, the array substrate further comprises a plurality of first gate lines and a plurality of second gate lines; wherein a first respective first gate line of the plurality of first gate lines, a first respective second gate line of the plurality of second gate lines, a second respective second gate line of the plurality of second gate lines, and a second respective first gate line of the plurality of first gate lines extend through the respective repeating unit; source electrode connecting lines in the respective repeating unit are between a first group of gate lines and a second group of gate lines, the first group of gate lines comprising the first respective first gate line and the first respective second gate line, the second group of gate lines comprising the second respective second gate line and the second respective first gate line; drain electrode connecting lines of a first group of subpixels in the respective repeating unit are on a side of the first group of gate lines away from the source electrode connecting lines in the respective repeating unit; drain electrode connecting lines of a second group of subpixels in the respective repeating unit are on a side of the second group of gate lines away from the source electrode connecting lines in the respective repeating unit; and the array substrate is absent of any drain electrode connecting lines between the first group of gate lines and the second group of gate lines.

Optionally, source electrode connecting lines in the respective repeating unit are arranged in one or more columns along a second direction; a respective column of the one or more columns of source electrode connecting lines comprises a first source electrode connecting line, a second source electrode connecting line, and a third source electrode connecting line; the second source electrode connecting line is between the first source electrode connecting line and the third source electrode connecting line; the first source electrode connecting line and the third source electrode connecting line have a U shape; an opening of the U shape of the first source electrode connecting line and an opening of the U shape of the third source electrode connecting line are facing each other; and the second source electrode connecting line is between the opening of the U shape of the first source electrode connecting line and the opening of the U shape of the third source electrode connecting line.

Optionally, drain electrode connecting lines of the first group of subpixels in the respective repeating unit are arranged in one or more columns along a second direction; a respective column of the one or more columns of drain electrode connecting lines of the first group of subpixels in the respective repeating unit comprises a first drain electrode connecting line, a second drain electrode connecting line, and a third drain electrode connecting line; the second drain electrode connecting line is between the first drain electrode connecting line and the third drain electrode connecting line; the first drain electrode connecting line and the second drain electrode connecting line have a U shape; and an opening of the U shape of the first drain electrode connecting line and an opening of the U shape of the second drain electrode connecting line are facing a same direction.

Optionally, drain electrode connecting lines of the second group of subpixels in the respective repeating unit are arranged in one or more columns along the second direction; a respective column of the one or more columns of drain electrode connecting lines of the second group of subpixels in the respective repeating unit comprises a fourth drain electrode connecting line, a fifth drain electrode connecting line, and a sixth drain electrode connecting line; the fifth drain electrode connecting line is between the fourth drain electrode connecting line and the sixth drain electrode connecting line; the fifth drain electrode connecting line and the sixth drain electrode connecting line have a U shape; and an opening of the U shape of the fifth drain electrode connecting line and an opening of the U shape of the sixth drain electrode connecting line are facing a same direction.

Optionally, an orthographic projection of the second source electrode connecting line on a base substrate is non-overlapping with an orthographic projection of gate electrodes of first transistors and gate electrodes of second transistors on the base substrate; an orthographic projection of the first electrode connecting line on a base substrate partially overlaps with an orthographic projection of a gate electrode of at least one first transistor and a gate electrode of at least one second transistor on the base substrate; and an orthographic projection of the third source electrode connecting line on a base substrate partially overlaps with an orthographic projection of a gate electrode of at least one first transistor and a gate electrode of at least one second transistor on the base substrate.

Optionally, an orthographic projection of any drain electrode connecting line on a base substrate is non-overlapping with an orthographic projection of gate electrodes of first transistors, second transistors, and third transistors on the base substrate.

Optionally, the array substrate further comprises a plurality of N-well regions and a plurality of first interference prevention blocks; wherein, along a first direction, the plurality of first interference prevention blocks and the plurality of N-well regions are alternately arranged; and a respective N-well region of the plurality of N-well regions spaces apart two adjacent first interference prevention blocks of the plurality of first interference prevention blocks.

Optionally, the array substrate further comprises a plurality of second interference prevention blocks; wherein along the first direction, the plurality of first interference prevention blocks and the plurality of second interference prevention blocks are alternately arranged; a respective second interference prevention block of the plurality of second interference prevention blocks spaces apart two adjacent first interference prevention blocks of the plurality of first interference prevention blocks; a respective first interference prevention block of the plurality of first interference prevention blocks spaces apart two adjacent second interference prevention blocks of the plurality of second interference prevention blocks; and in a row of repeating units, first interference prevention blocks and second interference prevention blocks are on two opposite sides of a row of N-well regions.

Optionally, the array substrate further comprises a plurality of first node connecting lines; wherein a respective first node connecting line of the plurality of first node connecting lines has a T shape or a L shape; the respective first node connecting line comprises a first fragment and a second fragment, the first fragment and the second fragment forming two strokes of the T shape or the L shape; the first fragment is where the respective first node connecting line connected to a first capacitor electrode; and the second fragment is where the respective first node connecting line connected to a gate electrode of a third transistor.

Optionally, the array substrate further comprises a plurality of first node connecting lines and a plurality of second node connecting lines; wherein an orthographic projection of at least one second node connecting line of the plurality of second node connecting lines on a base substrate partially overlaps with an orthographic projection of a gate electrode of a second transistor on the base substrate; and an orthographic projection of a respective first node connecting line of the plurality of first node connecting lines on a base substrate partially overlaps with an orthographic projection of a gate electrode of a third transistor on the base substrate.

In another aspect, the present disclosure provides a display apparatus, comprising the array substrate described herein or fabricated by a method described herein, and one or more integrated circuits connected to the array substrate; wherein the array substrate comprises a plurality of light emitting elements; a respective light emitting element of the plurality of light emitting elements comprises an anode of the plurality of anodes; and the plurality of anodes are connected to the one or more integrated circuits.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
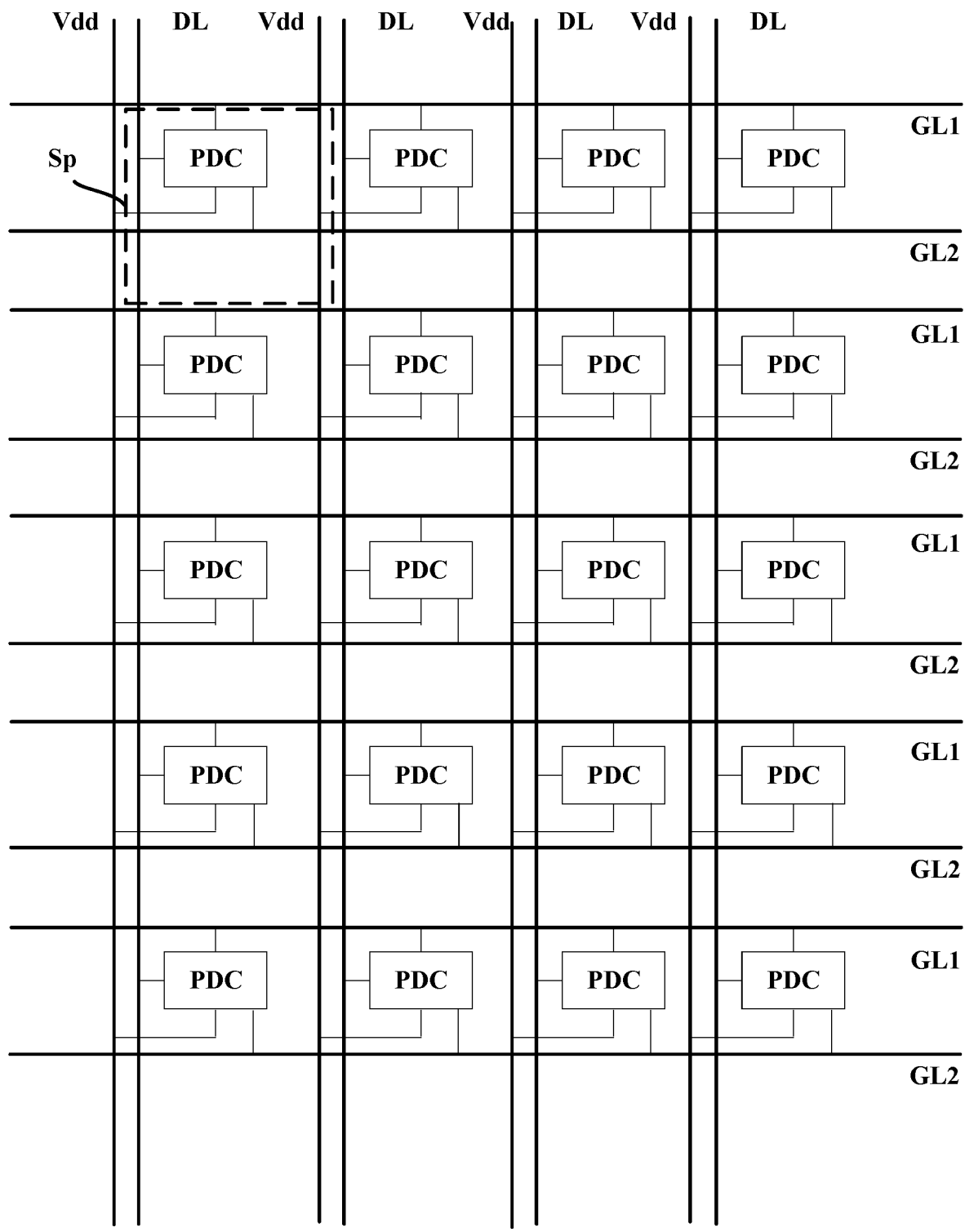
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Virtual reality display technology has been developed in recent years, users can have realistic experience in a virtual reality environment. A superb simulation system enables seamless human-machine interaction. In virtual reality display, a human eye can no longer distinguish pixel dots when the display resolution exceeds 300 pixel-per-inch, which is equivalent to 60 pixel-per-degree in spatial display. When an overlapping field-of-view for both eyes is 120 degrees, ideally the resolution required for a single eye is 7200*7200. Thus, the virtual reality display requires ultra-high display resolution.

Accordingly, the present disclosure provides, inter alia, an array substrate and a display apparatus that substantially obviate one or more of the problems due to limitations and disadvantages of the related art. In one aspect, the present disclosure provides an array substrate. In some embodiments, the array substrate includes pixels arranged in a plurality of repeating units. Optionally, a respective repeating unit of the plurality of repeating units comprises a plurality of pixels, a respective pixel comprising one or more subpixels. Optionally, the array substrate comprises a plurality of source electrode connecting lines and a plurality of data connecting pads in the repeating unit, and a plurality of data lines. Optionally, a respective source electrode connecting line of the plurality of source electrode connecting lines connects first electrodes of a first transistor and a second transistor in a respective pixel driving circuit together. Optionally, the respective source electrode connecting line is further connected to a respective data connecting pad of the plurality of data connecting pads. Optionally, the respective data connecting pad is connected to a respective data line of the plurality of data lines. Optionally, the array substrate further comprises a plurality of anodes. Optionally, a respective anode of the plurality of anodes has a first maximum width. Optionally, the respective source electrode connecting line has a second maximum width. Optionally, the second maximum width is greater than at least 75% of the first maximum width.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 3T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer. In one example, the light emitting element is an organic light emitting diode on silicon.

FIG. 1 is a plan view of an array substrate in some embodiments according to the present disclosure. Referring to FIG. 1, the array substrate in some embodiments includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of first voltage supply line Vdd, and a plurality of second voltage supply lines (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of first voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 2:
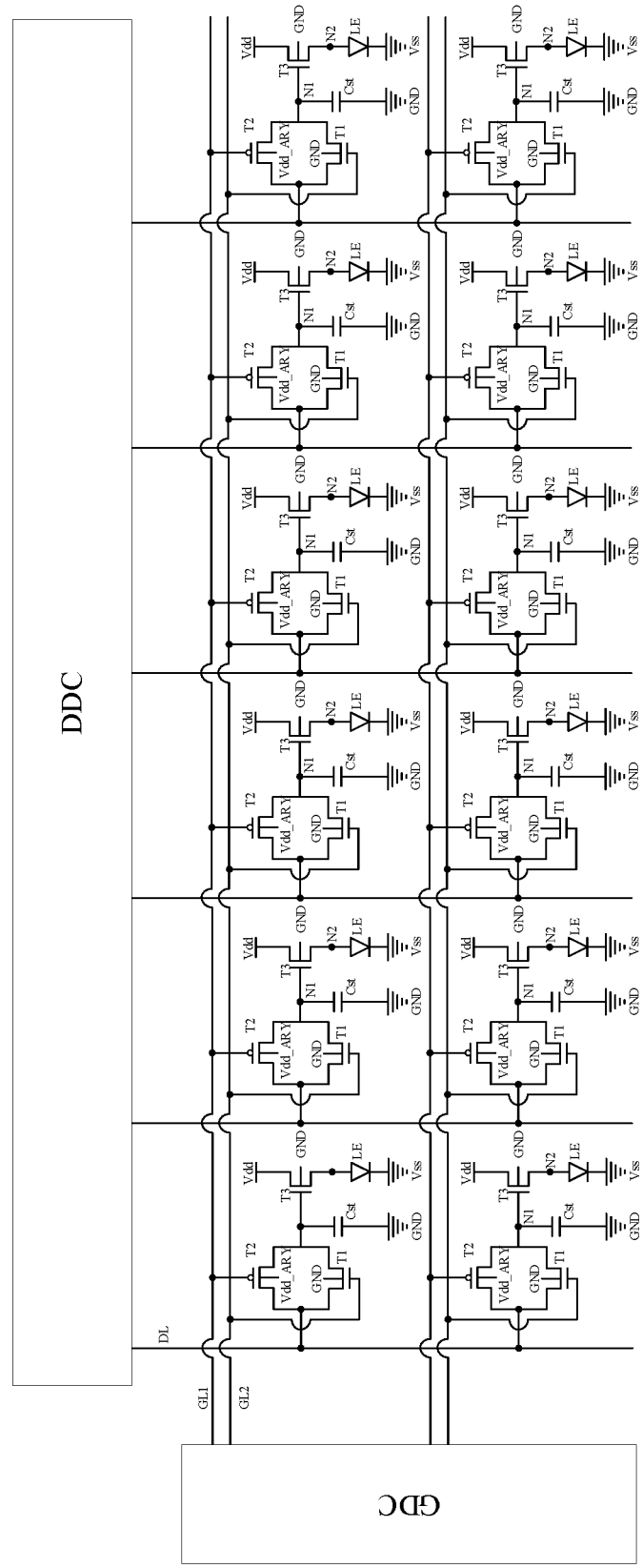
FIG. 2 is a circuit diagram of a portion of an array substrate in some embodiments according to the present disclosure.

FIG. 2 is a circuit diagram of a portion of an array substrate in some embodiments according to the present disclosure. Referring to FIG. 2, the plurality of data lines DL are connected to a data driving circuit DDC, and the plurality of gate lines (including the plurality of first gate line GL1 and the plurality of second gate lines GL2) are connected to a gate driving circuit GDC. Optionally, the data driving circuit DDC and the gate driving circuit GDC are circuits formed in the array substrate.

Figure 3:
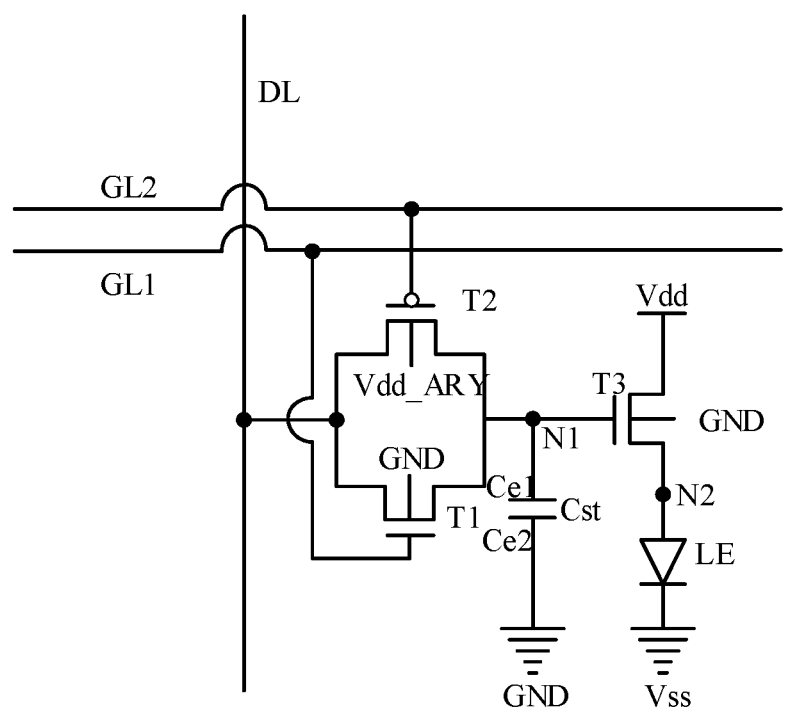
FIG. 3 is a circuit diagram illustrating the structure of a pixel driving circuit in some embodiments according to the present disclosure.

FIG. 3 is a circuit diagram illustrating the structure of a pixel driving circuit in some embodiments according to the present disclosure. Referring to FIG. 3, the pixel driving circuit in some embodiments includes a driving transistor T3, a storage capacitor Cst having a first capacitor electrode Ce1 and a second capacitor electrode Ce2; a first transistor T1, and a second transistor T2. Optionally, a gate electrode of the driving transistor T3 is connected to second electrodes of the first transistor T1 and the second transistor T2, and is connected to the first capacitor electrode Ce1. A first electrode of the driving transistor T3 is connected to a respective first voltage supply line of a plurality of first voltage supply lines Vdd. A second electrode of the driving transistor T3 is connected to an anode of a light emitting element LE. A gate electrode of the first transistor T1 is connected to a respective first gate line of the plurality of first gate lines GL1. A gate electrode of the second transistor T2 is connected to a respective second gate line of the plurality of second gate lines GL2. First electrodes of the first transistor T1 and the second transistor T2 are connected to a respective data line of the plurality of data lines DL. Optionally, the second capacitor electrode Ce2 is configured to be provided with a low voltage signal (e.g., a ground voltage signal). The pixel driving circuit in some embodiments further includes a first interference prevention block IPB1 configured to shield at least portions of active layers of the first transistor T1 and the driving transistor T3 from electromagnetic interference. The pixel driving circuit in some embodiments further includes a second interference prevention block IPB2 configured to shield at least portions of an active layer of the second transistor T2 from electromagnetic interference. Optionally, the first interference prevention block IPB1 is configured to be provided with a low voltage signal (e.g., a ground voltage signal). Optionally, the second interference prevention block IPB2 is configured to be provided with a first reference voltage signal (e.g., a high voltage signal). Optionally, a cathode of the light emitting diode is configured to be provided with a second reference voltage signal (e.g., a low voltage signal VSS).

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit in some embodiments further include a first node N1 and a second node N2. The first node N1 is connected to the gate electrode of the driving transistor T3, the first capacitor electrode Ce1, and the second electrodes of the first transistor T1 and the second transistor T2. The second node N2 is connected to the second electrode of the driving transistor T3 and the anode of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In some embodiments, a minimum repeating unit of the plurality of subpixels of the array substrate includes the respective first subpixel, the respective second subpixel, and the respective third subpixel. Optionally, each of the respective first subpixel, the respective second subpixel, and the respective third subpixel, includes the first transistor T1, the second transistor T2, the driving transistor T3, the storage capacitor Cst. Optionally, each of the respective first subpixel, the respective second subpixel, and the respective third subpixel, further includes the first interference prevention block IPB1 and the second interference prevention block IPB2.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 3, in some embodiments, the first transistor T1 and the driving transistor T3 are an n-type transistor such as a metal oxide transistor, and the second transistor T2 is p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 4A:
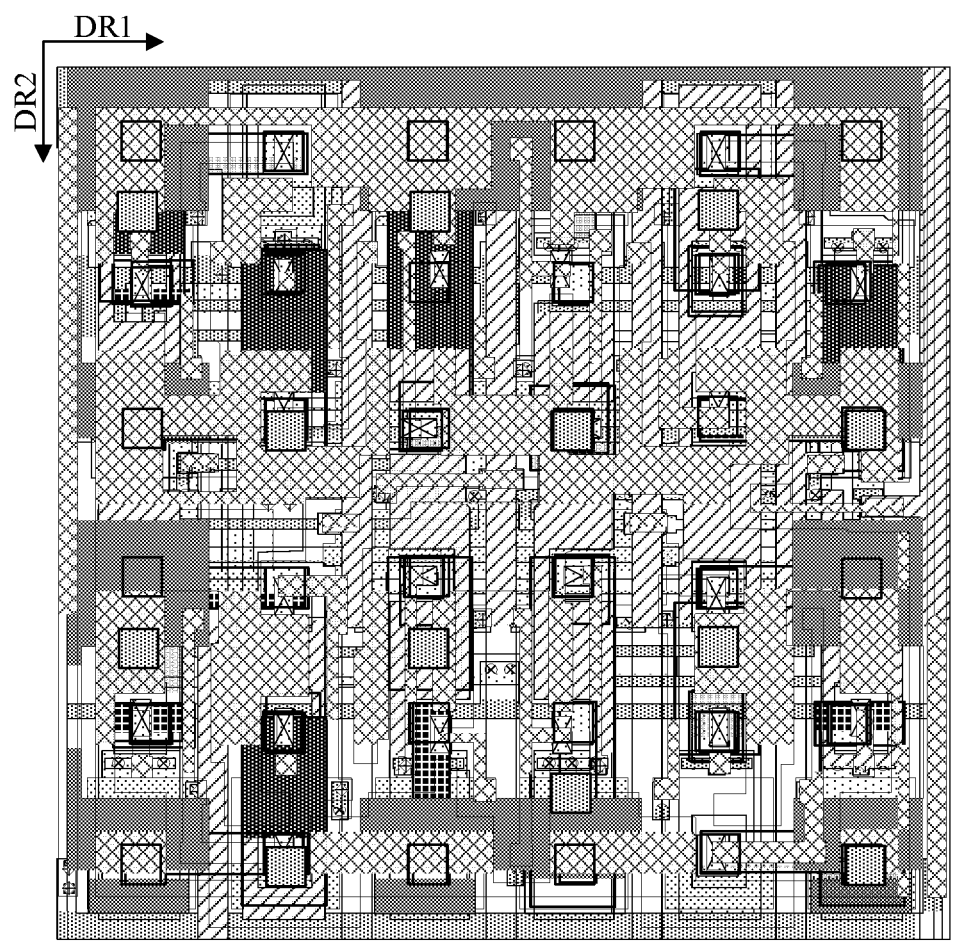
FIG. 4A is a diagram illustrating the structure of pixel driving circuits in an array substrate in some embodiments according to the present disclosure.
Figure 4B:
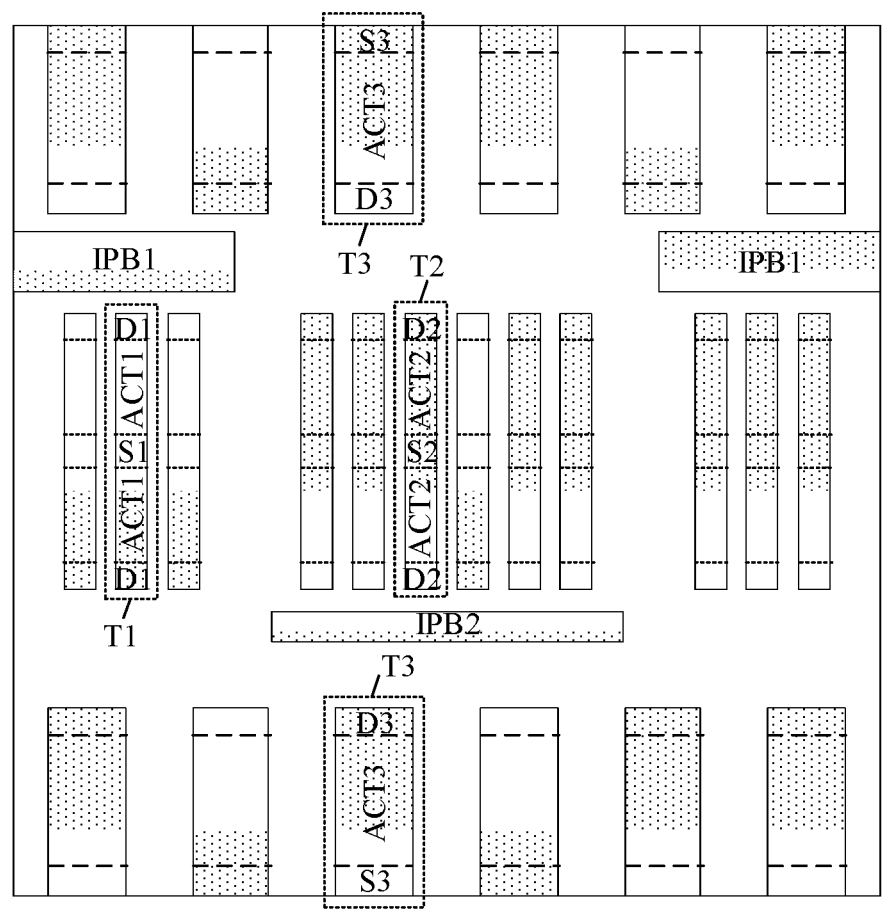
FIG. 4B is a diagram illustrating the structure of a semiconductor material layer in the array substrate depicted in FIG. 4A.
Figure 4C:
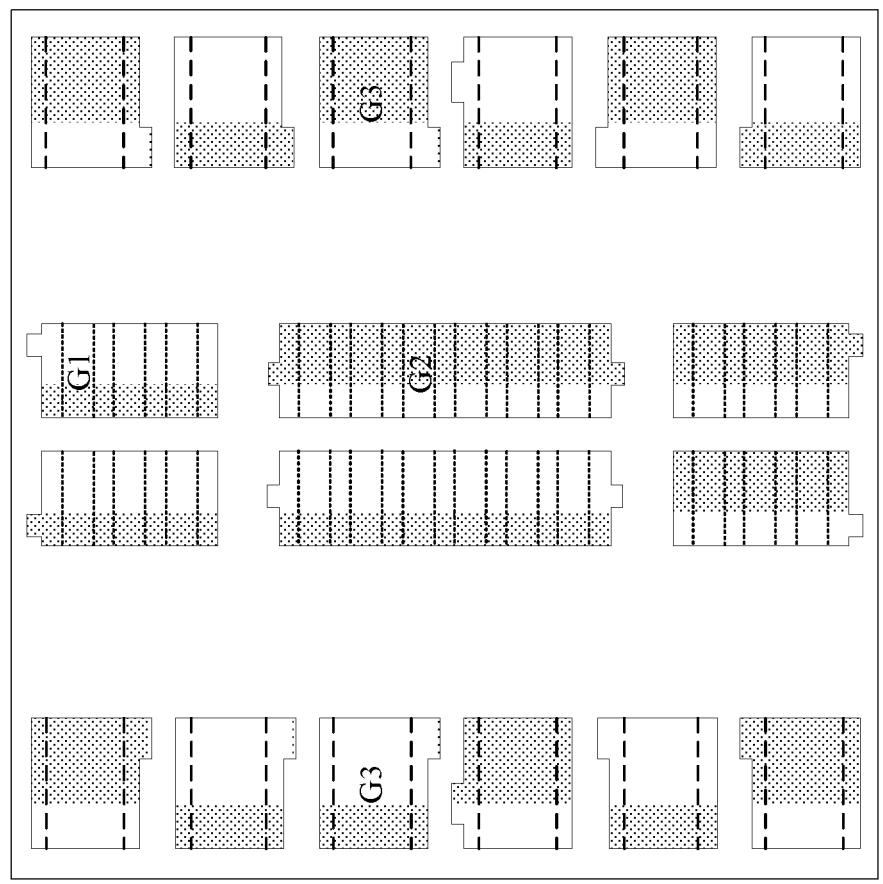
FIG. 4C is a diagram illustrating the structure of a gate metal layer in the array substrate depicted in FIG. 4A.
Figure 4D:
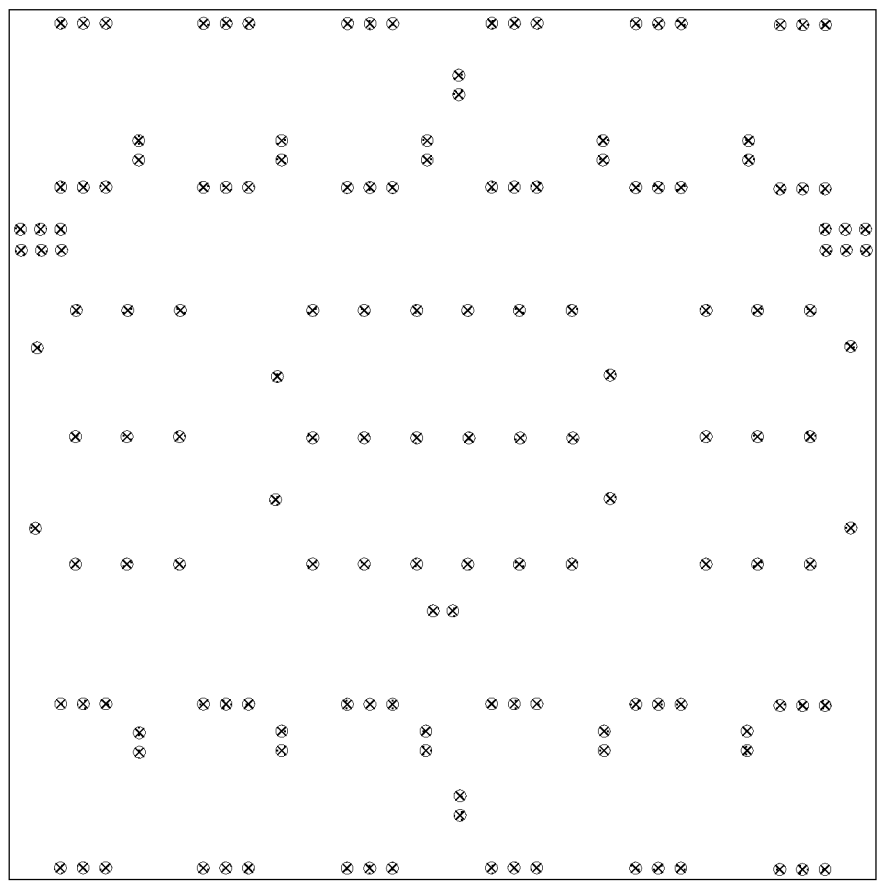
FIG. 4D is a diagram illustrating vias extending through a gate insulating layer in the array substrate depicted in FIG. 4A.
Figure 4E:
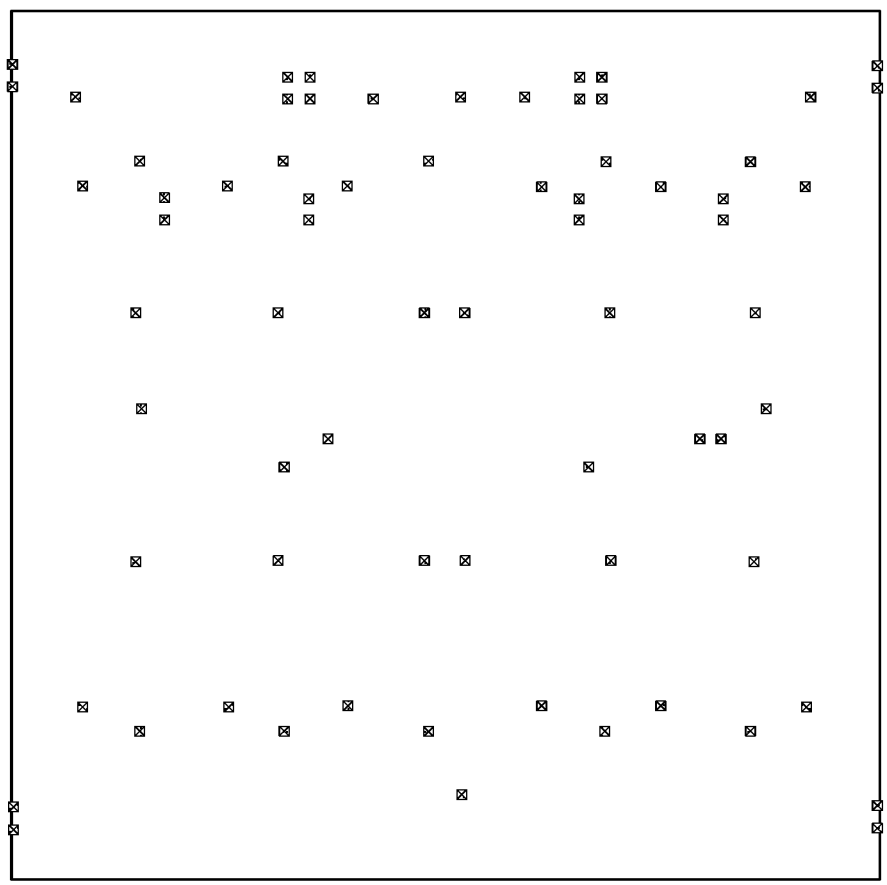
FIG. 4E is a diagram illustrating vias extending through an insulating layer in the array substrate depicted in FIG. 4A.
Figure 4F:
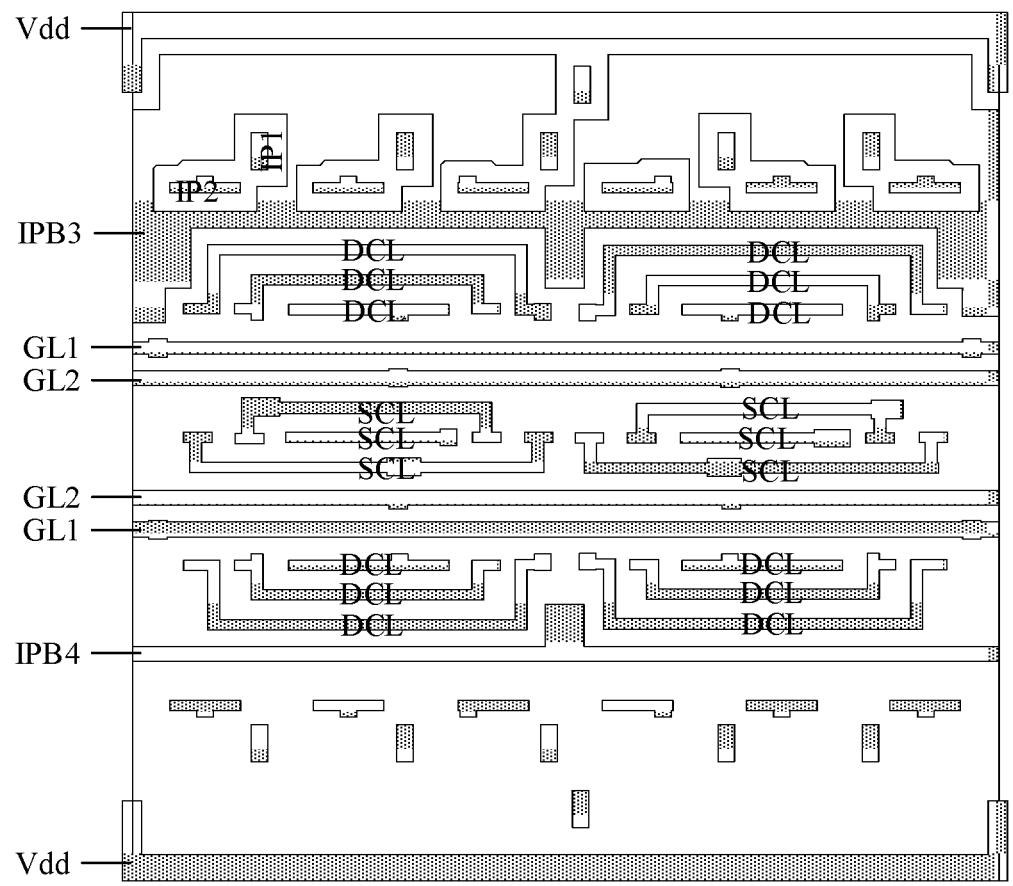
FIG. 4F is a diagram illustrating the structure of a first signal line layer in the array substrate depicted in FIG. 4A.
Figure 4G:
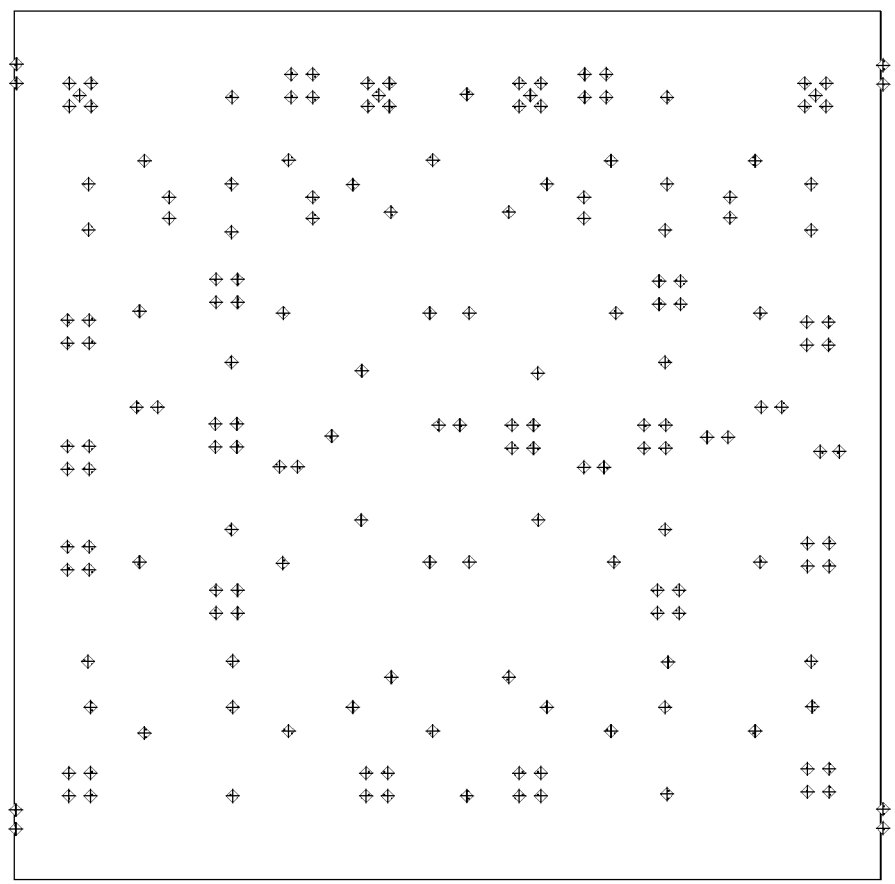
FIG. 4G is a diagram illustrating vias extending through a first inter-layer dielectric layer in the array substrate depicted in FIG. 4A.
Figure 4H:
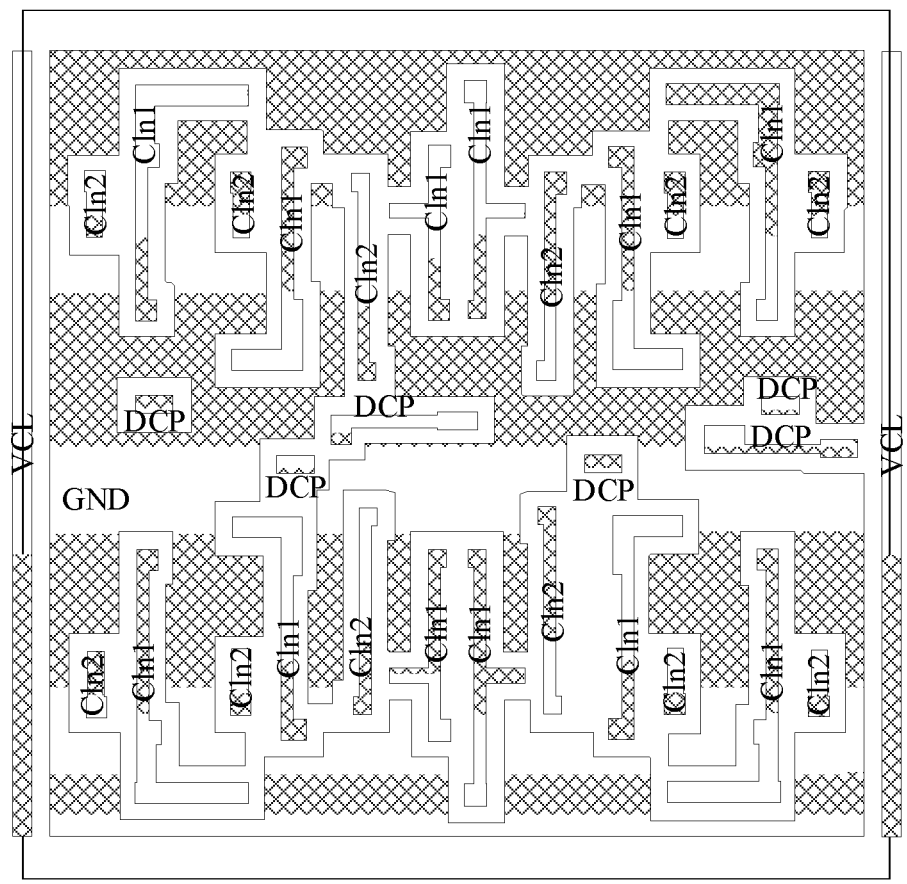
FIG. 4H is a diagram illustrating the structure of a second signal line layer in the array substrate depicted in FIG. 4A.
Figure 4I:
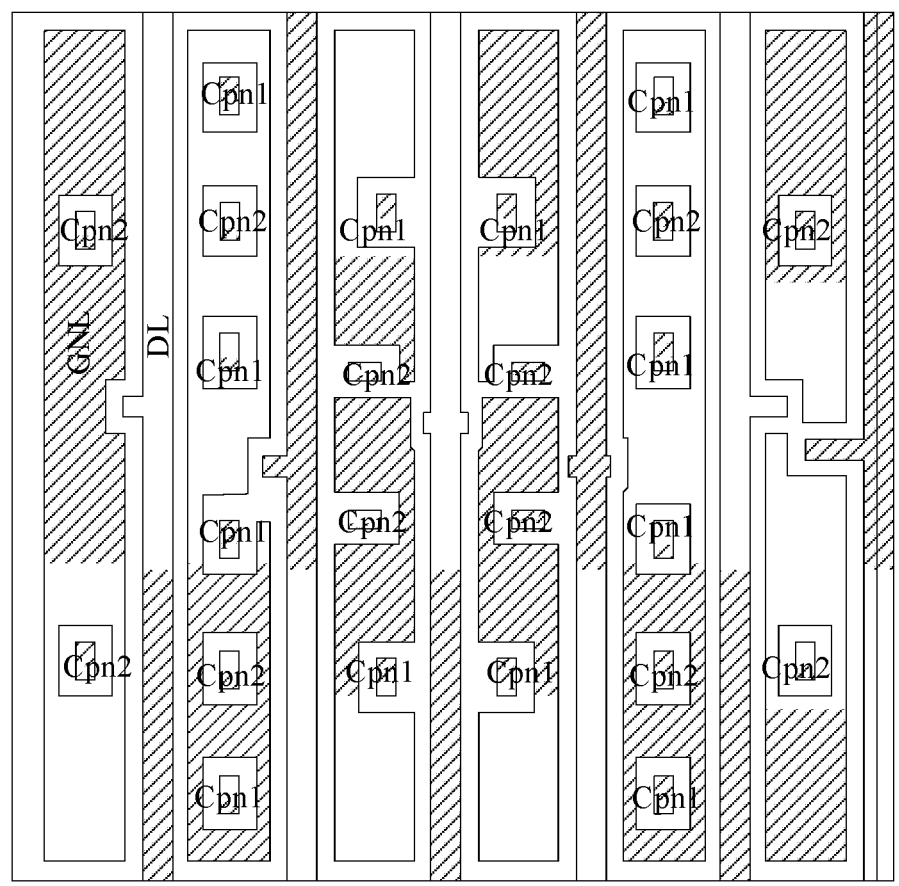
FIG. 4I is a diagram illustrating the structure of a third signal line layer in the array substrate depicted in FIG. 4A.
Figure 4J:
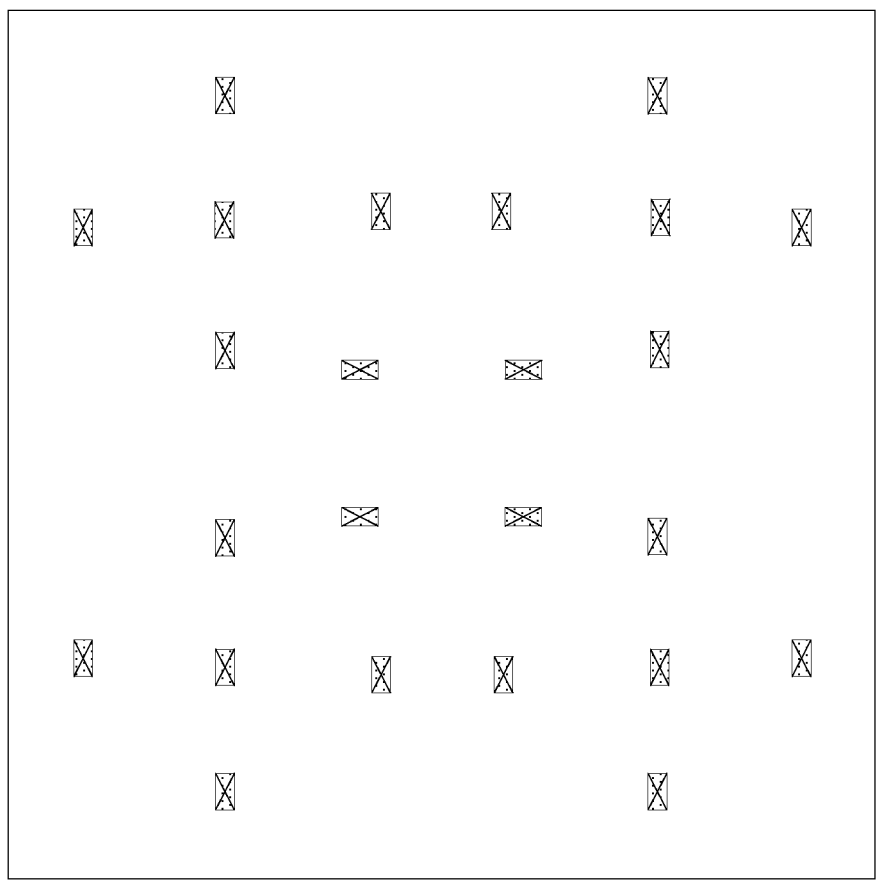
FIG. 4J is a diagram illustrating vias extending through a third inter-layer dielectric layer in the array substrate depicted in FIG. 4A.
Figure 4K:
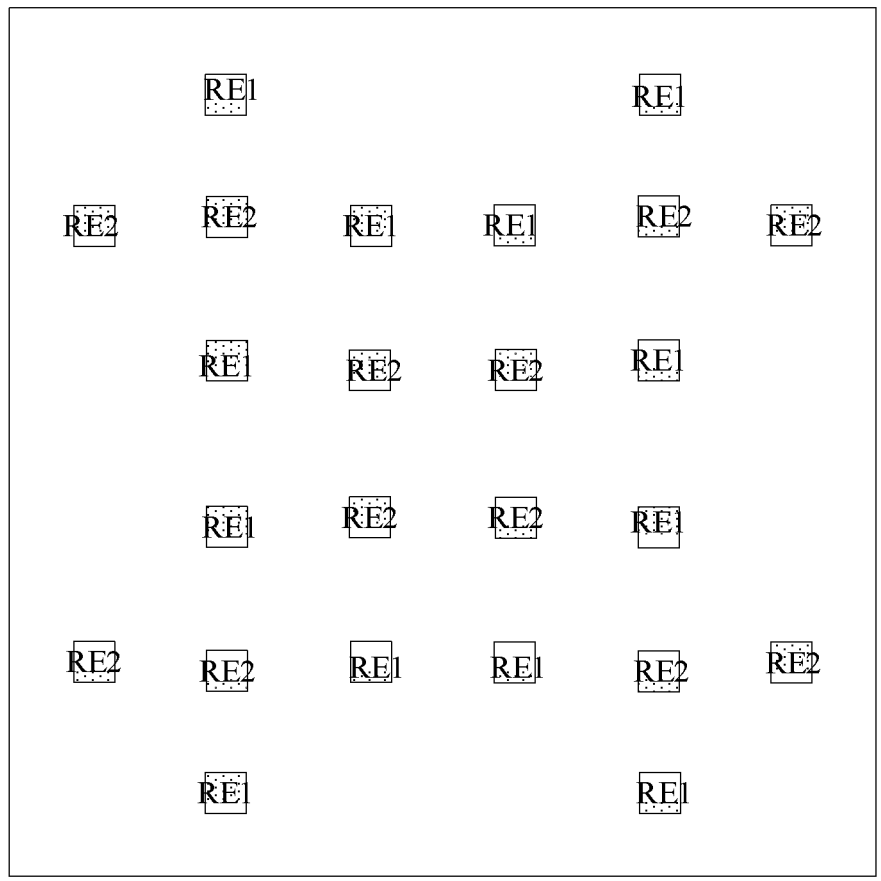
FIG. 4K is a diagram illustrating the structure of a fourth signal line layer in the array substrate depicted in FIG. 4A.
Figure 4L:
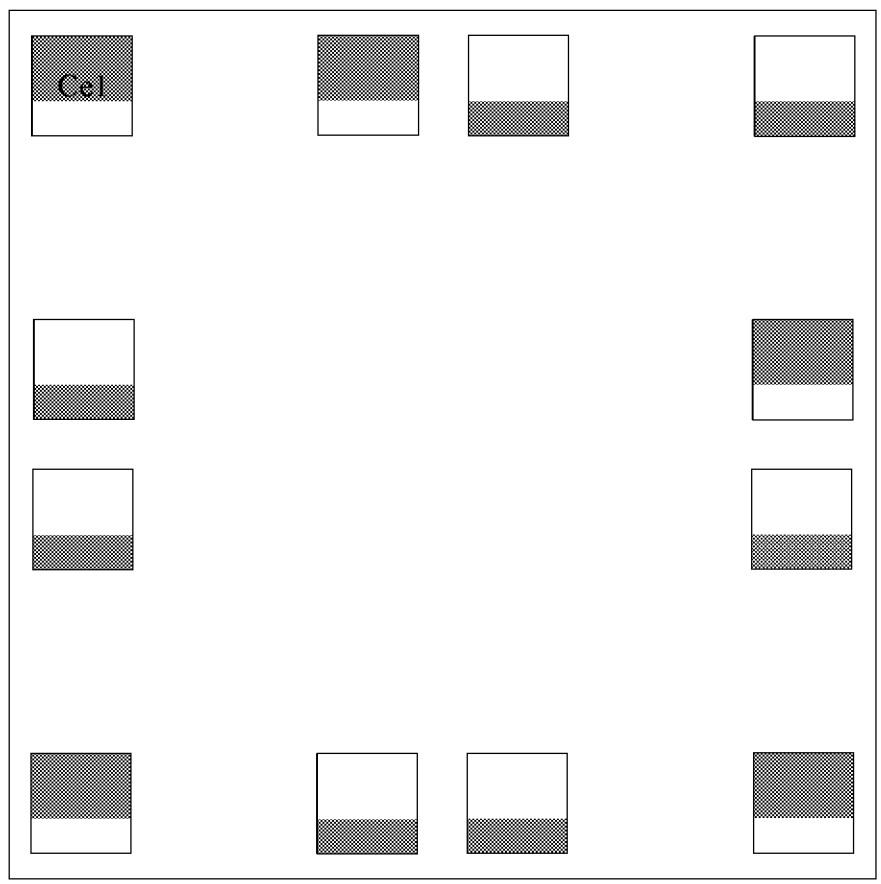
FIG. 4L is a diagram illustrating the structure of a first conductive layer in the array substrate depicted in FIG. 4A.
Figure 4M:
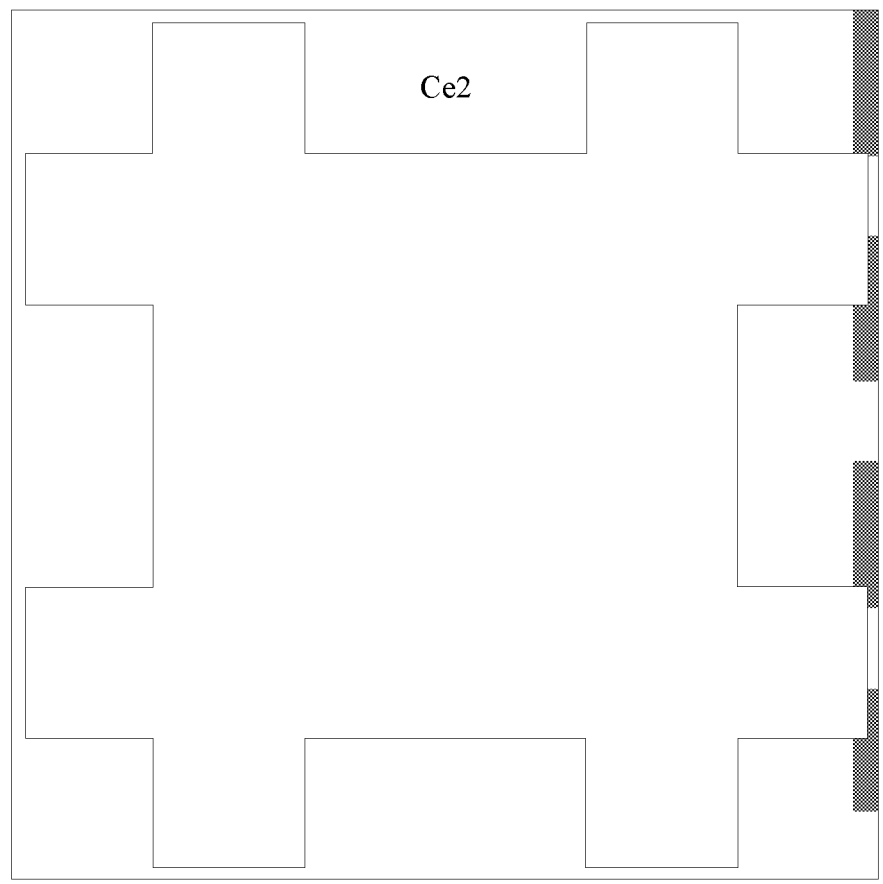
FIG. 4M is a diagram illustrating the structure of a second conductive layer in the array substrate depicted in FIG. 4A.
Figure 4N:
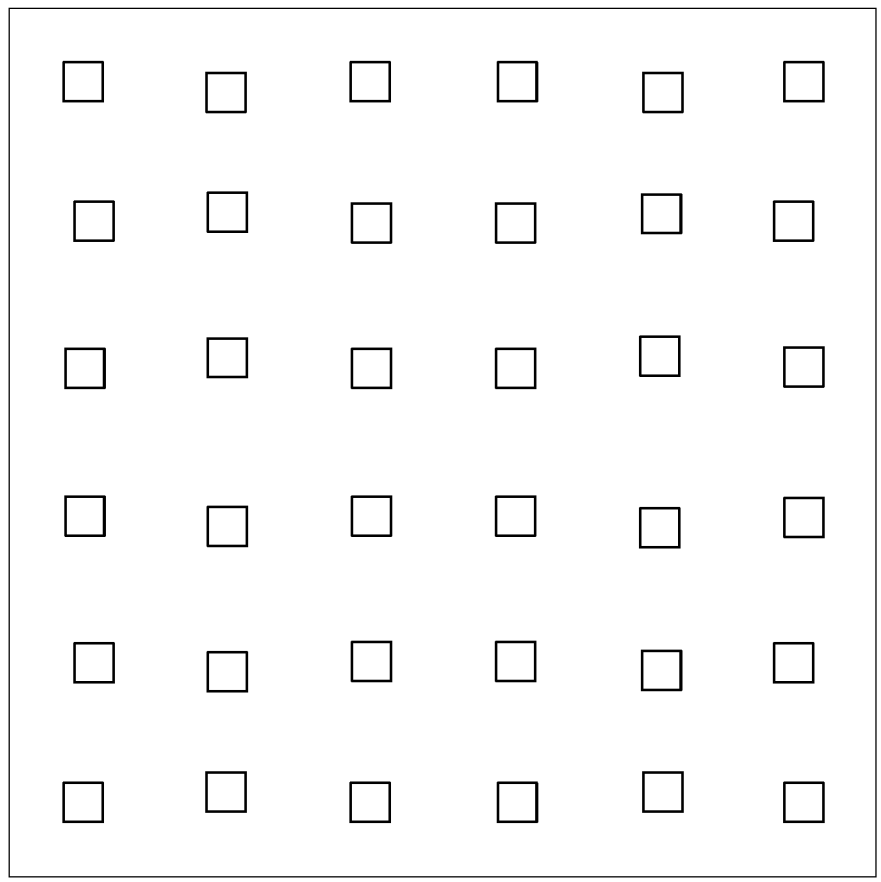
FIG. 4N is a diagram illustrating vias extending through a third passivation layer in the array substrate depicted in FIG. 4A.
Figure 4O:
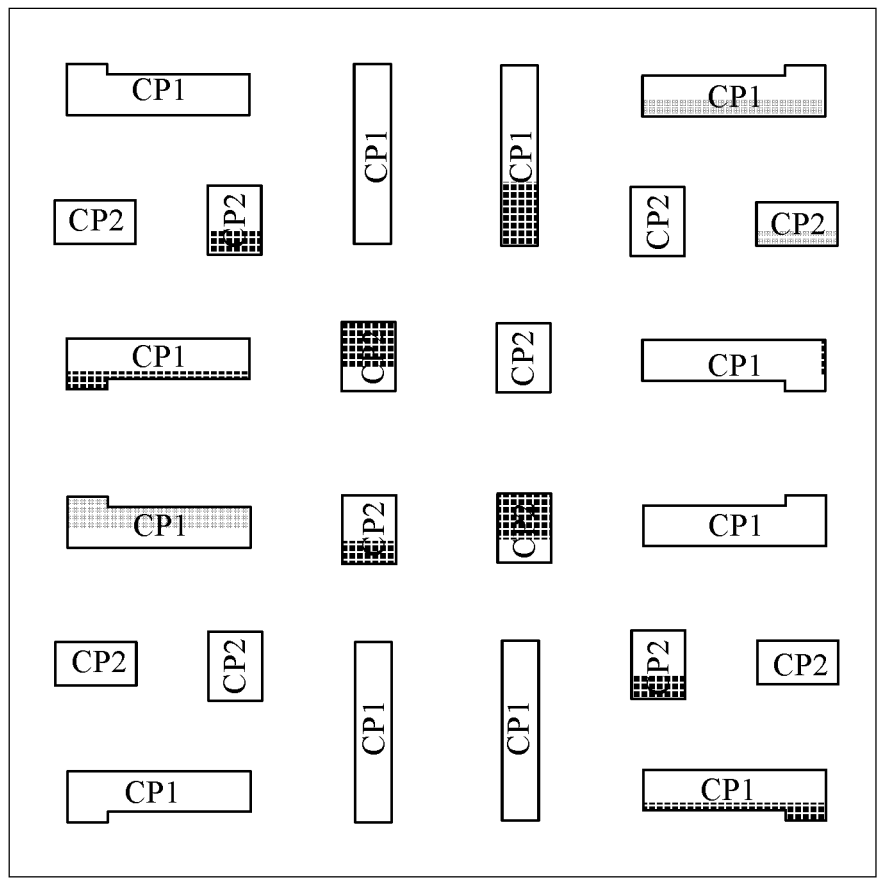
FIG. 4O is a diagram illustrating the structure of a first connecting layer in the array substrate depicted in FIG. 4A.
Figure 4P:
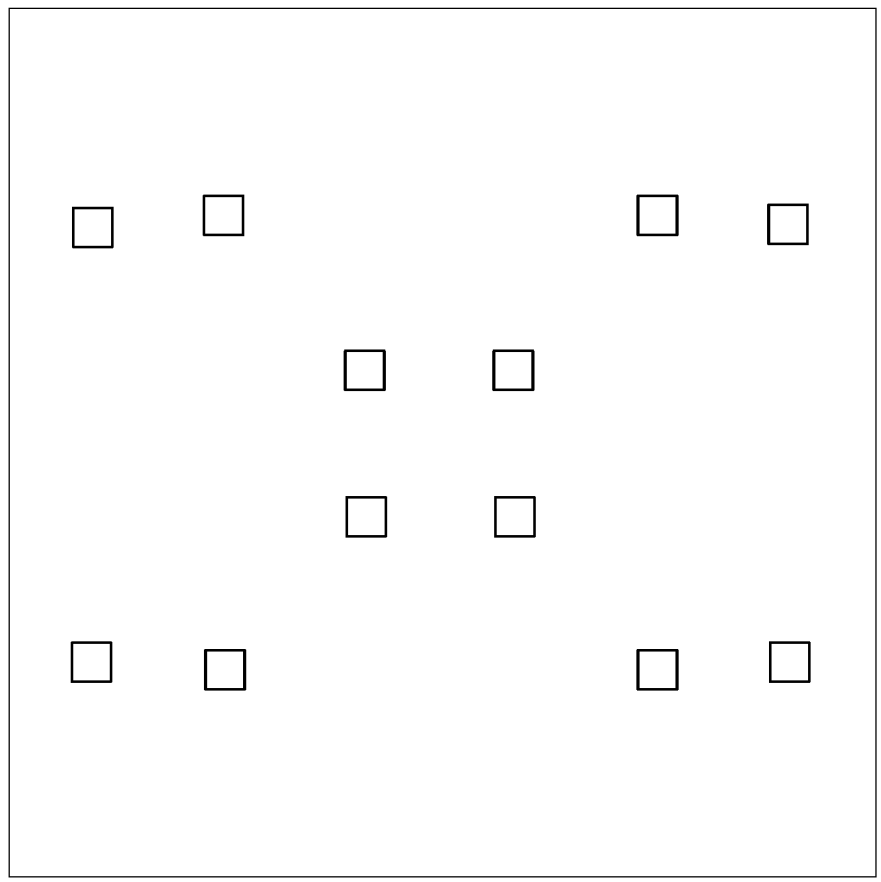
FIG. 4P is a diagram illustrating vias extending through a first planarization layer in the array substrate depicted in FIG. 4A.
Figure 4Q:
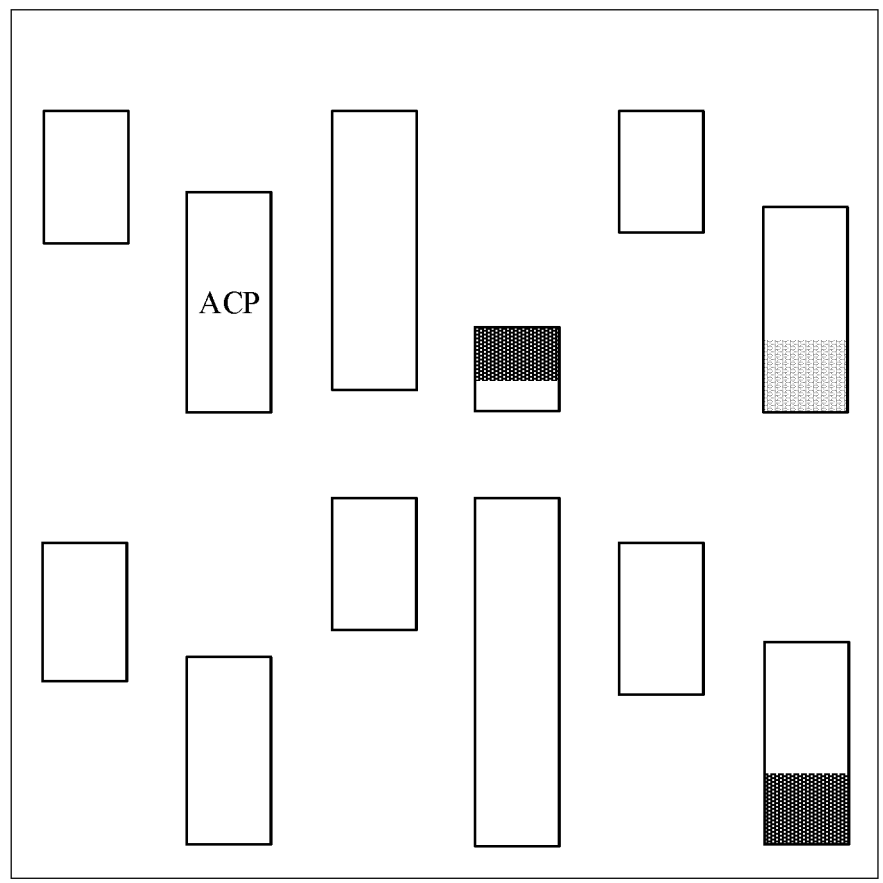
FIG. 4Q is a diagram illustrating the structure of a second connecting layer in the array substrate depicted in FIG. 4A.
Figure 4R:
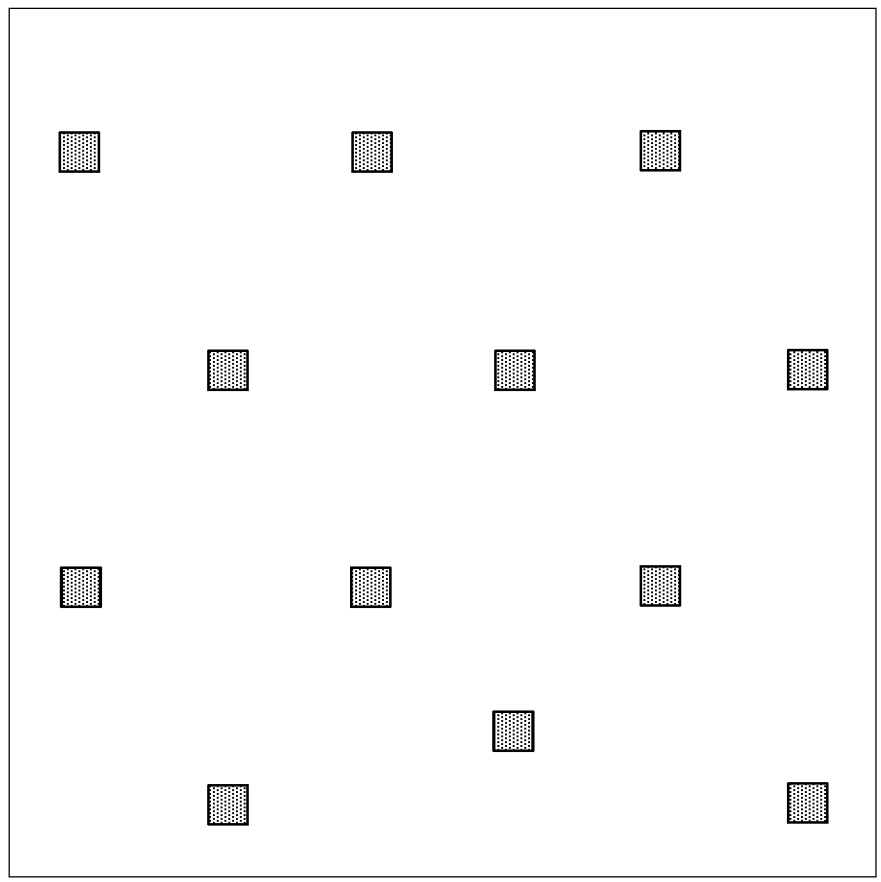
FIG. 4R is a diagram illustrating vias extending through a second planarization layer in the array substrate depicted in FIG. 4A.
Figure 4S:
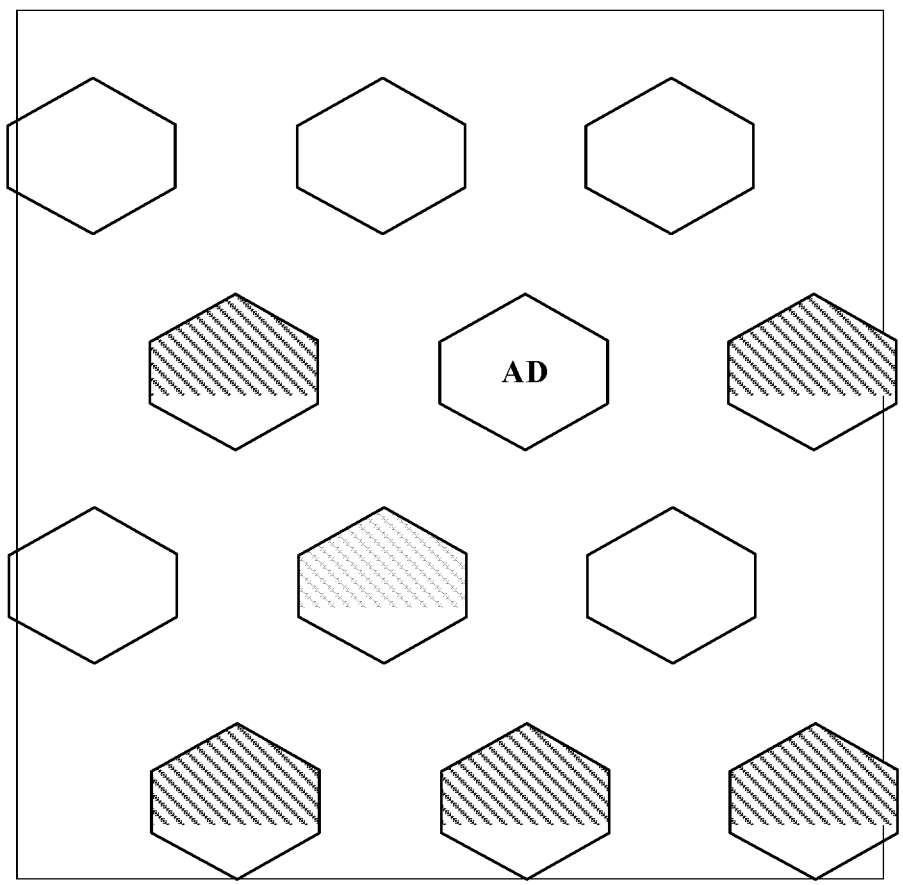
FIG. 4S is a diagram illustrating the structure of an anode layer in the array substrate depicted in FIG. 4A.
Figure 5:
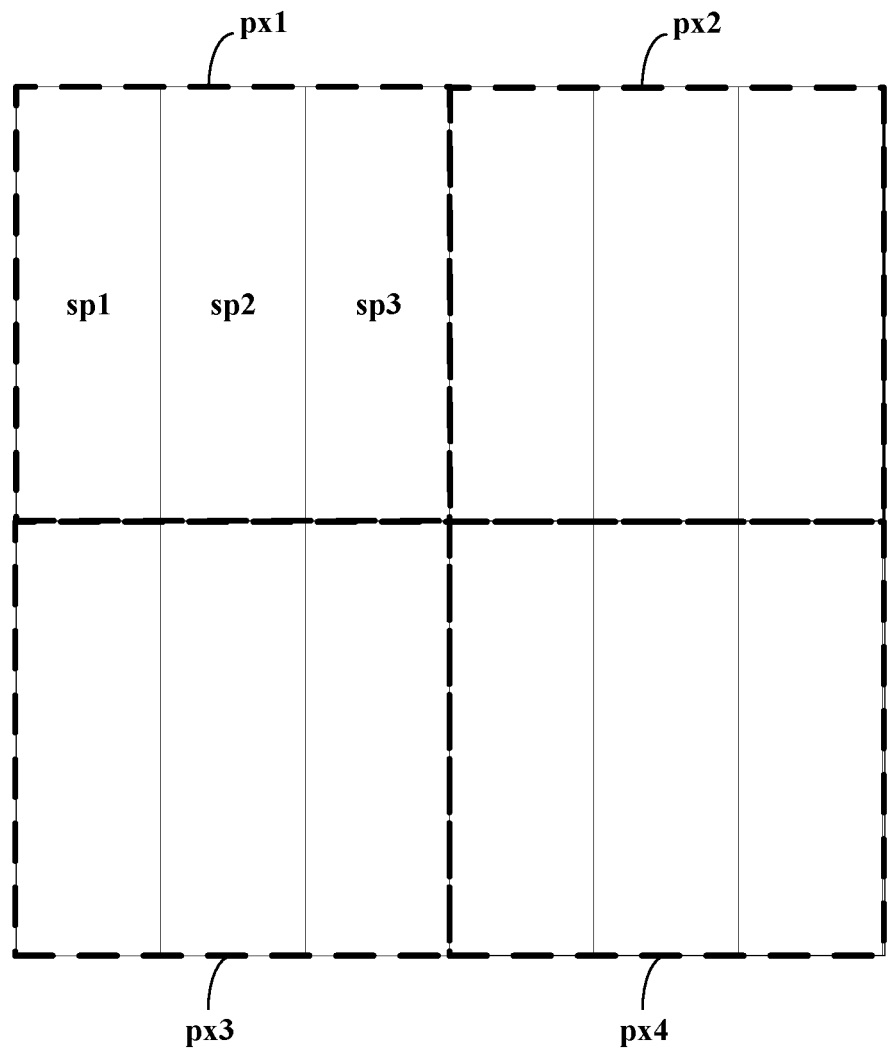
FIG. 5 is a schematic diagram illustrating an arrangement of pixel driving circuits and dummy circuits in an array substrate depicted in FIG. 4A.
Figure 6:
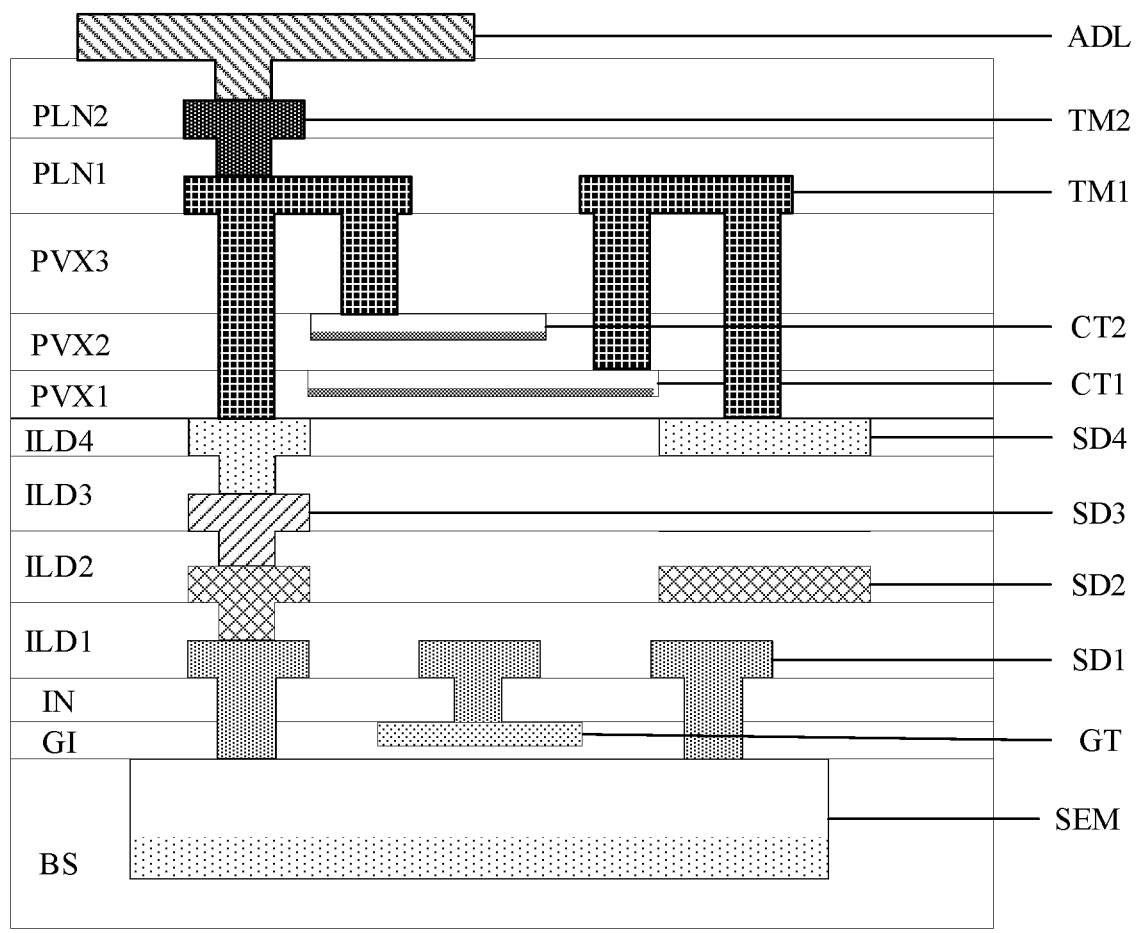
FIG. 6 is a cross-sectional view of an array substrate in some embodiments according to the present disclosure.

FIG. 4A is a diagram illustrating the structure of pixel driving circuits in an array substrate in some embodiments according to the present disclosure. FIG. 4B is a diagram illustrating the structure of a semiconductor material layer in the array substrate depicted in FIG. 4A. FIG. 4C is a diagram illustrating the structure of a gate metal layer in the array substrate depicted in FIG. 4A. FIG. 4D is a diagram illustrating vias extending through a gate insulating layer in the array substrate depicted in FIG. 4A. FIG. 4E is a diagram illustrating vias extending through an insulating layer in the array substrate depicted in FIG. 4A. FIG. 4F is a diagram illustrating the structure of a first signal line layer in the array substrate depicted in FIG. 4A. FIG. 4G is a diagram illustrating vias extending through a first inter-layer dielectric layer in the array substrate depicted in FIG. 4A. FIG. 4H is a diagram illustrating the structure of a second signal line layer in the array substrate depicted in FIG. 4A. FIG. 4I is a diagram illustrating the structure of a third signal line layer in the array substrate depicted in FIG. 4A. FIG. 4J is a diagram illustrating vias extending through a third inter-layer dielectric layer in the array substrate depicted in FIG. 4A. FIG. 4K is a diagram illustrating the structure of a fourth signal line layer in the array substrate depicted in FIG. 4A. FIG. 4L is a diagram illustrating the structure of a first conductive layer in the array substrate depicted in FIG. 4A. FIG. 4M is a diagram illustrating the structure of a second conductive layer in the array substrate depicted in FIG. 4A. FIG. 4N is a diagram illustrating vias extending through a third passivation layer in the array substrate depicted in FIG. 4A. FIG. 4O is a diagram illustrating the structure of a first connecting layer in the array substrate depicted in FIG. 4A. FIG. 4P is a diagram illustrating vias extending through a first planarization layer in the array substrate depicted in FIG. 4A. FIG. 4Q is a diagram illustrating the structure of a second connecting layer in the array substrate depicted in FIG. 4A. FIG. 4R is a diagram illustrating vias extending through a second planarization layer in the array substrate depicted in FIG. 4A. FIG. 4S is a diagram illustrating the structure of an anode layer in the array substrate depicted in FIG. 4A. FIG. 5 is a schematic diagram illustrating an arrangement of pixel driving circuits and dummy circuits in an array substrate depicted in FIG. 4A. FIG. 6 is a cross-sectional view of an array substrate in some embodiments according to the present disclosure.

FIG. 4A to FIG. 4S, FIG. 5, and FIG. 6 depict a portion of the array substrate having a plurality of subpixels. In some embodiments, FIG. 4A to FIG. 4S, FIG. 5, and FIG. 6 depict a repeating unit (e.g., a minimum repeating unit) of the plurality of subpixels of the array substrate. In one example as depicted in FIG. 5, the repeating unit (e.g., the minimum repeating unit) of the plurality of subpixels of the array substrate includes four pixels px1, px2, px3, and px4. In some embodiments, a respective pixel in the repeating unit includes a plurality of subpixels. In one example, the respective pixel includes at least three subpixels, for example, a first subpixel sp1 (e.g., a red subpixel), a second subpixel sp2 (e.g., a green subpixel), and a third subpixel sp3 (e.g., a blue subpixel).

In some embodiments, corresponding layers of pixel driving circuits in adjacent pixels (for example, px1 and px2 adjacent to each other, or px3 and px4 adjacent to each other, or px1/px3 and px2/px4 adjacent to each other) in the repeating unit have a substantially mirror symmetry with respect to each other, e.g., about a plane perpendicular to a main surface of the array substrate and substantially parallel to the plurality of data lines DL. Optionally, corresponding layers of pixel driving circuits in adjacent pixels in a same row in the repeating unit (for example, px1 and px2 adjacent to each other in a first row, or px3 and px4 adjacent to each other in a second row) have a substantially mirror symmetry with respect to each other, e.g., about a plane perpendicular to a main surface of the array substrate and substantially parallel to the plurality of data lines DL. Optionally, corresponding layers of pixel driving circuits in the array substrate have a substantially mirror symmetry with respect to each other, e.g., about a plane perpendicular to a main surface of the array substrate and substantially parallel to the plurality of data lines DL.

As used herein, the term "corresponding layers of pixel driving circuits" is not intended to include layers that are not parts of the pixel driving circuits. For example, the "corresponding layers of pixel driving circuits" do not include an anode layer or a pixel definition layer. In some embodiments, the "corresponding layers of pixel driving circuits" do not include a light shielding layer or a first signal line layer or a second signal line layer or a third signal line layer or a second connecting layer. In one example, the "corresponding layers of pixel driving circuits" refer to at least one conductive layer of the pixel driving circuits. In one specific example, "corresponding layers" includes at least one of a semiconductor material layer, a gate metal layer, a first conductive layer, a second conductive layer, or a first connecting layer.

Referring to FIG. 4A to FIG. 4S, FIG. 5, and FIG. 6, the array substrate in some embodiments includes a base substrate BS, a semiconductor material layer SEM on the base substrate BS, a gate insulating layer GI on a side of the semiconductor material layer SEM away from the base substrate BS, a gate metal layer GT on a side of the gate insulating layer GI away from the base substrate BS, an insulating layer IN on a side of the gate metal layer GT away from the base substrate BS, a first signal line layer SD1 on a side of the insulating layer IN away from the base substrate BS, a first inter-layer dielectric layer ILD1 on a side of the first signal line layer SD1 away from the base substrate BS, a second signal line layer SD2 on a side of the first inter-layer dielectric layer ILD1 away from the base substrate BS, a second inter-layer dielectric layer ILD2 on a side of the second signal line layer SD2 away from the base substrate BS, a third signal line layer SD3 on a side of the second inter-layer dielectric layer ILD2 away from the base substrate BS, a third inter-layer dielectric layer ILD3 on a side of the third signal line layer SD3 away from the base substrate BS, a fourth signal line layer SD4 on a side of the third inter-layer dielectric layer ILD3 away from the base substrate BS, a first passivation layer PVX1 on a side of the fourth signal line layer SD4 away from the base substrate BS, a first conductive layer CT1 on a side of the first passivation layer PVX1 away from the base substrate BS, a second passivation layer PVX2 on a side of the first conductive layer CT1 away from the base substrate BS, a second conductive layer CT2 on a side of the second passivation layer PVX2 away from the base substrate BS, a third passivation layer PVX3 on a side of the second conductive layer CT2 away from the base substrate BS, a first connecting layer TM1 on a side of the third passivation layer PVX3 away from the base substrate BS, a first planarization layer PLN1 on a side of the first connecting layer TM1 away from the base substrate BS, a second connecting layer TM2 on a side of the first planarization layer PLN1 away from the base substrate BS, a second planarization layer PLN2 on a side of the second connecting layer TM2 away from the base substrate BS, and an anode layer ADL on a side of the second planarization layer PLN2 away from the base substrate BS.

Referring to FIG. 3, FIG. 4A, FIG. 4B, FIG. 5, and FIG. 6, the semiconductor material layer SML in some embodiments includes at least active layers of multiple transistors of the pixel driving circuit, including the first transistor T1, the third transistor T2, and the driving transistor T3. Optionally, the semiconductor material layer SML further includes at least respective portions of first electrodes of multiple transistors of the pixel driving circuit, including the first transistor T1, the third transistor T2, and the driving transistor T3. Optionally, the semiconductor material layer SML further includes at least respective portions of second electrodes of multiple transistors of the pixel driving circuit, including the first transistor T1, the third transistor T2, and the driving transistor T3. Optionally, the semiconductor material layer SML includes active layers, first electrodes, and second electrodes of multiple transistors of the pixel driving circuit, including the first transistor T1, the third transistor T2, and the driving transistor T3. Various appropriate semiconductor materials may be used for making the semiconductor material layer SML. Examples of the semiconductor materials for making the semiconductor material layer SML include silicon-based semiconductor materials such as polycrystalline silicon, single-crystal silicon, and amorphous silicon; and metal oxide-based semiconductor materials such as indium gallium zinc oxide and metal oxynitride-based semiconductor materials such as zinc oxynitride. Optionally, the active layer of the second transistor T2 includes a metal oxide-based semiconductor material. Optionally, active layers of the first transistor T1 and the driving transistor T3 include a silicon-based semiconductor material.

In some embodiments, the semiconductor material layer SML further includes a first interference prevention block IPB1 and a second interference prevention block IPB2. The first interference prevention block IPB1 is configured to shield at least portions of active layers of the first transistor T1 and the driving transistor T3 from electromagnetic interference. The second interference prevention block IPB2 configured to shield at least portions of an active layer of the second transistor T2 from electromagnetic interference. Optionally, the first interference prevention block IPB1 is configured to be provided with a low voltage signal (e.g., a ground voltage signal). Optionally, the second interference prevention block IPB2 is configured to be provided with a first reference voltage signal (e.g., a high voltage signal).

FIG. 4B is annotated with labels indicating components of several transistors (T1, T2, and T3). For example, the first transistor T1 includes an active layer ACT1, a first electrode S1, and a second electrode D1. The second transistor T2 includes an active layer ACT2, a first electrode S2, and a second electrode D2. The driving transistor T3 includes an active layer ACT3, a first electrode S3, and a second electrode D3.

Optionally, the active layers (ACT1, ACT2, and ACT3), the first electrodes (S1, S2, and S3), and the second electrodes (D1, D2, and D3) of the respective transistors (T1, T2, and T3) are in a same layer.

Referring to FIG. 3, FIG. 4A, FIG. 4C, FIG. 5, and FIG. 6, the gate metal layer GT in some embodiments includes a gate electrode G1 of the first transistor T1, a gate electrode G2 of the second transistor T2, and a gate electrode G3 of the driving transistor T3. Various appropriate electrode materials and various appropriate fabricating methods may be used to make the gate metal layer GT. For example, a conductive material may be deposited on the substrate by a plasma-enhanced chemical vapor deposition (PECVD) process and patterned. Examples of appropriate conductive materials for making the first gate metal layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the gate electrode G1 of the first transistor T1, the gate electrode G2 of the second transistor T2, and the gate electrode G3 of the driving transistor T3 are in a same layer.

As used herein, the term "same layer" refers to the relationship between the layers simultaneously formed in the same step. In one example, the gate electrode G1 of the first transistor T1 and the gate electrode G2 of the second transistor T2 are in a same layer when they are formed as a result of one or more steps of a same patterning process performed in a same layer of material. In another example, the gate electrode G1 of the first transistor T1 and the gate electrode G2 of the second transistor T2 can be formed in a same layer by simultaneously performing the step of forming the gate electrode G1 of the first transistor T1, and the step of forming the gate electrode G2 of the second transistor T2. The term "same layer" does not always mean that the thickness of the layer or the height of the layer in a cross-sectional view is the same.

Vias extending through the gate insulating layer are depicted in FIG. 4D.

Vias extending through the insulating layer are depicted in FIG. 4E.

Referring to FIG. 3, FIG. 4A, FIG. 4F, FIG. 5, and FIG. 6, the first signal line layer SD1 in some embodiments includes a plurality of first gate lines GL1, a plurality of second gate lines GL2, a plurality of first voltage supply lines Vdd, a third interference prevention block IPB3, a fourth interference prevention block IPB4, a plurality of first intermediate pads IP1, a plurality of second intermediate pads IP2, a plurality of drain electrode connecting lines DCL, and a plurality of source electrode connecting lines SCL.

Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first gate lines GL1, the plurality of second gate lines GL2, the plurality of first voltage supply lines Vdd, the third interference prevention block IPB3, the fourth interference prevention block IPB4, the plurality of drain electrode connecting lines DCL, and the plurality of source electrode connecting lines SCL are in a same layer.

A respective drain electrode connecting line of the plurality of drain electrode connecting lines DCL connects second electrodes of the first transistor T1 and the second transistor T2 in a same subpixel together. A respective source electrode connecting line of the plurality of source electrode connecting lines SCL connects first electrodes of the first transistor T1 and the second transistor T2 in a same subpixel together.

In some embodiments, the third interference prevention block IPB3 is configured to shield at least portions of active layers of the first transistor T1 and the driving transistor T3 from electromagnetic interference. Optionally, the third interference prevention block IPB3 is electrically connected to the first interference prevention block IPB1. In some embodiments, the fourth interference prevention block IPB4 is configured to shield at least portions of an active layer of the second transistor T2 from electromagnetic interference. Optionally, the fourth interference prevention block IPB4 is electrically connected to the second interference prevention block IPB2. Optionally, the third interference prevention block IPB3 is configured to be provided with a low voltage signal (e.g., a ground voltage signal). Optionally, the fourth interference prevention block IPB4 is configured to be provided with a first reference voltage signal (e.g., a high voltage signal).

In some embodiments, an orthographic projection of the third interference prevention block IPB3 on a base substrate at least partially overlaps with an orthographic projection of active layers of multiple driving transistors in the repeating unit on the base substrate. Optionally, the orthographic projection of the third interference prevention block IPB3 on the base substrate at least partially overlaps with an orthographic projection of active layers of driving transistors in the first pixel and the second pixel in the repeating unit on the base substrate. Optionally, the orthographic projection of the third interference prevention block IPB3 on the base substrate is non-overlapping with an orthographic projection of active layers of driving transistors in the third pixel and the fourth pixel in the repeating unit on the base substrate.

In some embodiments, a respective first gate line of the plurality of first gate lines GL1 is connected to gate electrodes of first transistors in a same row in the repeating unit. The respective first gate line is configured to provide gate scanning signals to the first transistors in the same row in the repeating unit. In some embodiments, a respective second gate line of the plurality of second gate lines GL2 is connected to gate electrodes of second transistors in a same row in the repeating unit. The respective second gate line is configured to provide gate scanning signals to the second transistors in the same row in the repeating unit.

In some embodiments, a respective first voltage supply line of the plurality of first voltage supply lines Vdd is connected to first electrodes of driving transistors in a same row in the repeating unit. The respective first voltage supply line is configured to provide a first reference voltage signal to the first electrodes of driving transistors in the same row in the repeating unit.

A respective first intermediate pad of the plurality of first intermediate pads IP1 connects a gate electrode of the driving transistor T3 with a respective first node connecting line of a plurality of first node connecting lines. A respective second connecting pad of the plurality of second intermediate pads IP2 connects a second electrode of the driving transistor T3 with a respective second node connecting line of a plurality of second node connecting lines.

Vias extending through the first inter-layer dielectric layer are depicted in FIG. 4G.

Referring to FIG. 3, FIG. 4A, FIG. 4H, FIG. 5, and FIG. 6, the second signal line layer SD2 in some embodiments includes a plurality of first node connecting lines Cln1, a plurality of second node connecting lines Cln2, a plurality of data connecting pads DCP, a plurality of voltage supply connecting lines VCL, and a ground plate GND. Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first node connecting lines Cln1, the plurality of second node connecting lines Cln2, the plurality of data connecting pads DCP, the plurality of voltage supply connecting lines VCL, and the ground plate GND are in a same layer.

In some embodiments, a respective data connecting pad of the plurality of data connecting pads DCP connects a respective data line of a plurality of data line with a respective source electrode connecting line of the plurality of source electrode connecting lines. The respective source electrode connecting line of the plurality of source electrode connecting lines connects first electrodes of the first transistor T1 and the second transistor T2 in a same subpixel together.

In some embodiments, the array substrate includes a ground plate GND in each of the plurality of repeating unit. A respective repeating unit include one ground plate. Optionally, the ground plate GND in the repeating unit is spaced apart from each of the plurality of first node connecting lines Cln1, the plurality of second node connecting lines Cln2, the plurality of data connecting pads DCP, and the plurality of voltage supply connecting lines VCL, but otherwise extends substantially throughout a remaining area of the repeating unit in the second signal line layer. Optionally, the ground plate GND in the repeating unit is a unitary structure. Optionally, the ground plate GND in the repeating unit extends throughout at least 50% (at least 55%, at least 60%, at least 65%, at least 70%, at least 75%, at least 80%, at least 85%, or at least 90%) of the repeating unit. Optionally, the ground plate GND in the repeating unit extends throughout less than 100% (less than 95%, less than 90%, less than 85%, less than 80%, less than 75%, less than 70%, less than 65%, or less than 60%) of the repeating unit.

In some embodiments, the ground plate GND is configured to be provided with a low voltage signal (e.g., a ground voltage signal). Optionally, the ground plate GND is connected to the third interference prevention block IPB3 in the first signal line layer through one or more vias extending through at least the first inter-layer dielectric layer. Optionally, the third interference prevention block IPB3 is connected to the first interference prevention block IPB1 in the semiconductor material layer through one or more vias extending through at least one of the insulating layer and the gate insulating layer.

In some embodiments, a respective first node connecting line of a plurality of first node connecting lines Cln1 connects a gate electrode of the driving transistor T3 with a respective drain electrode connecting line of the plurality of drain electrode connecting lines. The respective drain electrode connecting line of the plurality of drain electrode connecting lines connects second electrodes of the first transistor T1 and the second transistor T2 in a same subpixel together. The respective first node connecting line of a plurality of first node connecting lines Cln1 is further connected to a first capacitor electrode of the storage capacitor (e.g., through CP1 in FIG. 4O then to Ce1 in FIG. 4L).

In some embodiments, a respective second node connecting line of a plurality of second node connecting lines Cln2 connects a second electrode of the driving transistor T3 with an anode of the light emitting element (e.g., through CP2 in FIG. 4O then to ACP in FIG. 4Q).

In some embodiments, referring to FIG. 4A, and FIG. 4F to FIG. 4H, the plurality of voltage supply connecting lines VCL and the plurality of first voltage supply lines Vdd form an interconnected voltage supply network. In some embodiments, the plurality of first voltage supply lines Vdd extend along a direction substantially parallel to the first direction DR1; and the plurality of voltage supply connecting lines VCL extend along a direction substantially parallel to the second direction DR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

In some embodiments, the plurality of first voltage supply lines Vdd are in a layer different from the plurality of voltage supply connecting lines VCL. In one example, the plurality of first voltage supply lines Vdd are in the first signal line layer. In another example, the plurality of voltage supply connecting lines VCL are in the second signal line layer. Optionally, a respective voltage supply connecting line of the plurality of voltage supply connecting lines VCL is connected to a respective first voltage supply line the plurality of first voltage supply lines Vdd through one or more vias extending through the first inter-layer dielectric layer.

In some embodiments, two adjacent voltage supply connecting lines of the plurality of voltage supply connecting lines VCL and two adjacent first voltage supply lines of the plurality of first voltage supply lines Vdd substantially surround the repeating unit.

Referring to FIG. 3, FIG. 4A, FIG. 4I, FIG. 5, and FIG. 6, the third signal line layer SD3 in some embodiments includes a plurality of first node connecting pads Cpn1, a plurality of second node connecting pads Cpn2, a plurality of data lines DL, and a plurality of ground lines GNL. Various appropriate conductive materials and various appropriate fabricating methods may be used to make the third signal line layer SD3. For example, a conductive material may be deposited on the substrate by a plasma-enhanced chemical vapor deposition (PECVD) process and patterned. Examples of appropriate conductive materials for making the third signal line layer SD3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first node connecting pads Cpn1, the plurality of second node connecting pads Cpn2, the plurality of data lines DL, and the plurality of ground lines GNL are in a same layer.

In some embodiments, a respective data line of the plurality of data lines DL is connected to a respective data connecting pad of the plurality of data connecting pad in the repeating unit, e.g., through one or more vias extending through the second inter-layer dielectric layer. The respective data connecting pad of the plurality of data connecting pads connects the respective data line of a plurality of data line DL with a respective source electrode connecting line of the plurality of source electrode connecting lines. The respective source electrode connecting line of the plurality of source electrode connecting lines connects first electrodes of the first transistor T1 and the second transistor T2 in a same subpixel together.

In some embodiments, the plurality of ground lines GNL are configured to be provided with a low voltage signal (e.g., a ground voltage signal). In some embodiments, the plurality of ground lines GNL are connected to the ground plate in the second signal line layer, e.g., through one or more vias extending through the second inter-layer dielectric layer. Optionally, the ground plate is connected to the third interference prevention block in the first signal line layer through one or more vias extending through at least the first inter-layer dielectric layer. Optionally, the third interference prevention block is connected to the first interference prevention block in the semiconductor material layer through one or more vias extending through at least one of the insulating layer and the gate insulating layer.

In some embodiments, a respective first node connecting pad of the plurality of first node connecting pads Cpn1 is connected to a respective first node connecting line of the plurality of first node connecting lines, e.g., through one or more vias extending through the second inter-layer dielectric layer. The respective first node connecting line of a plurality of first node connecting lines connects a gate electrode of the driving transistor T3 with a respective drain electrode connecting line of the plurality of drain electrode connecting lines. The respective drain electrode connecting line of the plurality of drain electrode connecting lines connects second electrodes of the first transistor T1 and the second transistor T2 in a same subpixel together. The respective first node connecting line of a plurality of first node connecting lines Cln1 is further connected to a first capacitor electrode of the storage capacitor (e.g., through CP1 in FIG. 4O then to Ce1 in FIG. 4L).

In some embodiments, a respective second node connecting pad of the plurality of second node connecting pads Cpn2 is connected to a respective second node connecting line of the plurality of second node connecting lines, e.g., through one or more vias extending through the second inter-layer dielectric layer. The respective second node connecting line of a plurality of second node connecting lines connects a second electrode of the driving transistor T3 with an anode of the light emitting element (e.g., through CP2 in FIG. 4O then to ACP in FIG. 4Q).

Vias extending through the third inter-layer dielectric layer are depicted in FIG. 4J.

Referring to FIG. 3, FIG. 4A, FIG. 4K, FIG. 5, and FIG. 6, the fourth signal line layer SD4 in some embodiments includes a plurality of first relay electrodes RE1 and a plurality of second relay electrodes RE2. Various appropriate conductive materials and various appropriate fabricating methods may be used to make the fourth signal line layer SD4. For example, a conductive material may be deposited on the substrate by a plasma-enhanced chemical vapor deposition (PECVD) process and patterned. Examples of appropriate conductive materials for making the fourth signal line layer SD4 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first relay electrodes RE1 and the plurality of second relay electrodes RE2 are in a same layer.

In some embodiments, a respective first relay electrode of the plurality of first relay electrodes RE1 is connected to a respective first node connecting pad of the plurality of first node connecting pads Cpn1, e.g., through one or more vias extending through the third inter-layer dielectric layer. The respective first node connecting pad of the plurality of first node connecting pads Cpn1 is connected to a respective first node connecting line of the plurality of first node connecting lines, e.g., through one or more vias extending through the second inter-layer dielectric layer. The respective first node connecting line of a plurality of first node connecting lines connects a gate electrode of the driving transistor T3 with a respective drain electrode connecting line of the plurality of drain electrode connecting lines. The respective drain electrode connecting line of the plurality of drain electrode connecting lines connects second electrodes of the first transistor T1 and the second transistor T2 in a same subpixel together. The respective first node connecting line of a plurality of first node connecting lines Cln1 is further connected to a first capacitor electrode of the storage capacitor (e.g., through CP1 in FIG. 4O then to Ce1 in FIG. 4L).

In some embodiments, a respective second relay electrode of the plurality of second relay electrodes RE2 is connected to a respective second node connecting pad of the plurality of second node connecting pads Cpn2, e.g., through one or more vias extending through the third inter-layer dielectric layer. The respective second node connecting pad of the plurality of second node connecting pads Cpn2 is connected to a respective second node connecting line of the plurality of second node connecting lines, e.g., through one or more vias extending through the second inter-layer dielectric layer. The respective second node connecting line of a plurality of second node connecting lines connects a second electrode of the driving transistor T3 with an anode of the light emitting element (e.g., through CP2 in FIG. 4O then to ACP in FIG. 4Q).

Referring to FIG. 3, FIG. 4A, FIG. 4L, FIG. 5, and FIG. 6, the first conductive layer CT1 in some embodiments includes a plurality of first capacitor electrodes CE1. Various appropriate conductive materials and various appropriate fabricating methods may be used to make the first conductive layer CT1. For example, a conductive material may be deposited on the substrate by a plasma-enhanced chemical vapor deposition (PECVD) process and patterned. Examples of appropriate conductive materials for making the first conductive layer CT1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, a respective first capacitor electrode of the plurality of first capacitor electrodes CE1 is connected to a respective first node connecting pad of the plurality of first node connecting pads Cpn1, e.g., through one or more vias extending through at least one of the first passivation layer PVX1, the fourth inter-layer dielectric layer ILD4, or the third inter-layer dielectric layer ILD3. The respective first node connecting pad of the plurality of first node connecting pads Cpn1 is connected to a respective first node connecting line of a plurality of first node connecting lines Cln1, e.g., through one or more vias extending through the second inter-layer dielectric layer ILD2. The respective first node connecting line of a plurality of first node connecting lines connects a gate electrode of the driving transistor T3 with a respective drain electrode connecting line of the plurality of drain electrode connecting lines. The respective drain electrode connecting line of the plurality of drain electrode connecting lines connects second electrodes of the first transistor T1 and the second transistor T2 in a same subpixel together.

Referring to FIG. 3, FIG. 4A, FIG. 4M, FIG. 5, and FIG. 6, the second conductive layer CT2 in some embodiments includes a second capacitor electrode Ce2 of the storage capacitor. Various appropriate conductive materials and various appropriate fabricating methods may be used to make the second conductive layer CT2. For example, a conductive material may be deposited on the substrate by a plasma-enhanced chemical vapor deposition (PECVD) process and patterned. Examples of appropriate conductive materials for making the second conductive layer CT2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the second capacitor electrode Ce2 is a unitary structure configured to function as a second capacitor electrode for multiple storage capacitors in multiple pixel driving circuits in the repeating unit. Optionally, the second capacitor electrode Ce2 is a unitary structure configured to function as a second capacitor electrode for all storage capacitors in all pixel driving circuits in the repeating unit.

In some embodiments, the second capacitor electrode Ce2 is configured to be provided with a low voltage signal (e.g., a ground voltage signal). In some embodiments, the second capacitor electrode Ce2 is connected to the plurality of ground lines, e.g., through one or more vias extending through at least one of the second passivation layer PVX2, the first passivation layer PVX1, the fourth inter-layer dielectric layer, or the third inter-layer dielectric layer. Optionally, the plurality of ground lines are connected to the ground plate in the second signal line layer, e.g., through one or more vias extending through the second inter-layer dielectric layer. Optionally, the ground plate is connected to the third interference prevention block in the first signal line layer through one or more vias extending through at least the first inter-layer dielectric layer. Optionally, the third interference prevention block is connected to the first interference prevention block in the semiconductor material layer through one or more vias extending through at least one of the insulating layer and the gate insulating layer.

In some embodiments, the second capacitor electrode Ce2 includes a plurality of electrode blocks connected together by a plurality of bridges. An orthographic projection of a respective electrode block of the plurality of electrode blocks on a base substrate at least partially overlaps with (e.g., covers) an orthographic projection of at least one first capacitor electrode of the plurality of first capacitor electrodes on the base substrate. A storage capacitor is formed by a respective first capacitor electrode of the plurality of first capacitor electrodes, a respective electrode block of the plurality of electrode blocks of the second capacitor electrode Ce2, and the second passivation layer PVX2 spacing apart the respective first capacitor electrode and the respective electrode block.

Vias extending through the third passivation layer are depicted in FIG. 4N.

Referring to FIG. 3, FIG. 4A, FIG. 4O, FIG. 5, and FIG. 6, the first connecting layer TM1 in some embodiments includes a plurality of first connecting pads CP1 and a plurality of second connecting pads CP2. Various appropriate conductive materials and various appropriate fabricating methods may be used to make the first connecting layer TM1. For example, a conductive material may be deposited on the substrate by a plasma-enhanced chemical vapor deposition (PECVD) process and patterned. Examples of appropriate conductive materials for making the first connecting layer TM1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first connecting pads CP1 and the plurality of second connecting pads CP2 are in a same layer.

In some embodiments, a respective first connecting pad of the plurality of first connecting pads CP1 is connected to a respective first capacitor electrode of the plurality of first capacitor electrodes, e.g., through one or more vias extending through at least one of the second passivation layer PVX2 or the third passivation layer PVX3. The respective first connecting pad of the plurality of first connecting pads CP1 is connected to a respective first node connecting line of the plurality of first node connecting lines, e.g., through one or more vias extending through at least one of the second passivation layer PVX2, the third passivation layer PVX3, the second inter-layer dielectric layer ILD2, the third inter-layer dielectric layer ILD3, or the fourth inter-layer dielectric layer ILD4.

In some embodiments, a respective second connecting pad of the plurality of second connecting pads CP2 is connected to a respective anode connecting pad of a plurality of anode connecting pads, e.g., through one or more vias extending through the first planarization layer PLN1. The respective anode connecting pad of a plurality of anode connecting pads is connected to an anode of a respective subpixel. The respective second connecting pad of the plurality of second connecting pads CP2 is connected to a respective second node connecting line of the plurality of second node connecting lines, e.g., through one or more vias extending through at least one of the second passivation layer PVX2, the third passivation layer PVX3, the second inter-layer dielectric layer ILD2, the third inter-layer dielectric layer ILD3, or the fourth inter-layer dielectric layer ILD4.

Vias extending through the first planarization layer are depicted in FIG. 4P.

Referring to FIG. 3, FIG. 4A, FIG. 4Q, FIG. 5, and FIG. 6, the second connecting layer TM2 in some embodiments includes a plurality of anode connecting pads ACP. Various appropriate conductive materials and various appropriate fabricating methods may be used to make the second connecting layer TM2. For example, a conductive material may be deposited on the substrate by a plasma-enhanced chemical vapor deposition (PECVD) process and patterned. Examples of appropriate conductive materials for making the second connecting layer TM2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, a respective anode connecting pad of a plurality of anode connecting pads ACP is connected to a respective second connecting pad of the plurality of second connecting pads e.g., through one or more vias extending through the first planarization layer PLN1. The respective second connecting pad of the plurality of second connecting pads is connected to a respective second node connecting line of the plurality of second node connecting lines, e.g., through one or more vias extending through at least one of the second passivation layer PVX2, the third passivation layer PVX3, the second inter-layer dielectric layer ILD2, the third inter-layer dielectric layer ILD3, or the fourth inter-layer dielectric layer ILD4.

Vias extending through the second planarization layer are depicted in FIG. 4R.

Referring to FIG. 3, FIG. 4A, FIG. 4S, FIG. 5, and FIG. 6, the anode layer ADL in some embodiments includes a plurality of anodes AD. A respective anode of the plurality of anodes AD is connected to a respective anode connecting pad of the plurality of anode connecting pads ACP, e.g., through one or more vias extending through the second planarization layer PLN2.

Figure 7A:
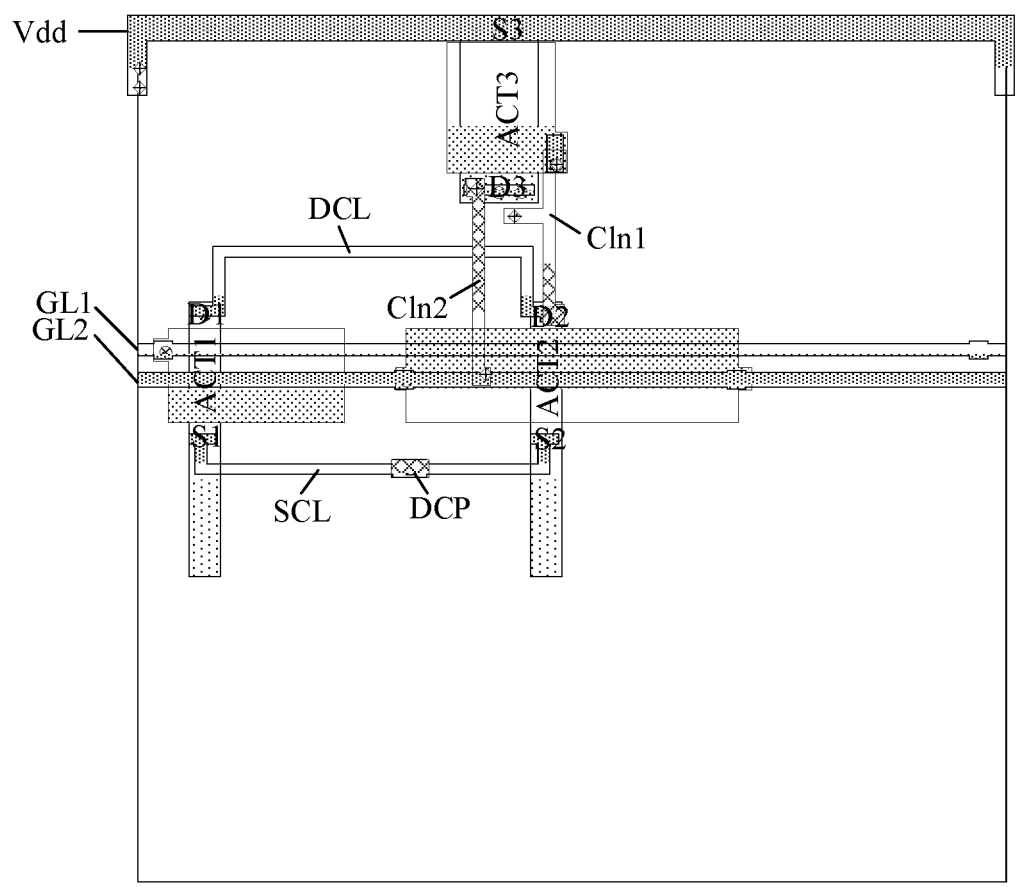
FIG. 7A illustrates a circuit connection layout of a first pixel driving circuit in a first subpixel in a first pixel in a repeating unit in an array substrate in some embodiments according to the present disclosure.
Figure 7B:
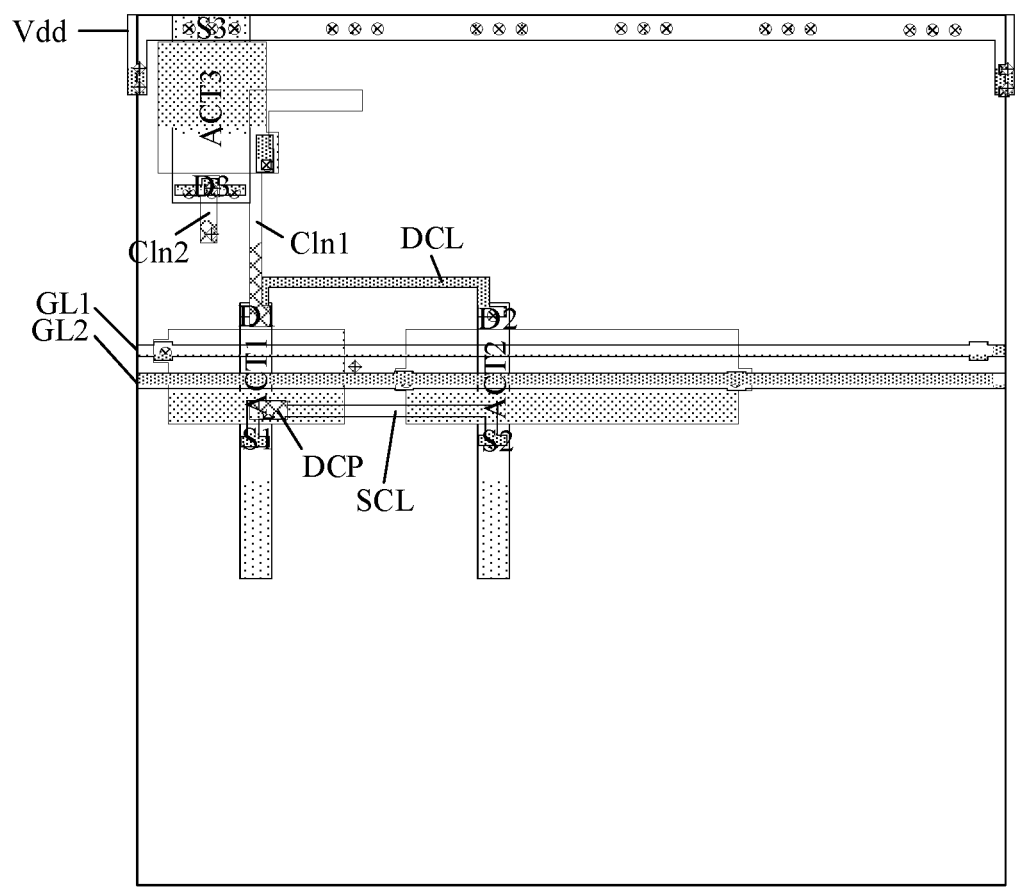
FIG. 7B illustrates a circuit connection layout of a second pixel driving circuit in a second subpixel in a first pixel in a repeating unit in an array substrate in some embodiments according to the present disclosure.
Figure 7C:
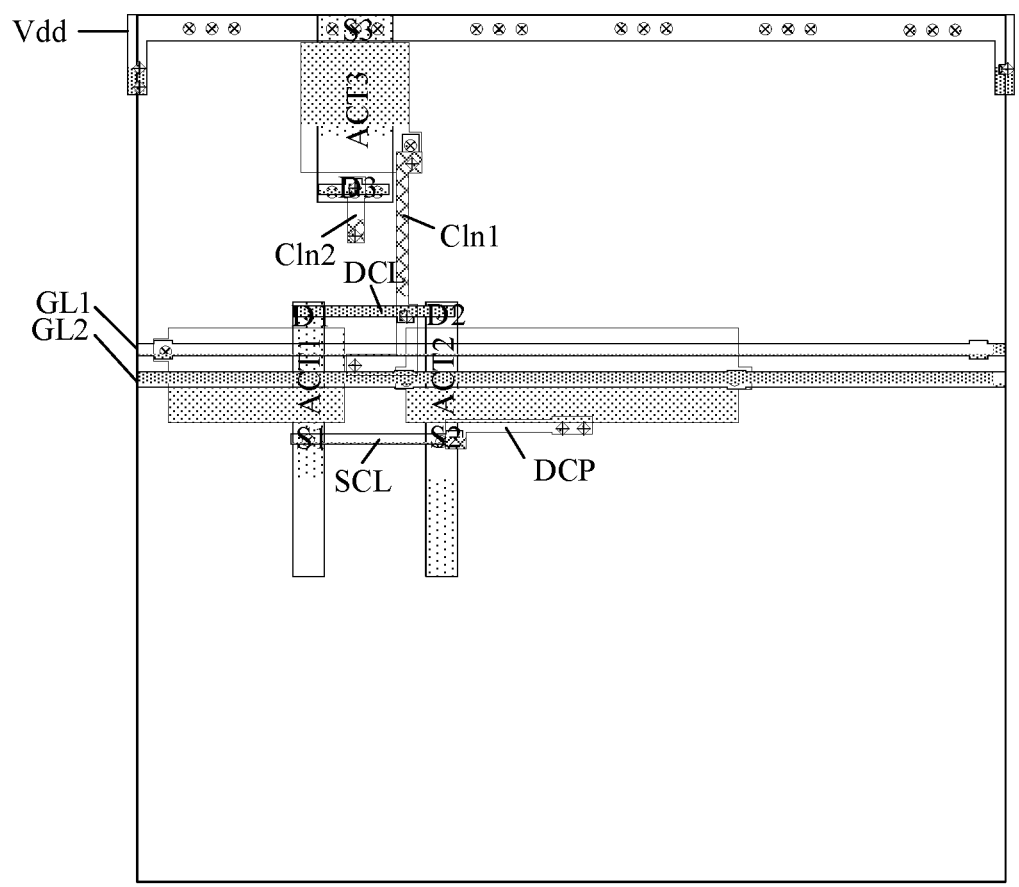
FIG. 7C illustrates a circuit connection layout of a third pixel driving circuit in a third subpixel in a first pixel in a repeating unit in an array substrate in some embodiments according to the present disclosure.
Figure 7D:
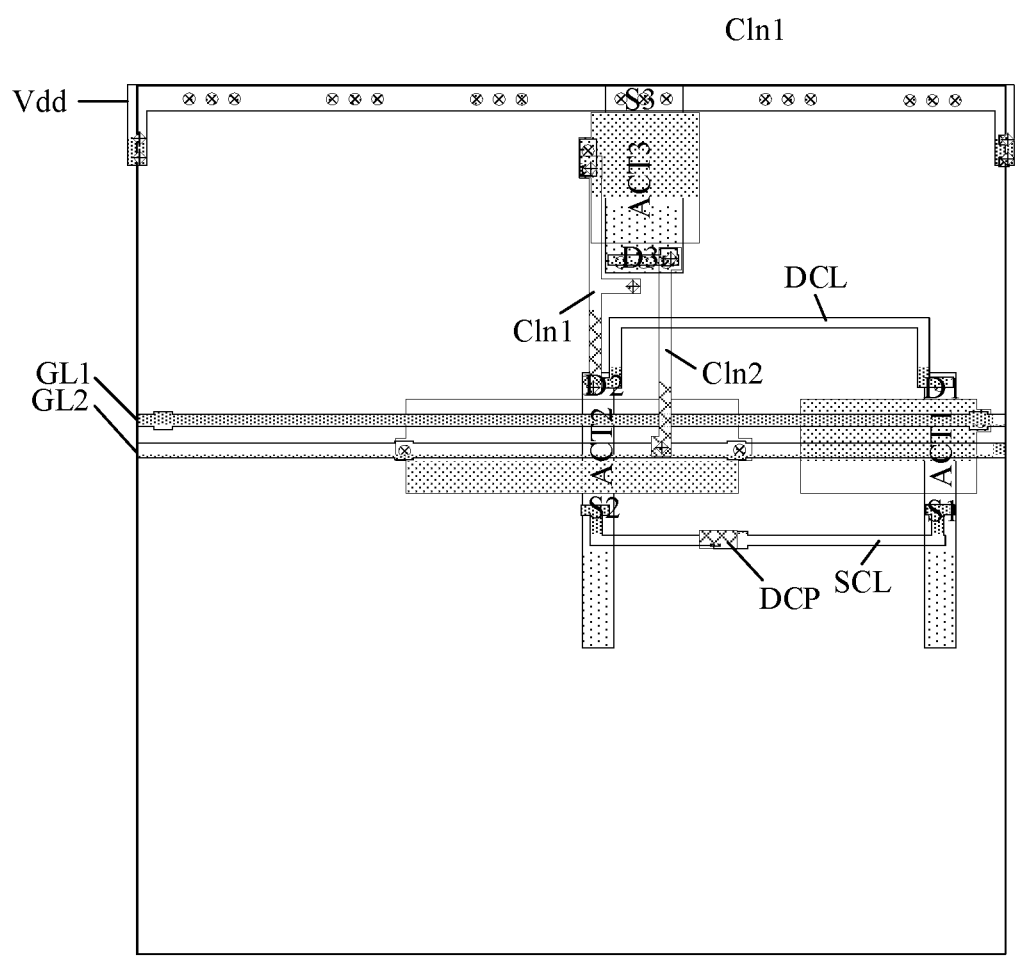
FIG. 7D illustrates a circuit connection layout of a first pixel driving circuit in a first subpixel in a second pixel in a repeating unit in an array substrate in some embodiments according to the present disclosure.
Figure 7E:
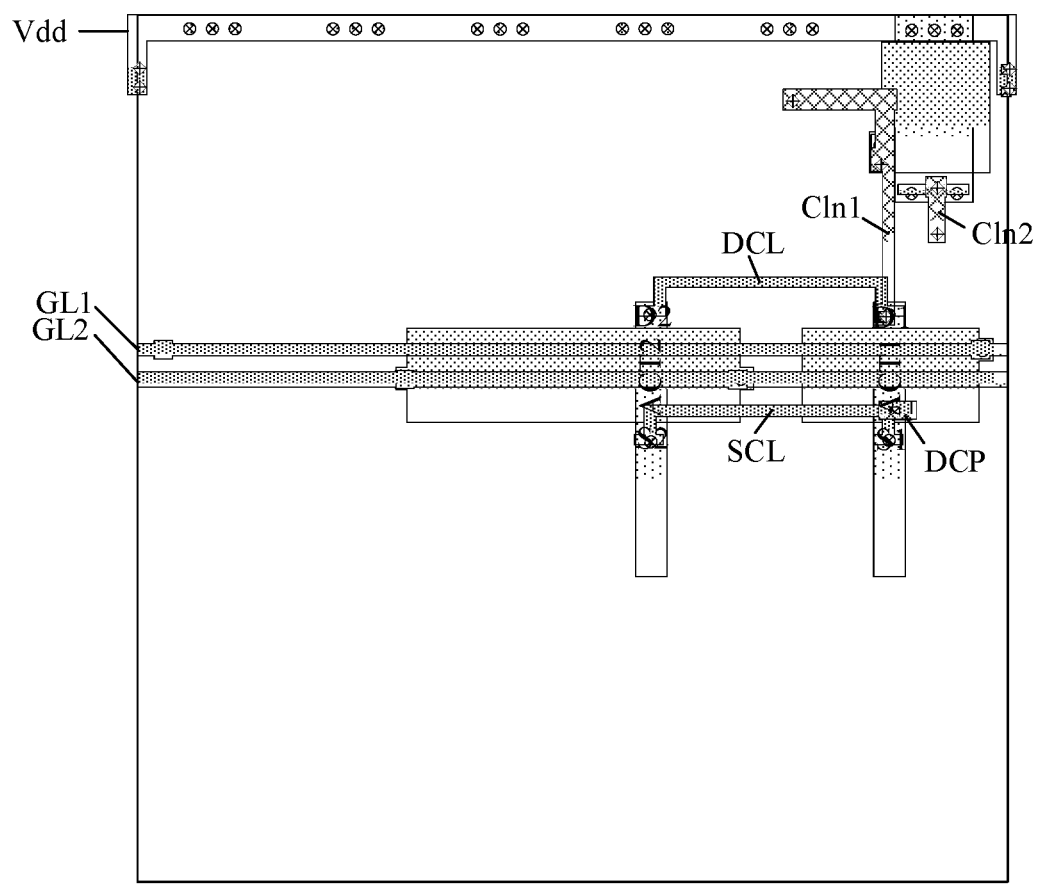
FIG. 7E illustrates a circuit connection layout of a second pixel driving circuit in a second subpixel in a second pixel in a repeating unit in an array substrate in some embodiments according to the present disclosure.
Figure 7F:
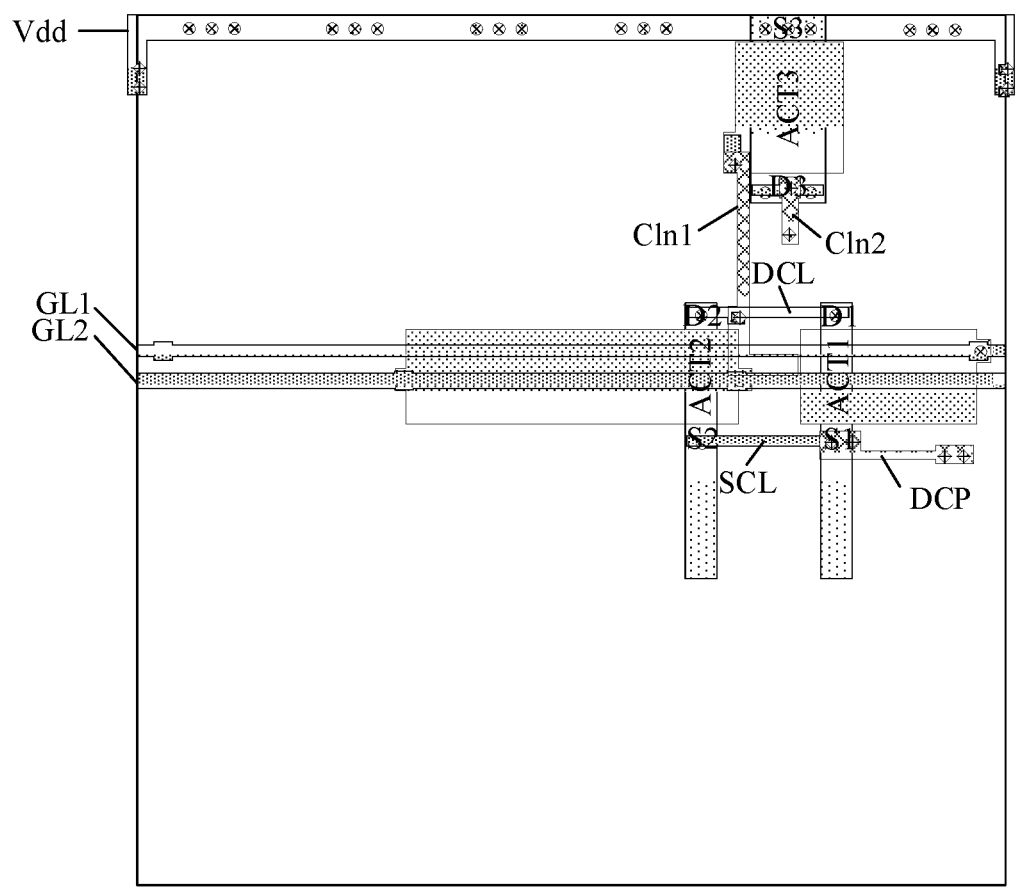
FIG. 7F illustrates a circuit connection layout of a third pixel driving circuit in a third subpixel in a second pixel in a repeating unit in an array substrate in some embodiments according to the present disclosure.
Figure 7G:
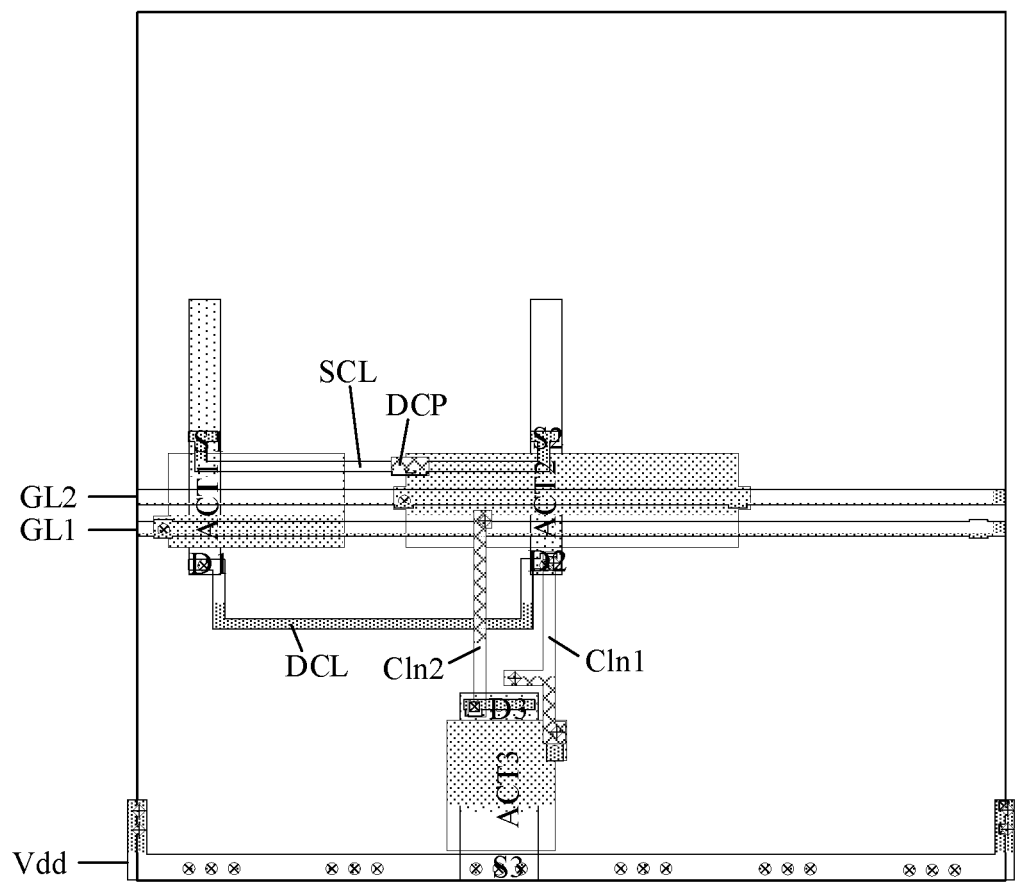
FIG. 7G illustrates a circuit connection layout of a first pixel driving circuit in a first subpixel in a third pixel in a repeating unit in an array substrate in some embodiments according to the present disclosure.
Figure 7H:
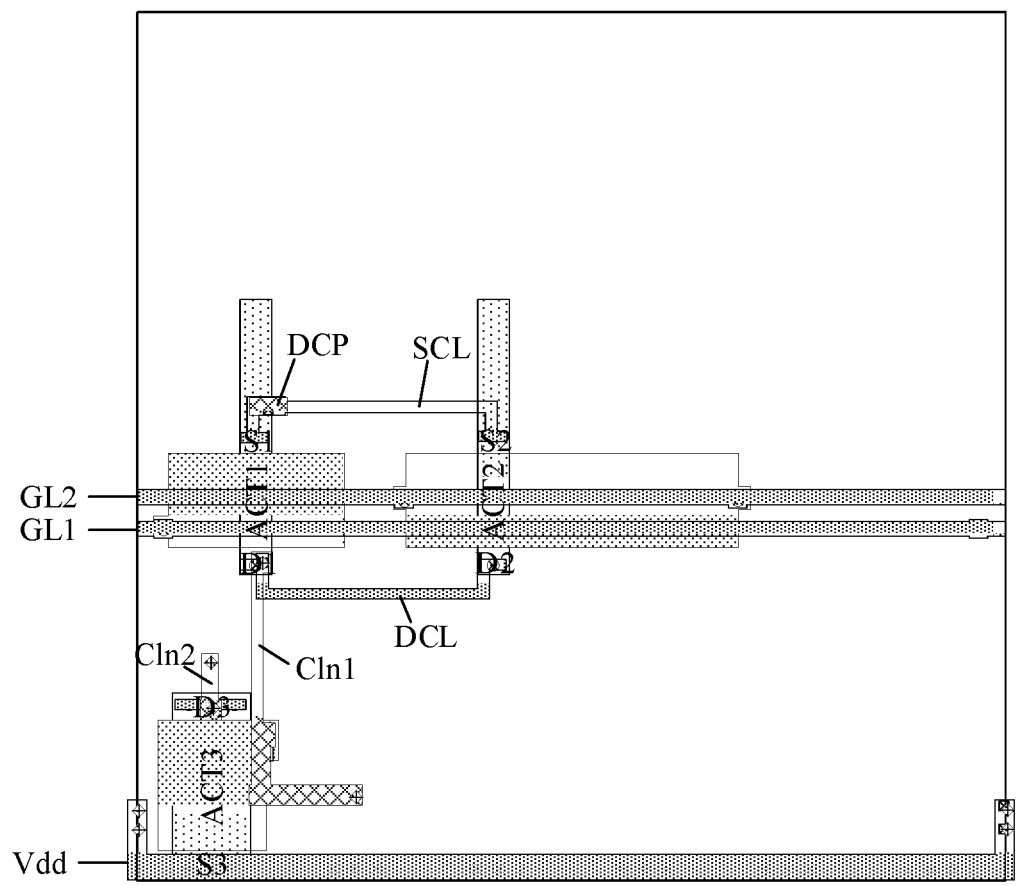
FIG. 7H illustrates a circuit connection layout of a second pixel driving circuit in a second subpixel in a third pixel in a repeating unit in an array substrate in some embodiments according to the present disclosure.
Figure 7I:
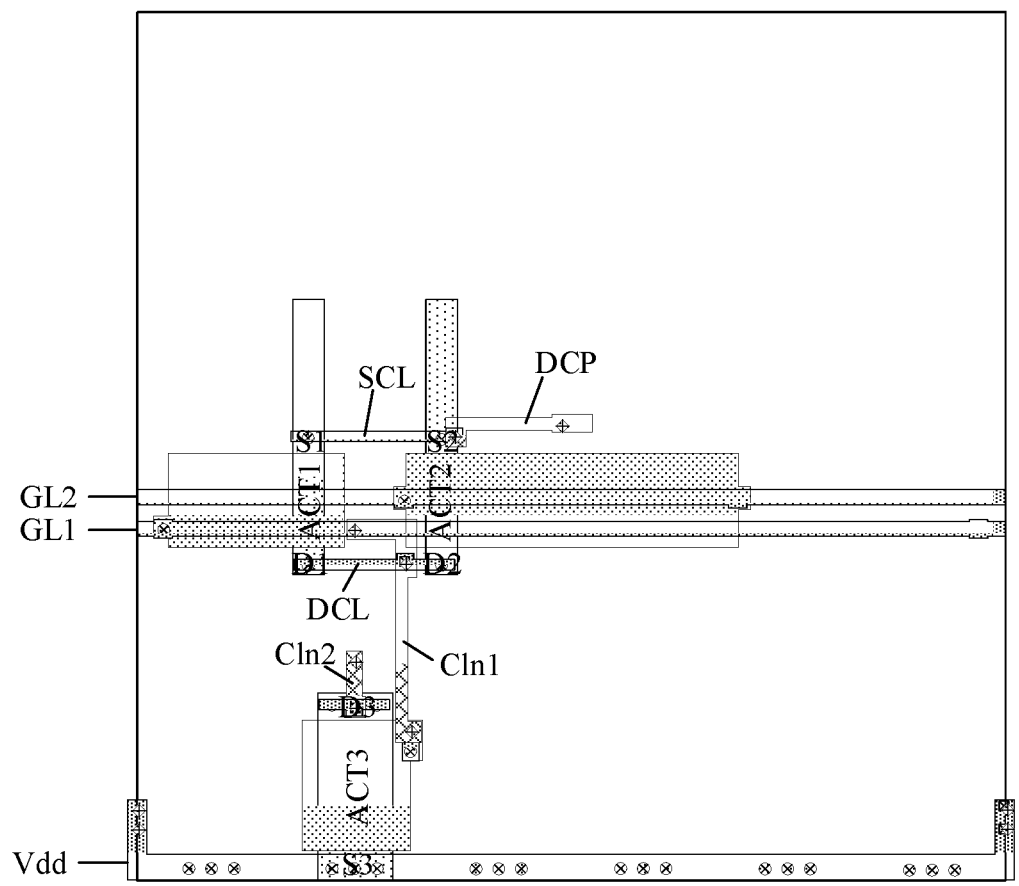
FIG. 7I illustrates a circuit connection layout of a third pixel driving circuit in a third subpixel in a third pixel in a repeating unit in an array substrate in some embodiments according to the present disclosure.
Figure 7J:
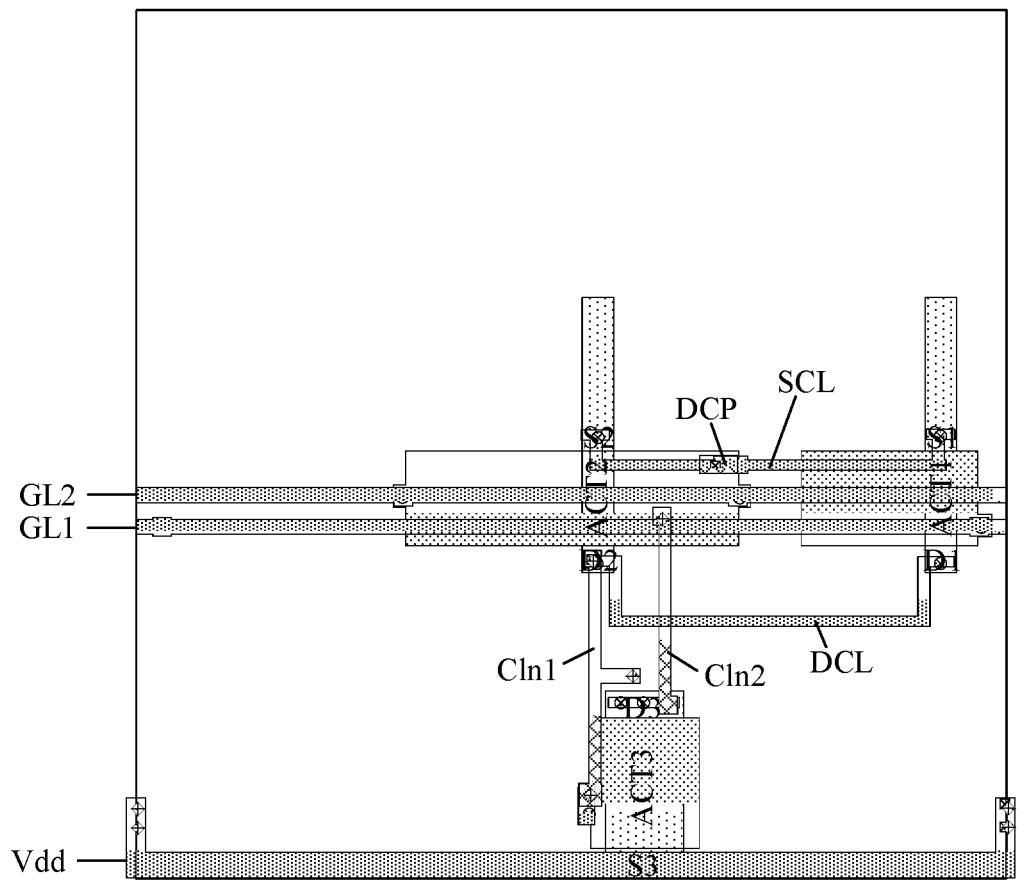
FIG. 7J illustrates a circuit connection layout of a first pixel driving circuit in a first subpixel in a fourth pixel in a repeating unit in an array substrate in some embodiments according to the present disclosure.
Figure 7K:
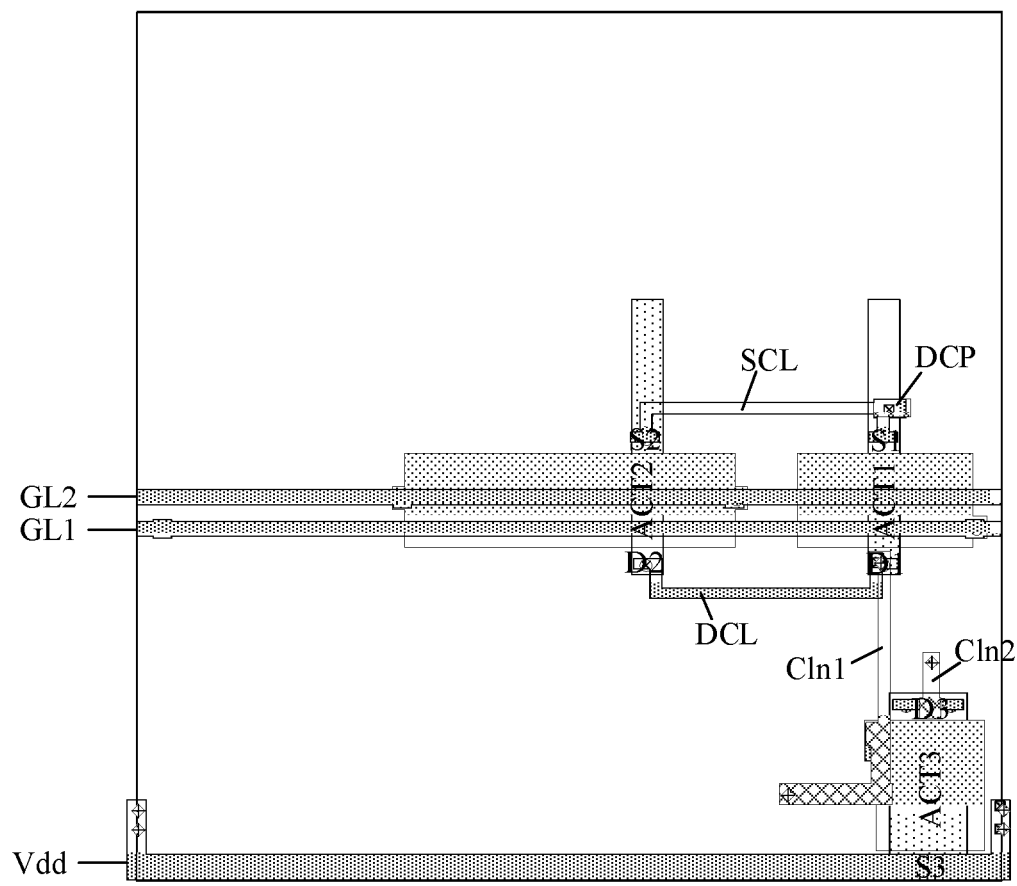
FIG. 7K illustrates a circuit connection layout of a second pixel driving circuit in a second subpixel in a fourth pixel in a repeating unit in an array substrate in some embodiments according to the present disclosure.
Figure 7L:
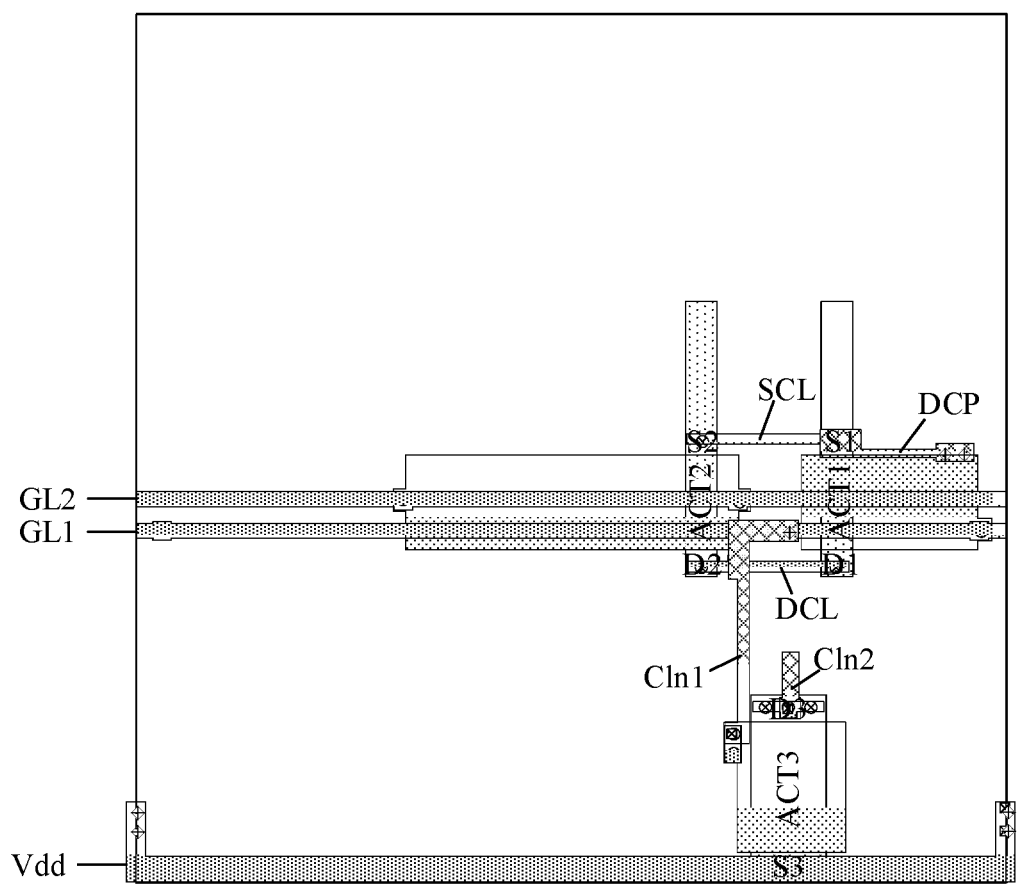
FIG. 7L illustrates a circuit connection layout of a third pixel driving circuit in a third subpixel in a fourth pixel in a repeating unit in an array substrate in some embodiments according to the present disclosure.

FIG. 7A illustrates a circuit connection layout of a first pixel driving circuit in a first subpixel in a first pixel in a repeating unit in an array substrate in some embodiments according to the present disclosure. FIG. 7B illustrates a circuit connection layout of a second pixel driving circuit in a second subpixel in a first pixel in a repeating unit in an array substrate in some embodiments according to the present disclosure. FIG. 7C illustrates a circuit connection layout of a third pixel driving circuit in a third subpixel in a first pixel in a repeating unit in an array substrate in some embodiments according to the present disclosure. FIG. 7D illustrates a circuit connection layout of a first pixel driving circuit in a first subpixel in a second pixel in a repeating unit in an array substrate in some embodiments according to the present disclosure. FIG. 7E illustrates a circuit connection layout of a second pixel driving circuit in a second subpixel in a second pixel in a repeating unit in an array substrate in some embodiments according to the present disclosure. FIG. 7F illustrates a circuit connection layout of a third pixel driving circuit in a third subpixel in a second pixel in a repeating unit in an array substrate in some embodiments according to the present disclosure. FIG. 7G illustrates a circuit connection layout of a first pixel driving circuit in a first subpixel in a third pixel in a repeating unit in an array substrate in some embodiments according to the present disclosure. FIG. 7H illustrates a circuit connection layout of a second pixel driving circuit in a second subpixel in a third pixel in a repeating unit in an array substrate in some embodiments according to the present disclosure. FIG. 7I illustrates a circuit connection layout of a third pixel driving circuit in a third subpixel in a third pixel in a repeating unit in an array substrate in some embodiments according to the present disclosure. FIG. 7J illustrates a circuit connection layout of a first pixel driving circuit in a first subpixel in a fourth pixel in a repeating unit in an array substrate in some embodiments according to the present disclosure. FIG. 7K illustrates a circuit connection layout of a second pixel driving circuit in a second subpixel in a fourth pixel in a repeating unit in an array substrate in some embodiments according to the present disclosure. FIG. 7L illustrates a circuit connection layout of a third pixel driving circuit in a third subpixel in a fourth pixel in a repeating unit in an array substrate in some embodiments according to the present disclosure.

Referring to FIG. 3, FIG. 7A to FIG. 7L, in a respective pixel driving circuit, a respective first voltage supply line of the plurality of first voltage supply lines is connected to a first electrode of the driving transistor T3. A respective first gate line of the plurality of first gate lines GL1 is connected to a gate electrode of the first transistor T1. A respective second gate line of the plurality of second gate lines GL2 is connected to a gate electrode of the second transistor T2.

A respective source electrode connecting line of the plurality of source electrode connecting lines SCL connects first electrodes of the first transistor T1 and the second transistor T2 together. The respective source electrode connecting line of the plurality of source electrode connecting lines SCL is further connected to a respective data connecting pad of the plurality of data connecting pads DCP. The respective data connecting pad of the plurality of data connecting pads DCP is in turn connected to a respective data line of the plurality of data lines DL.

A respective drain electrode connecting line of the plurality of drain electrode connecting lines DCL connects second electrodes of the first transistor T1 and the second transistor T2 together. The respective drain electrode connecting line of the plurality of drain electrode connecting lines DCL is further connected to a respective first node connecting line of the plurality of first node connecting lines Cln1. The respective first node connecting line of the plurality of first node connecting lines Cln1 is in turn connected to a gate electrode of the driving transistor T3.

The respective first node connecting line of the plurality of first node connecting lines Cln1 is connected to a respective first connecting pad of the plurality of first connecting pads. The respective first connecting pad of the plurality of first connecting pads is connected to a respective first capacitor electrode of the plurality of first capacitor electrodes.

A respective second node connecting line of the plurality of second node connecting lines Cln2 is connected to a second electrode of the driving transistor T3. The respective second node connecting line of the plurality of second node connecting lines is in turn connected to a respective second connecting pad of the plurality of second connecting pads. The respective second connecting pad of the plurality of second connecting pads is then connected to a respective anode connecting pad of a plurality of anode connecting pads. The respective anode connecting pad of a plurality of anode connecting pads is connected to an anode of a respective subpixel.

Figure 8:
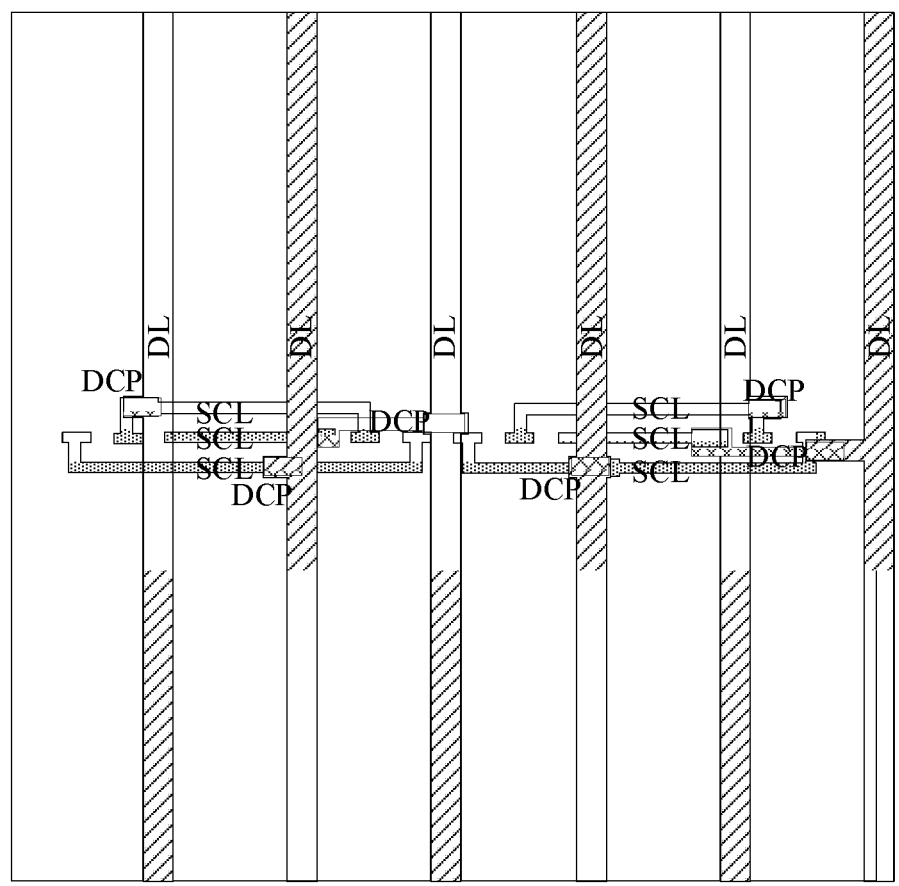
FIG. 8 illustrates a data signal network in an array substrate in some embodiments according to the present disclosure.

FIG. 8 illustrates a data signal network in an array substrate in some embodiments according to the present disclosure. In the repeating unit, a number of transistors configured to receive data signals is 2N, N being an integer equal to or greater than 1, e.g., 1, 2, 3, 4, 5, 6, 7, 8, 9, 10, 11, 12, 13, 14, 15, 16, 17, 18, 19, or 20. In one example, N=12. In another example, the repeating unit includes four pixels, each pixel includes 3 subpixels, each subpixel includes a pixel driving circuit, each pixel driving circuit includes two transistors that are configured to receive data signals.

In some embodiments, a number of data lines configured to provide data signals to the repeating unit is (N/2). In some embodiments, a number of data connecting pads in the repeating unit is (N/2). In some embodiments, a number of source electrode connecting lines in the repeating unit is (N/2). Optionally, first electrodes of four transistors (including two first transistors and two second transistors) in two pixel driving circuits are connected to a same source electrode connecting line. Optionally, first electrodes of four transistors (including two first transistors and two second transistors) in two pixel driving circuits in a same column and respectively in two adjacent pixels in the same column are connected to a same source electrode connecting line.

In some embodiments, first electrodes of two first transistors that are connected to a same source electrode connecting line are parts of a unitary structure. In some embodiments, first electrodes of two second transistors that are connected to a same source electrode connecting line are parts of a unitary structure.

Figure 9:
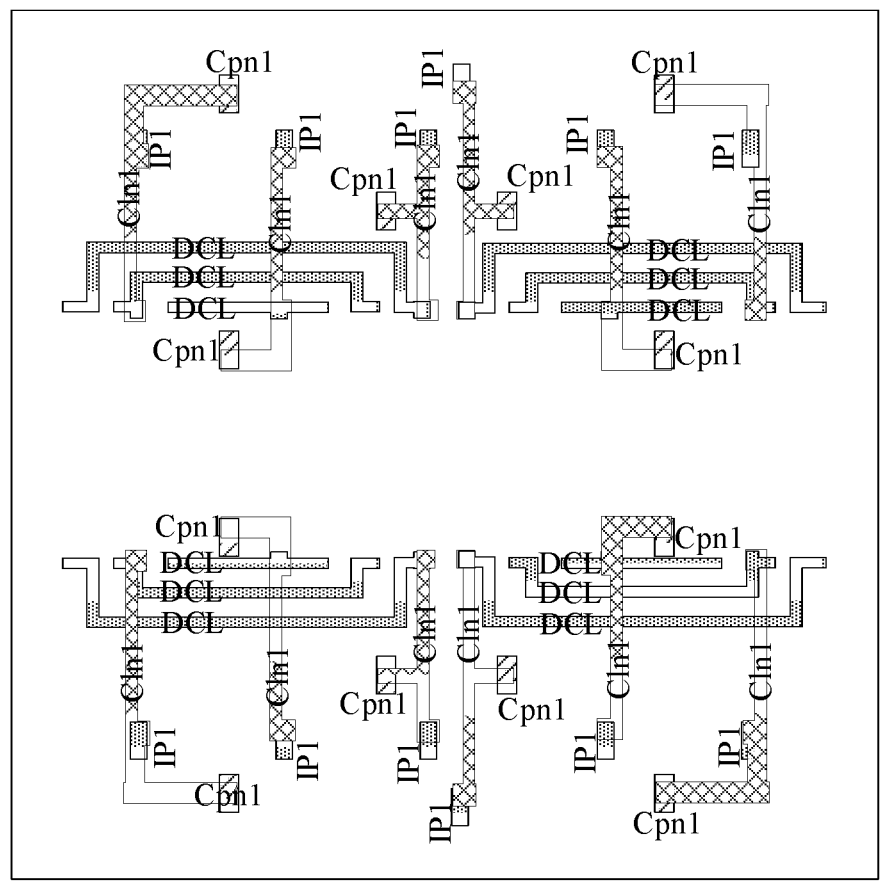
FIG. 9 illustrates a first node connecting line layout in an array substrate in some embodiments according to the present disclosure.

FIG. 9 illustrates a first node connecting line layout in an array substrate in some embodiments according to the present disclosure. Referring to FIG. 3 and FIG. 9, a number of transistors having second electrodes connected to the first node N1 in the repeating unit is 2N. In one example, N=12. Optionally, a number of drain electrode connecting lines in the repeating unit is N. Optionally, a number of first node connecting lines in the repeating unit is N. Optionally, a number of intermediate connecting pads in the repeating unit is N. Optionally, a number of first node connecting pads in the repeating unit is N.

Figure 10:
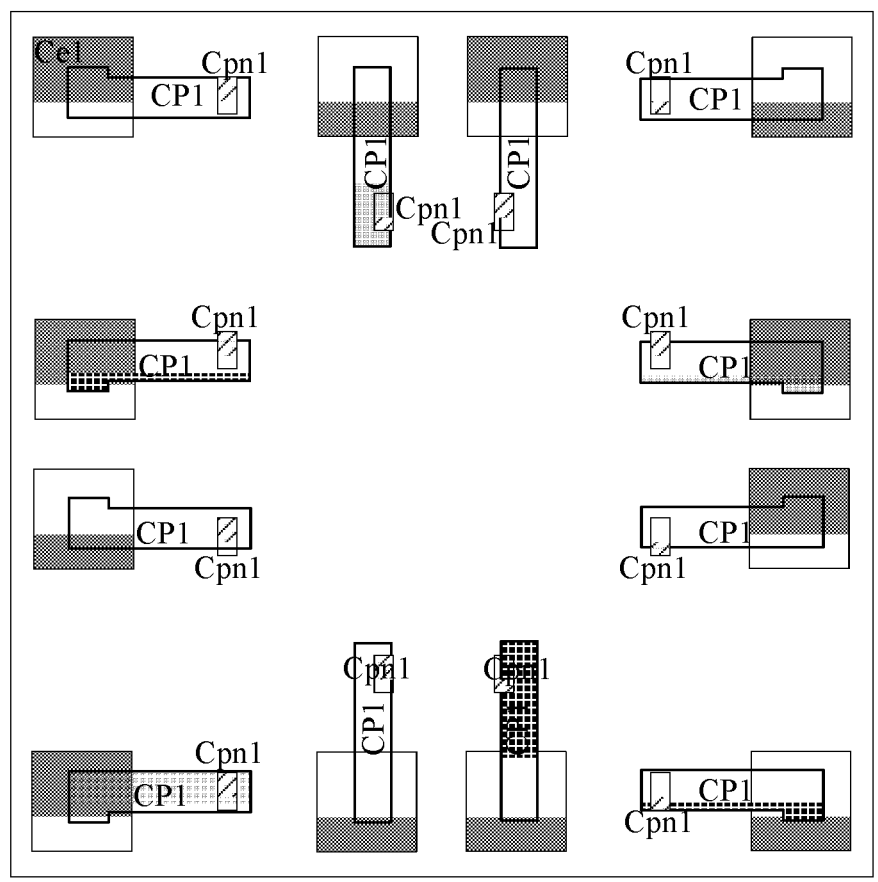
FIG. 10 illustrates a first capacitor electrode layout in an array substrate in some embodiments according to the present disclosure.

FIG. 10 illustrates a first capacitor electrode layout in an array substrate in some embodiments according to the present disclosure. FIG. 10 shows that a respective first connecting pad of the plurality of first connecting pads CP1 connects a respective first node connecting pad of the plurality of first node connecting pads Cpn1 with a respective first capacitor electrode of the plurality of first capacitor electrodes Ce1.

Figure 11:
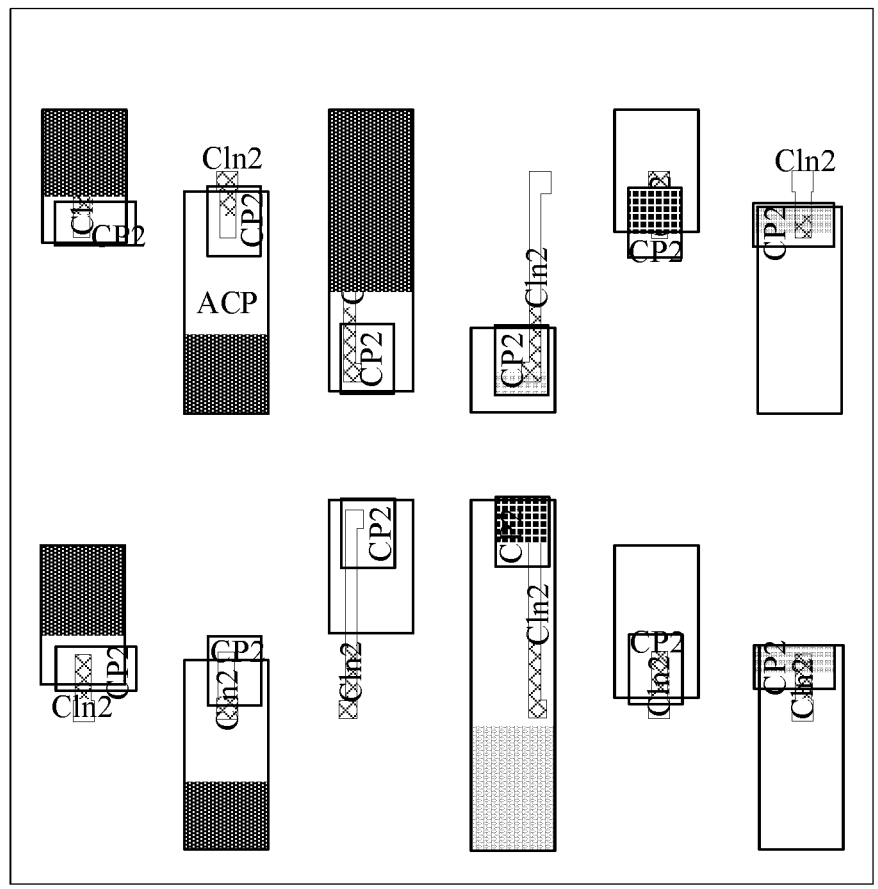
FIG. 11 illustrates anode connecting layout in an array substrate in some embodiments according to the present disclosure.

FIG. 11 illustrates anode connecting layout in an array substrate in some embodiments according to the present disclosure. Referring to FIG. 11, a respective second node connecting line of the plurality of second node connecting lines Cln2 is connected to a respective second connecting pad of the plurality of second connecting pads CP2. The respective second connecting pad of the plurality of second connecting pads CP2 is connected to a respective anode connecting pad of the plurality of anode connecting pads ACP.

Referring to FIG. 4A, FIG. 4B, FIG. 4F, FIG. 4H, FIG. 4I, and FIG. 4M, the array substrate in some embodiments includes a low voltage signal network configured to be provided with a low voltage signal (e.g., a ground voltage signal). In some embodiments, the low voltage signal network includes a first interference prevention block IPB1 configured to shield at least portions of active layers of the first transistor T1 and the driving transistor T3 from electromagnetic interference. Optionally, the first interference prevention block IPB1 is in a same layer as the active layers of the first transistor T1 and the driving transistor T3.

In some embodiments, the low voltage signal network further includes a third interference prevention block IPB3 is configured to shield at least portions of active layers of the first transistor T1 and the driving transistor T3 from electromagnetic interference. The third interference prevention block IPB3 is connected to the first interference prevention block IPB1. The third interference prevention block IPB3 is in a layer different from the first interference prevention block IPB1. Optionally, the third interference prevention block IPB3 is in a first signal line layer on a side of the first interference prevention block IPB1 away from a base substrate.

In some embodiments, the third interference prevention block IPB3 is present in the first pixel and the second pixel of the repeating unit, and is absent in the third pixel and the fourth pixel in the repeating unit.

In some embodiments, an orthographic projection of the third interference prevention block IPB3 on a base substrate at least partially overlaps with an orthographic projection of active layers of multiple driving transistors in the repeating unit on the base substrate. Optionally, the orthographic projection of the third interference prevention block IPB3 on the base substrate at least partially overlaps with an orthographic projection of active layers of driving transistors in the first pixel and the second pixel in the repeating unit on the base substrate. Optionally, the orthographic projection of the third interference prevention block IPB3 on the base substrate is non-overlapping with an orthographic projection of active layers of driving transistors in the third pixel and the fourth pixel in the repeating unit on the base substrate.

In some embodiments, the low voltage signal network further includes a ground plate GND. Optionally, the ground plate GND is connected to the third interference prevention block IPB3. The ground plate GND is in a layer different from the first interference prevention block IPB1 or the third interference prevention block IPB3. Optionally, the ground plate GND is in a second signal line layer on a side of the third interference prevention block IPB3 away from the first interference prevention block IPB1.

In some embodiments, the ground plate GND in the repeating unit extends throughout at least 50% (at least 55%, at least 60%, at least 65%, at least 70%, at least 75%, at least 80%, at least 85%, or at least 90%) of the repeating unit. Optionally, the ground plate GND in the repeating unit extends throughout less than 100% (less than 95%, less than 90%, less than 85%, less than 80%, less than 75%, less than 70%, less than 65%, or less than 60%) of the repeating unit.

In some embodiments, an orthographic projection of the ground plate GND on a base substrate at least partially overlaps with an orthographic projection of the third interference prevention block IPB3 in the repeating unit on the base substrate; and at least partially overlaps with an orthographic projection of the first interference prevention block IPB1 in the repeating unit on the base substrate. Optionally, the orthographic projection of the third interference prevention block IPB3 in the repeating unit on the base substrate at least partially overlaps with an orthographic projection of the first interference prevention block IPB1 in the repeating unit on the base substrate.

In some embodiments, the low voltage signal network further includes a plurality of ground lines GNL. Optionally, the plurality of ground lines GNL are connected to the ground plate GND. The plurality of ground lines GNL are in a layer different from the ground plate GND, the first interference prevention block IPB1, or the third interference prevention block IPB3. Optionally, the plurality of ground lines GNL are in a third signal line layer on a side of the ground plate GND away from the third interference prevention block IPB3.

In some embodiments, the plurality of ground lines GNL extend along a direction substantially parallel to the second direction DR2.

In some embodiments, the low voltage signal network further includes a second capacitor electrode Ce2. Optionally, the second capacitor electrode Ce2 is connected to the plurality of ground lines GNL. Optionally, the second capacitor electrode Ce2 is in a layer different from the plurality of ground lines GNL, the ground plate GND, the first interference prevention block IPB1, or the third interference prevention block IPB3. Optionally, the second capacitor electrode Ce2 is in a second conductive layer on a side of the plurality of ground lines GNL away from the ground plate GND.

The inventors of the present disclosure discover that the low voltage signal network according to the present disclosure can effectively shield at least portions of active layers of the first transistor T1 and the driving transistor T3 from electromagnetic interference; and achieves an enhanced storage capacitance of the storage capacitor.

Figure 12A:
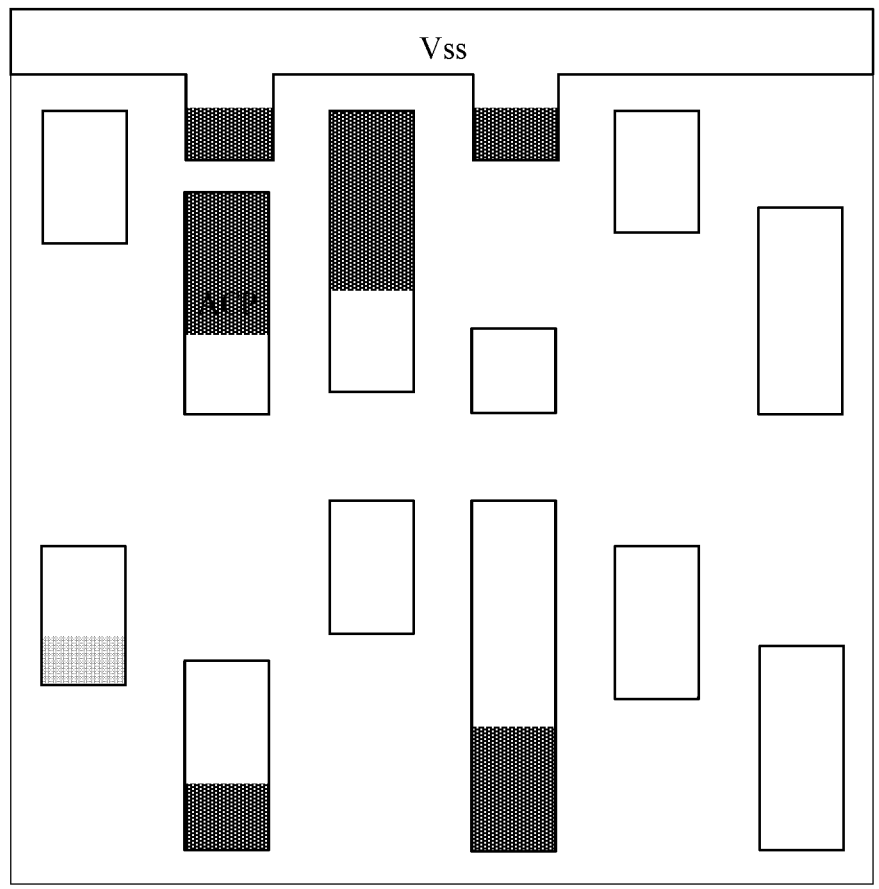
FIG. 12A is a diagram illustrating the structure of a second connecting layer in an array substrate in some embodiments according to the present disclosure.
Figure 12B:
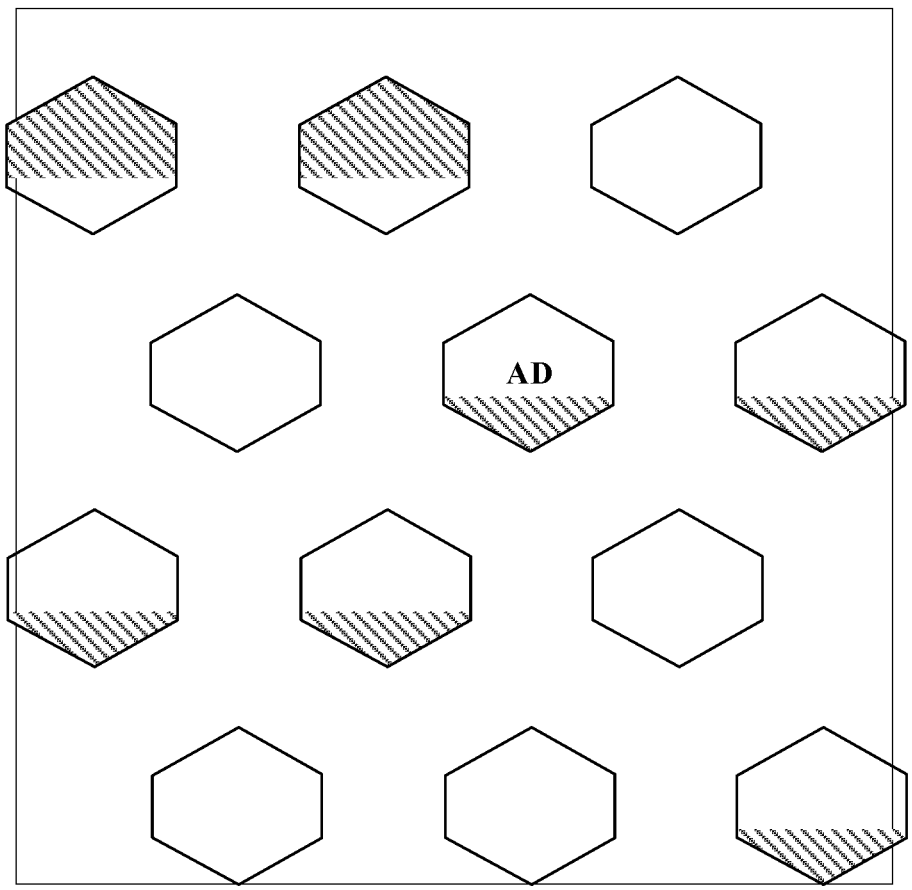
FIG. 12B is a diagram illustrating the structure of an anode layer in an array substrate in some embodiments according to the present disclosure.
Figure 12C:
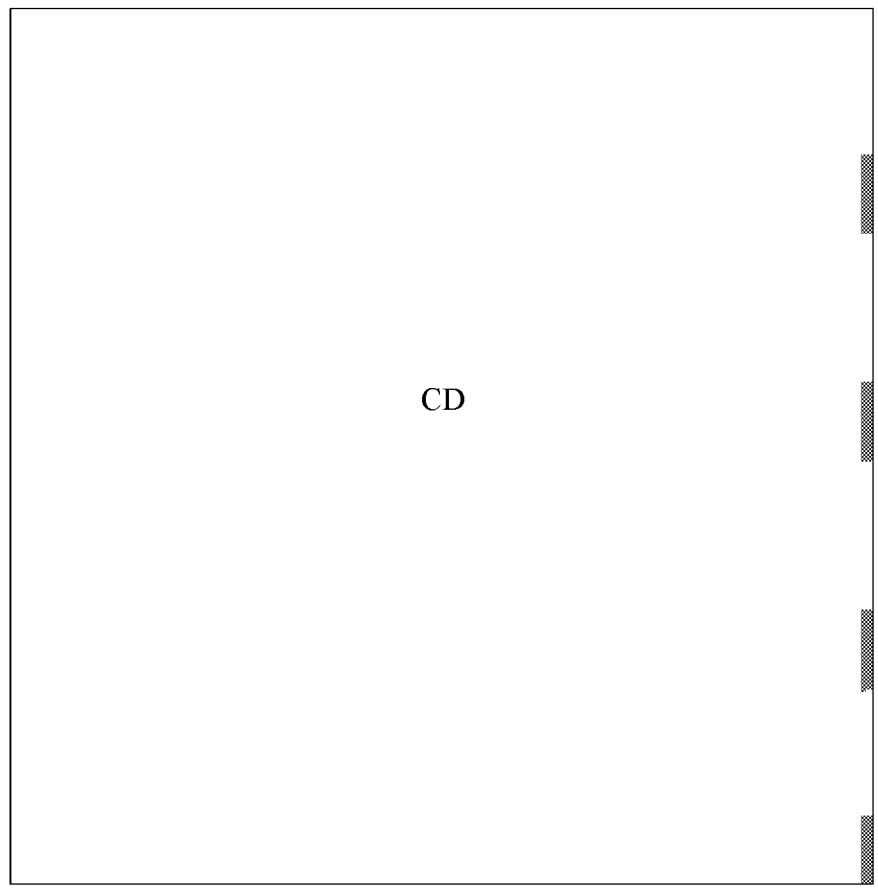
FIG. 12C is a diagram illustrating the structure of a cathode layer in an array substrate in some embodiments according to the present disclosure.
Figure 12D:
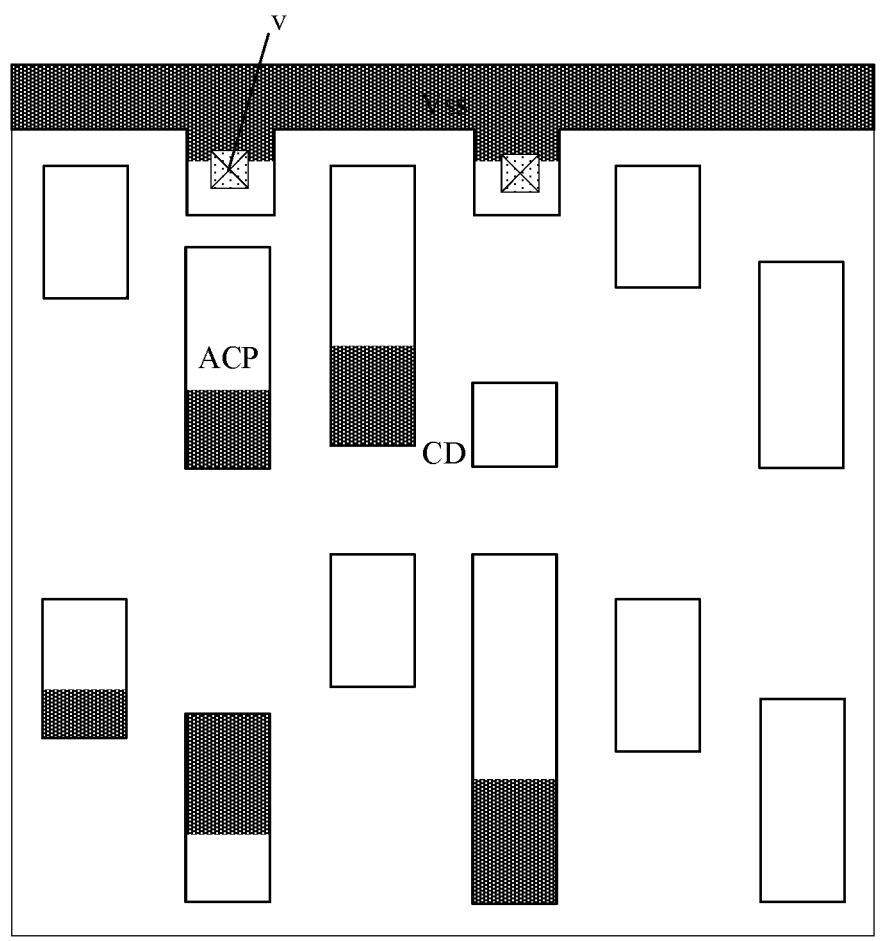
FIG. 12D illustrates the structure of a second connecting layer and a cathode layer in an array substrate in some embodiments according to the present disclosure.

In some embodiments, the array substrate further includes a plurality of second voltage supply lines. FIG. 12A is a diagram illustrating the structure of a second connecting layer in an array substrate in some embodiments according to the present disclosure. FIG. 12B is a diagram illustrating the structure of an anode layer in an array substrate in some embodiments according to the present disclosure. FIG. 12C is a diagram illustrating the structure of a cathode layer in an array substrate in some embodiments according to the present disclosure. FIG. 12D illustrates the structure of a second connecting layer and a cathode layer in an array substrate in some embodiments according to the present disclosure. Referring to FIG. 12A to FIG. 12D, the second connecting layer in some embodiments includes a plurality of anode connecting pads ACP and a plurality of second voltage supply lines Vss. In some embodiments, the plurality of first voltage supply lines are configured to provide a first reference voltage signal (e.g., a high reference voltage signal). Optionally, the plurality of second voltage supply lines Vss are configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Referring to FIG. 12A to FIG. 12D, in some embodiments, the respective second voltage supply line of the plurality of second voltage supply lines Vss is connected to the cathode CD through one or more via v, e.g., extending through at least a pixel definition layer. Optionally, the cathode CD is a common layer extending throughout a display area of the array substrate. The inventors of the present disclosure discover that, by having the plurality of second voltage supply lines Vss connected to the cathode CD, the voltage drop across the cathode CD can be effectively reduced. The inventors of the present disclosure discover that, by having the plurality of second voltage supply lines Vss in the same layer as the plurality of anode connecting pads ACP, it obviates the need to have an additional layer for forming an auxiliary cathode, thus simplifying the fabrication process and increasing aperture ratio of the array substrate.

Figure 13:
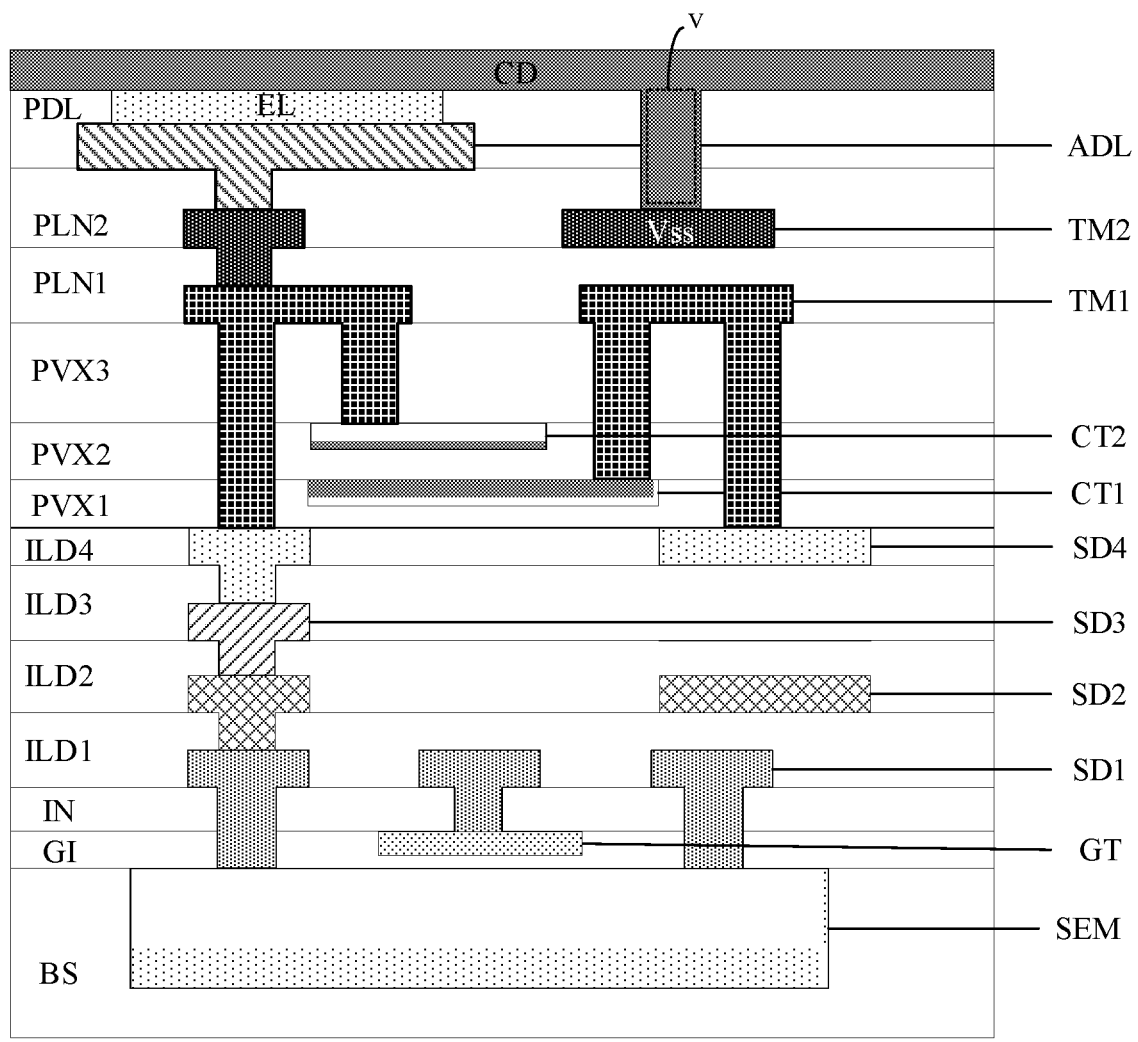
FIG. 13 is a cross-sectional view of an array substrate in some embodiments according to the present disclosure.

FIG. 13 is a cross-sectional view of an array substrate in some embodiments according to the present disclosure. Referring to FIG. 13, the array substrate in some embodiments includes a base substrate BS, a semiconductor material layer SEM on the base substrate BS, a gate insulating layer GI on a side of the semiconductor material layer SEM away from the base substrate BS, a gate metal layer GT on a side of the semiconductor material layer SEM away from the base substrate BS, an insulating layer IN on a side of the gate metal layer GT away from the base substrate BS, a first signal line layer SD1 on a side of the insulating layer IN away from the base substrate BS, a first inter-layer dielectric layer ILD1 on a side of the first signal line layer SD1 away from the base substrate BS, a second signal line layer SD2 on a side of the first inter-layer dielectric layer ILD1 away from the base substrate BS, a second inter-layer dielectric layer ILD2 on a side of the second signal line layer SD2 away from the base substrate BS, a third signal line layer SD3 on a side of the second inter-layer dielectric layer ILD2 away from the base substrate BS, a third inter-layer dielectric layer ILD3 on a side of the third signal line layer SD3 away from the base substrate BS, a fourth signal line layer SD4 on a side of the third inter-layer dielectric layer ILD3 away from the base substrate BS, a first passivation layer PVX1 on a side of the fourth signal line layer SD4 away from the base substrate BS, a first conductive layer CT1 on a side of the first passivation layer PVX1 away from the base substrate BS, a second passivation layer PVX2 on a side of the first conductive layer CT1 away from the base substrate BS, a second conductive layer CT2 on a side of the second passivation layer PVX2 away from the base substrate BS, a third passivation layer PVX3 on a side of the second conductive layer CT2 away from the base substrate BS, a first connecting layer TM1 on a side of the third passivation layer PVX3 away from the base substrate BS, a first planarization layer PLN1 on a side of the first connecting layer TM1 away from the base substrate BS, a second connecting layer TM2 on a side of the first planarization layer PLN1 away from the base substrate BS, a second planarization layer PLN2 on a side of the second connecting layer TM2 away from the base substrate BS, an anode layer ADL on a side of the second planarization layer PLN2 away from the base substrate BS, a pixel definition layer PDL on a side of the anode layer ADL away from the base substrate BS, a light emitting layer EL on a side of the anode layer ADL away from the base substrate BS and at least partially in subpixel apertures defined by the pixel definition layer PDL, and a cathode layer CD on a side of the light emitting layer EL away from the base substrate BS. The second connecting layer TM2 includes a plurality of second voltage supply lines Vss. The cathode layer CD is connected to the plurality of second voltage supply lines Vss through one or more via v, e.g., extending through at least the pixel definition layer PDL and the second planarization layer PLN2.

Figure 14:
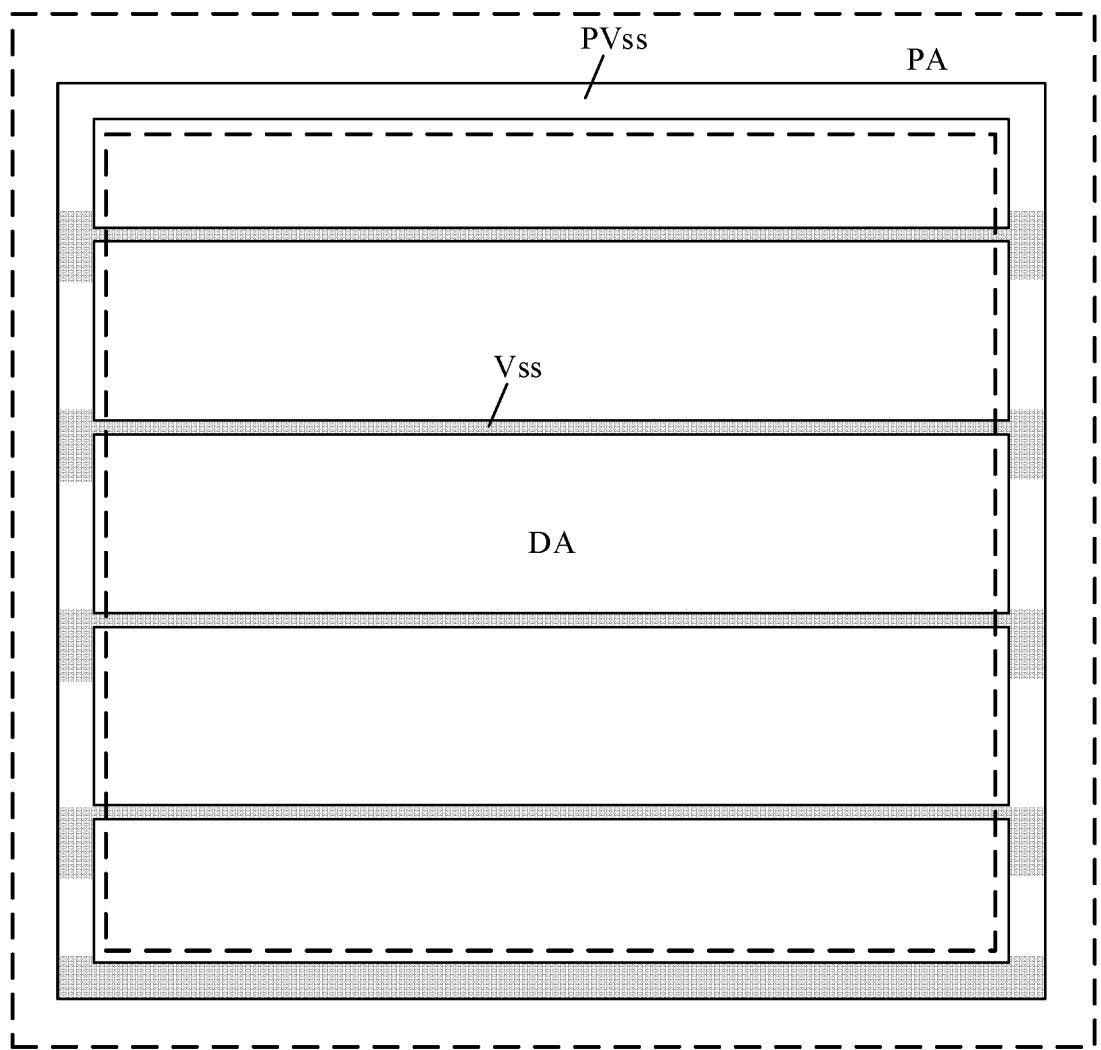
FIG. 14 illustrates a second voltage supply network in an array substrate in some embodiments according to the present disclosure.

FIG. 14 illustrates a second voltage supply network in an array substrate in some embodiments according to the present disclosure. Referring to FIG. 14, the array substrate in some embodiments includes a display area DA and a peripheral area PA. As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding to a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In some embodiments, the second voltage supply network includes the plurality of second voltage supply lines Vss and a peripheral second voltage supply line PVss. A respective second voltage supply line of the plurality of second voltage supply lines Vss at least partially crosses over the display area DA. Optionally, the peripheral second voltage supply line PVss is at least partially in the peripheral area PA. Optionally, the plurality of second voltage supply lines Vss are connected to the peripheral second voltage supply line PVss. Optionally, the plurality of second voltage supply lines Vss and the peripheral second voltage supply line PVss are parts of a unitary structure. The second voltage supply network is connected to the cathode, as discussed in FIG. 12A to FIG. 12D, and FIG. 13. Optionally, the second voltage supply network is connected to the cathode through one or more vias in the display area DA. Optionally, the peripheral second voltage supply line PVss substantially surrounds the display area DA.

In an array substrate without the second voltage supply network, the inventors of the present disclosure discover that the IR drop can be as large as 992 mv when the array substrate is configured to display an image of 255 grayscale, and the current uniformity is 67%. In an array substrate with the second voltage supply network, the inventors of the present disclosure discover that the IR drop can be significantly lowered to 284 mv, and the current uniformity is increased to 85%.

Figure 15A:
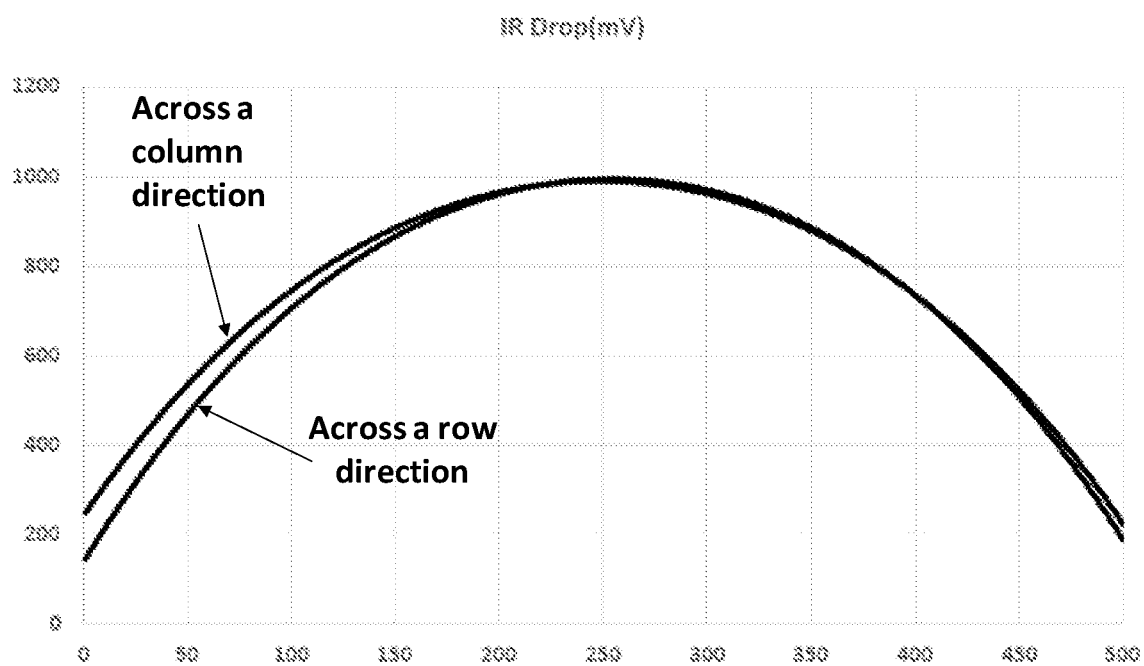
FIG. 15A shows an IR drop across an array substrate without a second voltage supply network.
Figure 15B:
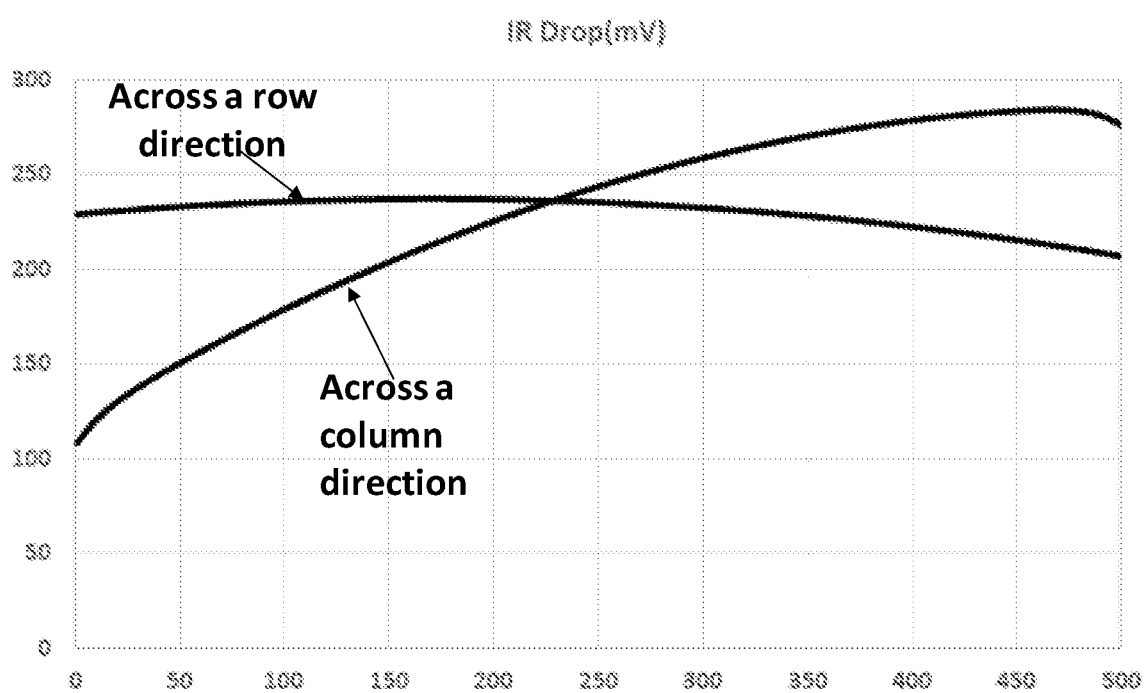
FIG. 15B shows an IR drop across an array substrate with a second voltage supply network.

FIG. 15A shows an IR drop across an array substrate without a second voltage supply network. FIG. 15B shows an IR drop across an array substrate with a second voltage supply network. Referring to FIG. 15A, in the array substrate without the second voltage supply network, the IR drop is much higher in a central region of the array substrate. Referring to FIG. 15B, in the array substrate with the second voltage supply network, the IR drop is more evenly distributed throughout the array substrate (particularly across the row direction). Display uniformity is significantly enhanced in the array substrate with the second voltage supply network.

Figure 16:
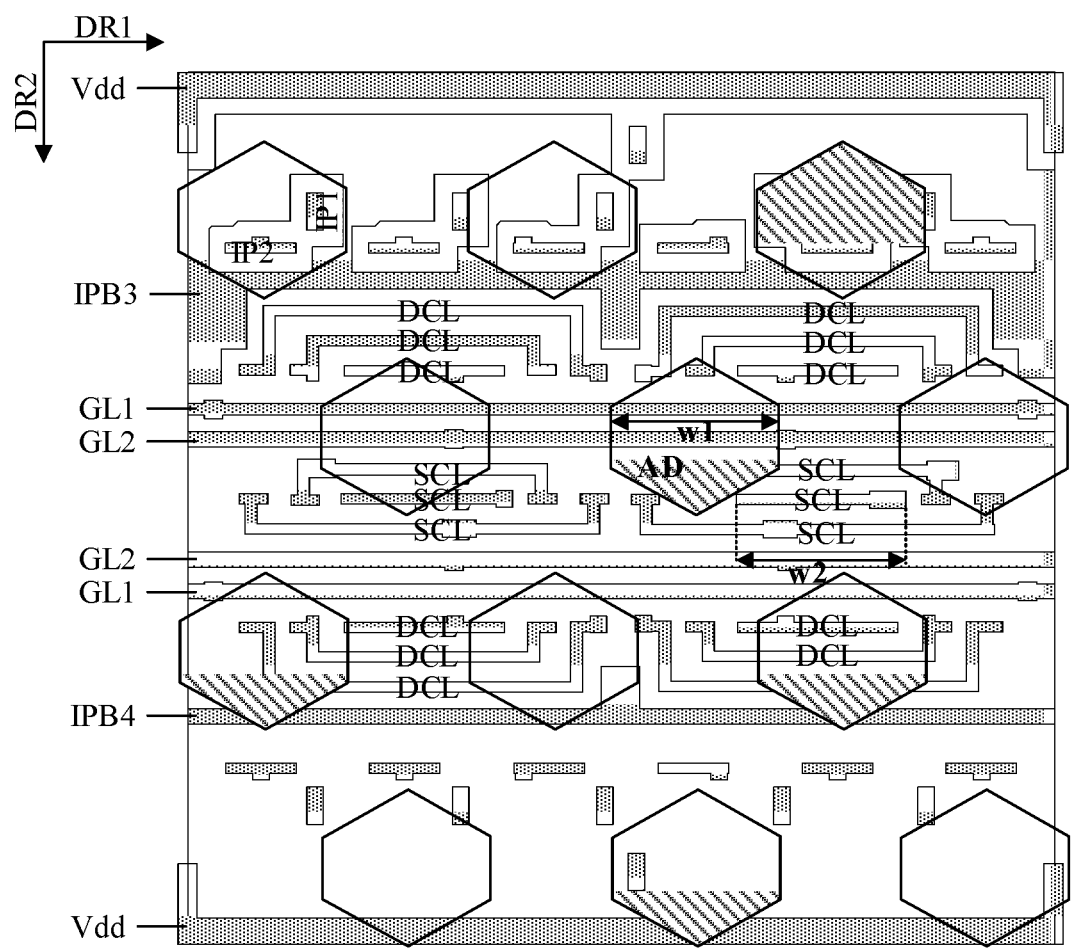
FIG. 16 is a diagram illustrating the structure of a first signal line layer and an anode layer in the array substrate depicted in FIG. 4A.

FIG. 16 is a diagram illustrating the structure of a first signal line layer and an anode layer in the array substrate depicted in FIG. 4A. Referring to FIG. 16, a respective anode of the plurality of anodes AD has a first width w1 along a direction substantially parallel to the first direction DR1. The shortest source electrode connecting line of the plurality of source electrode connecting lines SCL has a second width w2 along the direction substantially parallel to the first direction DR1. In some embodiments, the second width w2 is greater than at least 75% (e.g., greater than at least 80%, greater than at least 85%, greater than at least 90%, greater than at least 95%, greater than at least 99%, or greater than at least 100%) of the first width w1. In some embodiments, a width of any source electrode connecting line of the plurality of source electrode connecting lines SCL along the direction substantially parallel to the first direction DR1 is greater than at least 75% (e.g., greater than at least 80%, greater than at least 85%, greater than at least 90%, greater than at least 95%, greater than at least 99%, or greater than at least 100%) of the first width w1.

In some embodiments, a respective anode of the plurality of anodes AD has a first maximum width. The shortest source electrode connecting line of the plurality of source electrode connecting lines SCL has a second maximum width. In some embodiments, the second maximum width is greater than at least 75% (e.g., greater than at least 80%, greater than at least 85%, greater than at least 90%, greater than at least 95%, greater than at least 99%, or greater than at least 100%) of the first maximum width. In some embodiments, a maximum width of any source electrode connecting line of the plurality of source electrode connecting lines SCL is greater than at least 75% (e.g., greater than at least 80%, greater than at least 85%, greater than at least 90%, greater than at least 95%, greater than at least 99%, or greater than at least 100%) of the first maximum width.

Figure 17:
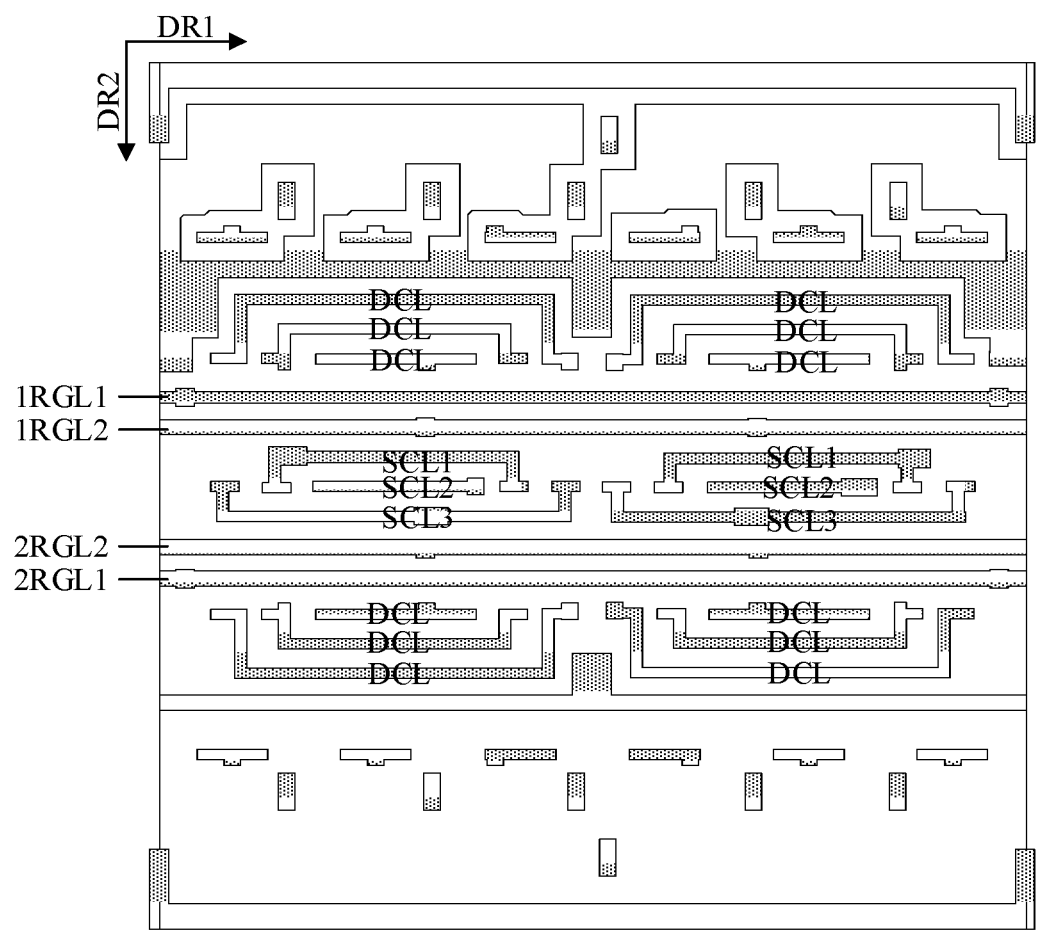
FIG. 17 is a diagram illustrating the structure of a first signal line layer in the array substrate depicted in FIG. 4A.

FIG. 17 is a diagram illustrating the structure of a first signal line layer in the array substrate depicted in FIG. 4A. Referring to FIG. 4F and FIG. 17, a first respective first gate line 1RGL1 of the plurality of first gate lines GL1, a first respective second gate line 1RGL2 of the plurality of second gate lines GL2, a second respective second gate line 2RGL2 of the plurality of second gate lines GL2, and a second respective first gate line 2RGL1 of the plurality of first gate lines GL1 extend through the respective repeating unit. In some embodiments, the first respective first gate line 1RGL1, the first respective second gate line 1RGL2, the second respective second gate line 2RGL2, and the second respective first gate line 2RGL1 are sequentially arranged along the second direction DR2. Optionally, source electrode connecting lines in the respective repeating unit (e.g., all source electrode connecting lines in the respective repeating unit) are between a first group of gate lines and a second group of gate lines, the first group of gate lines comprising the first respective first gate line 1RGL1 and the first respective second gate line 1RGL2, the second group of gate lines comprising the second respective second gate line 2RGL2 and the second respective first gate line 2RGL1. Optionally, drain electrode connecting lines of a first group of subpixels in the respective repeating unit are on a side of the first group of gate lines away from the source electrode connecting lines in the respective repeating unit. Optionally, drain electrode connecting lines of a second group of subpixels in the respective repeating unit are on a side of the second group of gate lines away from the source electrode connecting lines in the respective repeating unit. Optionally, the array substrate is absent of any drain electrode connecting lines between the first group of gate lines and the second group of gate lines.

In some embodiments, source electrode connecting lines in the respective repeating unit are arranged in one or more columns along the second direction DR2. A respective column of the one or more columns of source electrode connecting lines includes a first source electrode connecting line SCL1, a second source electrode connecting line SCL2, and a third source electrode connecting line SCL3. The second source electrode connecting line SCL2 is between the first source electrode connecting line SCL1 and the third source electrode connecting line SCL3. The first source electrode connecting line SCL1 and the third source electrode connecting line SCL3 have a U shape. An opening of the U shape of the first source electrode connecting line SCL1 and an opening of the U shape of the third source electrode connecting line SCL3 are facing each other. The second source electrode connecting line SCL2 is between the opening of the U shape of the first source electrode connecting line SCL1 and the opening of the U shape of the third source electrode connecting line SCL3.

In some embodiments, drain electrode connecting lines of the first group of subpixels in the respective repeating unit are arranged in one or more columns along the second direction DR2. A respective column of the one or more columns of drain electrode connecting lines of the first group of subpixels in the respective repeating unit includes a first drain electrode connecting line DCL1, a second drain electrode connecting line DCL2, and a third drain electrode connecting line DCL3. The second drain electrode connecting line DCL2 is between the first drain electrode connecting line DCL1 and the third drain electrode connecting line DCL3.

In some embodiments, the first drain electrode connecting line DCL1 and the second drain electrode connecting line DCL2 have a U shape. An opening of the U shape of the first drain electrode connecting line DCL1 and an opening of the U shape of the second drain electrode connecting line DCL2 are facing a same direction, e.g., facing the third drain electrode connecting line DCL3.

In some embodiments, drain electrode connecting lines of the second group of subpixels in the respective repeating unit are arranged in one or more columns along the second direction DR2. A respective column of the one or more columns of drain electrode connecting lines of the second group of subpixels in the respective repeating unit includes a fourth drain electrode connecting line DCL4, a fifth drain electrode connecting line DCL5, and a sixth drain electrode connecting line DCL6. The fifth drain electrode connecting line DCL5 is between the fourth drain electrode connecting line DCL4 and the sixth drain electrode connecting line DCL6.

In some embodiments, the fifth drain electrode connecting line DCL5 and the sixth drain electrode connecting line DCL6 have a U shape. An opening of the U shape of the fifth drain electrode connecting line DCL5 and an opening of the U shape of the sixth drain electrode connecting line DCL6 are facing a same direction, e.g., facing the fourth drain electrode connecting line DCL4.

Figure 18:
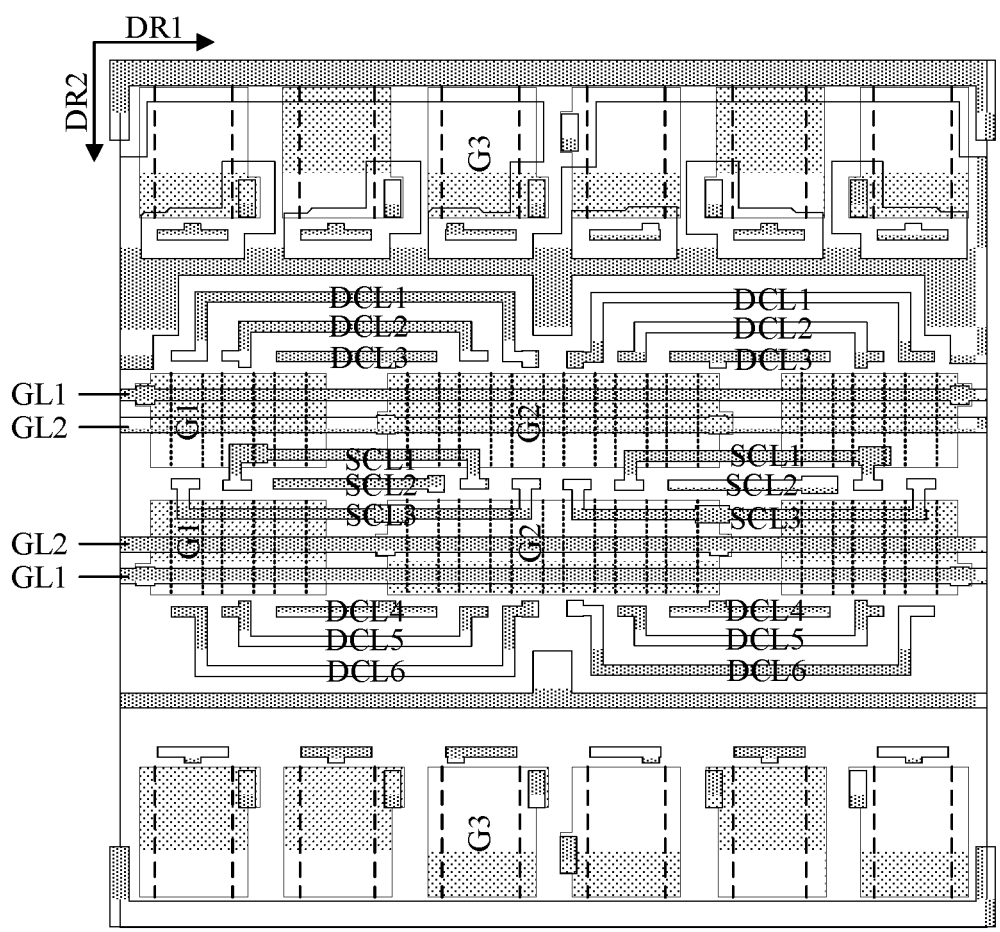
FIG. 18 is a diagram illustrating the structure of a gate metal layer and a first signal line layer in the array substrate depicted in FIG. 4A.

FIG. 18 is a diagram illustrating the structure of a gate metal layer and a first signal line layer in the array substrate depicted in FIG. 4A. Referring to FIG. 18, in some embodiments, an orthographic projection of the second source electrode connecting line SCL2 on a base substrate is non-overlapping with an orthographic projection of gate electrodes of first transistors and gate electrodes of second transistors on the base substrate. In some embodiments, an orthographic projection of the first electrode connecting line SCL1 on a base substrate partially overlaps with an orthographic projection of a gate electrode of at least one first transistor and a gate electrode of at least one second transistor on the base substrate. In some embodiments, an orthographic projection of the third source electrode connecting line SCL3 on a base substrate partially overlaps with an orthographic projection of a gate electrode of at least one first transistor and a gate electrode of at least one second transistor on the base substrate.

In some embodiments, an orthographic projection of any drain electrode connecting line (including the first drain electrode connecting line DCL1, the second drain electrode connecting line DCL2, the third drain electrode connecting line DCL3, the fourth drain electrode connecting line DCL4, the fifth drain electrode connecting line DCL5, and the sixth drain electrode connecting line DCL6) on a base substrate is non-overlapping with an orthographic projection of gate electrodes of first transistors, second transistors, and third transistors on the base substrate.

The inventors of the present disclosure discover the unique structure depicted in FIG. 17 and FIG. 18 is conducive to maximizing the use of the layout area.

Figure 19:
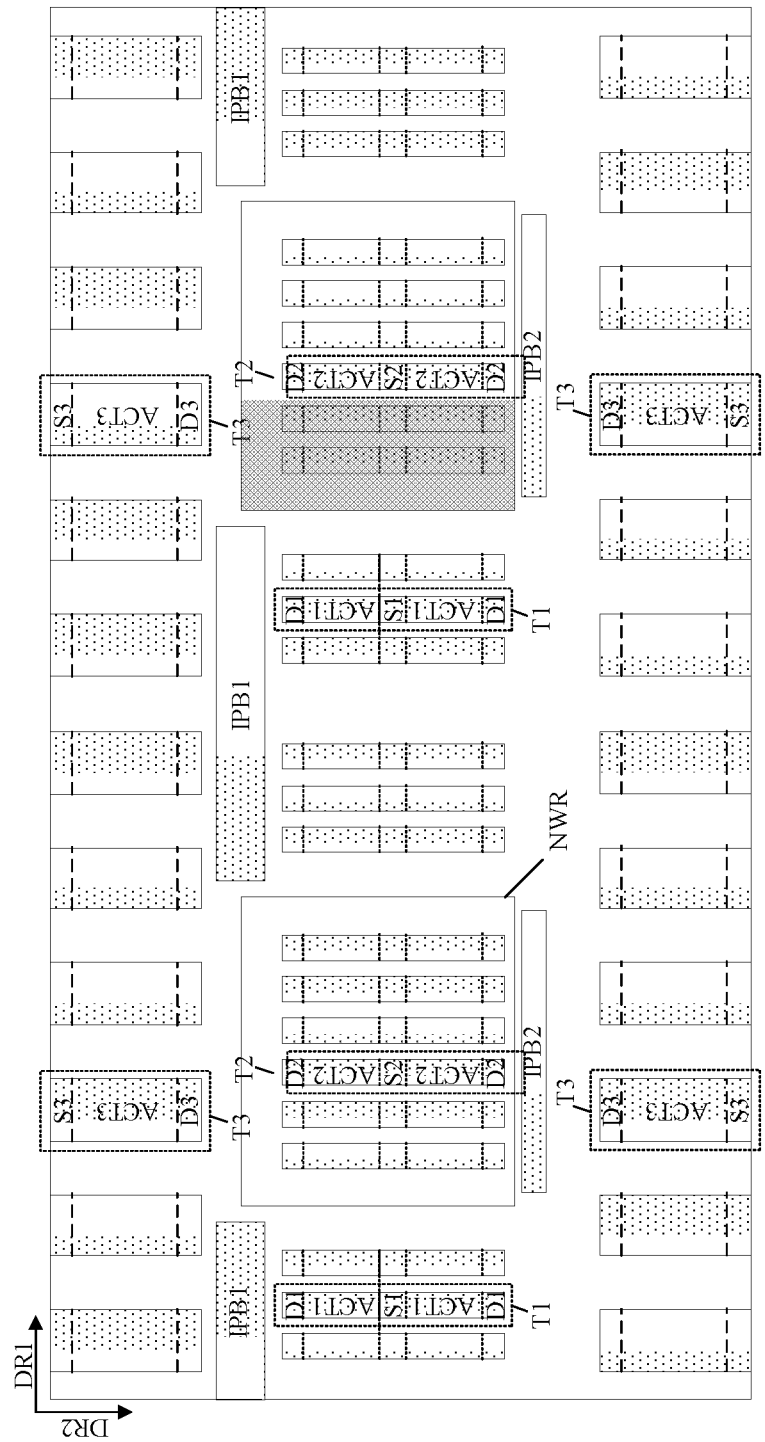
FIG. 19 is a diagram illustrating the structure of a semiconductor material layer in the array substrate depicted in FIG. 4A.

FIG. 19 is a diagram illustrating the structure of a semiconductor material layer in the array substrate depicted in FIG. 4A. Referring to FIG. 19, the array substrate in some embodiments includes a plurality of N-well regions NWR. As used herein, the term N-well region refers to a region subjected to N-type doping. In some embodiments, along the first direction DR1, a plurality of first interference prevention blocks and the plurality of N-well regions NWR are alternately arranged. A respective N-well region of the plurality of N-well regions NWR spaces apart two adjacent first interference prevention blocks of the plurality of first interference prevention blocks.

In some embodiments, along the first direction DR1, a plurality of first interference prevention blocks and a plurality of second interference prevention blocks are alternately arranged. A respective second interference prevention block of the plurality of second interference prevention blocks spaces apart two adjacent first interference prevention blocks of the plurality of first interference prevention blocks. A respective first interference prevention block of the plurality of first interference prevention blocks spaces apart two adjacent second interference prevention blocks of the plurality of second interference prevention blocks. In a row of repeating units, first interference prevention blocks and second interference prevention blocks are on two opposite sides of a row of N-well regions.

Referring to FIG. 7A to 7L, FIG. 9, and FIG. 10, in some embodiments, a respective first node connecting line of the plurality of first node connecting lines Cln1 has a T shape or a L shape. The respective first node connecting line includes a first fragment and a second fragment, the first fragment and the second fragment forming two strokes of the T shape or the L shape. Optionally, the first fragment is where the respective first node connecting line connected to the first capacitor electrode Ce1 (e.g., through Cpn1 and Cp1), and the second fragment is where the respective first node connecting line connected to a gate electrode of a third transistor (e.g., through IP1).

Figure 20:
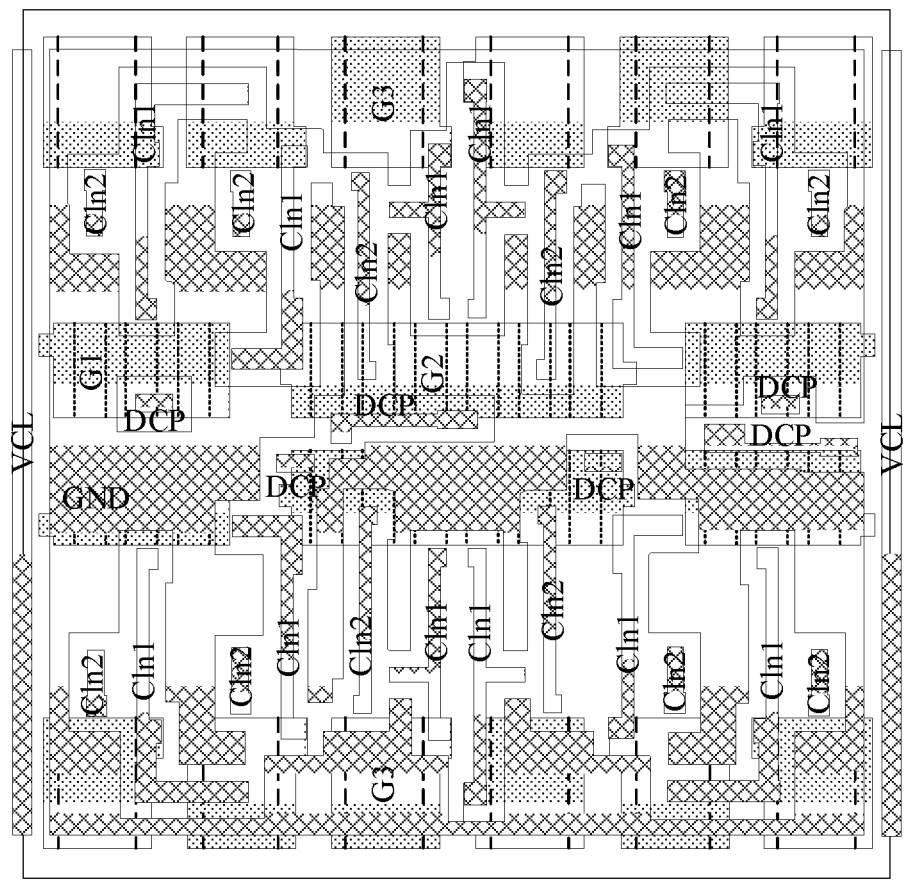
FIG. 20 is a diagram illustrating the structure of a gate metal layer and a second signal line layer in the array substrate depicted in FIG. 4A.

FIG. 20 is a diagram illustrating the structure of a gate metal layer and a second signal line layer in the array substrate depicted in FIG. 4A. Referring to FIG. 20, FIG. 4C, and FIG. 4H, in some embodiments, an orthographic projection of at least one second node connecting line of the plurality of second node connecting lines Cln2 on a base substrate partially overlaps with an orthographic projection of a gate electrode G2 of a second transistor T2 on the base substrate. In some embodiments, an orthographic projection of a respective first node connecting line of the plurality of first node connecting lines Cln1 on a base substrate partially overlaps with an orthographic projection of a gate electrode G3 of a third transistor T3 on the base substrate.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In some embodiments, the array substrate comprises a plurality of light emitting elements. Optionally, a respective light emitting element of the plurality of light emitting elements comprises an anode of the plurality of anodes. Optionally, the plurality of anodes are connected to the one or more integrated circuits. Optionally, the respective light emitting element is an organic light emitting diode. Optionally, the respective light emitting element is a micro light emitting diode. Optionally, the respective light emitting element is a mini light emitting diode. Optionally, the respective light emitting element includes an anode, a light emitting layer, and a cathode.

In another aspect, the present disclosure provides a method of fabricating an array substrate. In some embodiments, the method includes forming pixels arranged in a plurality of repeating units. Optionally, forming a respective repeating unit of the plurality of repeating units comprises forming a plurality of pixels. Optionally, forming a respective pixel comprises forming one or more subpixels. Optionally, the method comprises forming a plurality of source electrode connecting lines and forming a plurality of data connecting pads in the repeating unit, and forming a plurality of data lines. Optionally, a respective source electrode connecting line of the plurality of source electrode connecting lines connects first electrodes of a first transistor and a second transistor in a respective pixel driving circuit together. Optionally, the respective source electrode connecting line is further connected to a respective data connecting pad of the plurality of data connecting pads. Optionally, the respective data connecting pad is connected to a respective data line of the plurality of data lines. Optionally, the method further includes forming a plurality of anodes. Optionally, a respective anode of the plurality of anodes has a first maximum width. Optionally, the respective source electrode connecting line has a second maximum width. Optionally, the second maximum width is greater than at least 75% of the first maximum width.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising pixels arranged in a plurality of repeating units;
    wherein a respective repeating unit of the plurality of repeating units comprises a plurality of pixels, a respective pixel comprising one or more subpixels;
    wherein the array substrate comprises a plurality of source electrode connecting lines and a plurality of data connecting pads in the repeating unit, and a plurality of data lines;
    a respective source electrode connecting line of the plurality of source electrode connecting lines connects first electrodes of a first transistor and a second transistor in a respective pixel driving circuit together;
    the respective source electrode connecting line is further connected to a respective data connecting pad of the plurality of data connecting pads; and
    the respective data connecting pad is connected to a respective data line of the plurality of data lines;
    wherein the array substrate further comprises a plurality of anodes;
    a respective anode of the plurality of anodes has a first maximum width; and
    the respective source electrode connecting line has a second maximum width;
    the second maximum width is greater than at least 75% of the first maximum width.

2. The array substrate of claim 1, wherein, in the repeating unit, a number of pixel driving circuits is N, N being an integer equal to or greater than 1;
    a number of data lines configured to provide data signals to the repeating unit is (N/2);
    a number of data connecting pads in the repeating unit is (N/2); and
    a number of source electrode connecting lines in the repeating unit is (N/2).

3. The array substrate of claim 1, wherein, in the repeating unit, first electrodes of four transistors respectively in two pixel driving circuits respectively in two adjacent pixels in the same column are connected to a same source electrode connecting line; and
    wherein the four transistor comprises a first transistor and a second transistor in a first pixel driving circuit in a first adjacent pixel in the same column, and a first transistor and a second transistor in a second pixel driving circuit in a second adjacent pixel in the same column.

4. The array substrate of claim 1, wherein the array substrate further comprises a plurality of drain electrode connecting lines in the repeating unit; and
    a respective drain electrode connecting line of the plurality of drain electrode connecting lines connects second electrodes of the first transistor and the second transistor in the respective pixel driving circuit together.

5. The array substrate of claim 4, wherein the array substrate further comprises a plurality of first node connecting lines in the repeating unit;
    the respective drain electrode connecting line is connected to a respective first node connecting line of the plurality of first node connecting lines; and
    the respective first node connecting line is electrically connected to a gate electrode of a driving transistor in the respective pixel driving circuit.

6. The array substrate of claim 5, wherein, in the repeating unit, a number of transistors having second electrodes connected to a first node in the repeating unit is 2N;
    a number of drain electrode connecting lines in the repeating unit is N; and
    a number of first node connecting lines in the repeating unit is N.

7. The array substrate of claim 5, wherein the array substrate further comprises a plurality of first connecting pads, a plurality of first connecting pads, and a plurality of first capacitor electrodes in the repeating unit;
    the respective first node connecting line is connected to a respective first connecting pad of the plurality of first connecting pads; and
    a respective first connecting pad of the plurality of first connecting pads is connected to a respective first capacitor electrode of the plurality of first capacitor electrodes.

8. The array substrate of claim 1, wherein the array substrate further comprises a plurality of second node connecting lines, a plurality of second connecting pads, and a plurality of anode connecting pads in the repeating unit;
    a respective second node connecting line of the plurality of second node connecting lines is connected to a second electrode of a driving transistor in the respective pixel driving circuit;
    the respective second node connecting line is connected to a respective second connecting pad of the plurality of second connecting pads;

the respective second connecting pad is connected to a respective anode connecting pad of a plurality of anode connecting pads; and the respective anode connecting pad is connected to an anode of a respective subpixel.

9. The array substrate of claim 1, further comprising a low voltage signal network configured to be provided with a low voltage signal;

wherein the low voltage signal network comprises a first interference prevention block configured to shield at least portions of active layers of the first transistor and a driving transistor from electromagnetic interference;

wherein the first interference prevention block is in a same layer as the active layers of the first transistor and the driving transistor.

10. The array substrate of claim 9, wherein the low voltage signal network further comprises a third interference prevention block configured to shield at least portions of active layers of the first transistor and the driving transistor from electromagnetic interference;

wherein the third interference prevention block is connected to the first interference prevention block, and in a layer different from the first interference prevention block; and an orthographic projection of the third interference prevention block on a base substrate at least partially overlaps with an orthographic projection of active layers of multiple driving transistors in the repeating unit on the base substrate.

11. The array substrate of claim 10, wherein the low voltage signal network further comprises a ground plate connected to the third interference prevention block, and in a layer different from the first interference prevention block or the third interference prevention block;

wherein the ground plate in the repeating unit extends throughout at least 50% of the repeating unit; and an orthographic projection of the ground plate on the base substrate at least partially overlaps with an orthographic projection of the third interference prevention block in the repeating unit on the base substrate; and at least partially overlaps with an orthographic projection of the first interference prevention block in the repeating unit on the base substrate.

12. The array substrate of claim 11, wherein the low voltage signal network further comprises a plurality of ground lines connected to the ground plate, and in a layer different from the ground plate, the first interference prevention block, or the third interference prevention block;

wherein the plurality of ground lines are in a same layer as a plurality of data lines; and the plurality of ground lines and the plurality of data lines extend along a direction substantially parallel to a second direction.

13. The array substrate of claim 12, wherein the low voltage signal network further comprises a second capacitor electrode connected to the plurality of ground lines, and in a layer different from the plurality of ground lines, the ground plate, the first interference prevention block, or the third interference prevention block.

14. The array substrate of claim 1, further comprising an interconnected voltage supply network;

wherein the interconnected voltage supply network comprises a plurality of first voltage supply lines and a plurality of voltage supply connecting lines;

the plurality of first voltage supply lines extend along a direction substantially parallel to the first direction;

the plurality of voltage supply connecting lines extend along a direction substantially parallel to the second direction;

the plurality of first voltage supply lines are in a layer different from the plurality of voltage supply connecting lines;

a respective voltage supply connecting line of the plurality of voltage supply connecting lines is connected to a respective first voltage supply line of the plurality of first voltage supply lines through one or more vias; and two adjacent voltage supply connecting lines of the plurality of voltage supply connecting lines and two adjacent first voltage supply lines of the plurality of first voltage supply lines substantially surround pixel driving circuits of the repeating unit.

15. The array substrate of claim 1, further comprising a plurality of second voltage supply lines and a plurality of anode connecting pads in a same layer, and a cathode on a side of the plurality of second voltage supply lines away from a base substrate;

wherein a respective second voltage supply line of the plurality of second voltage supply lines is connected to the cathode through one or more via.

16. The array substrate of claim 15, further comprising a peripheral second voltage supply line in a peripheral area of the array substrate;

the plurality of second voltage supply lines are connected to the peripheral second voltage supply line; and the peripheral second voltage supply line substantially surrounds a display area of the array substrate.

17. The array substrate of claim 1, wherein the repeating unit comprises four pixels; and a respective pixel of the four pixels in the repeating unit comprises at least three subpixels.

18. The array substrate of claim 1, wherein corresponding layers of pixel driving circuits in adjacent pixels in the repeating unit have a substantially mirror symmetry with respect to each other about a plane perpendicular to a main surface of the array substrate and substantially parallel to a plurality of data lines.

19. The array substrate of claim 1, wherein the respective pixel driving circuit comprises:

a driving transistor, a first transistor, and a second transistor; and a storage capacitor having a first capacitor electrode and a second capacitor electrode;

wherein a gate electrode of the driving transistor is connected to second electrodes of the first transistor and the second transistor, and is connected to the first capacitor electrode;

a first electrode of the driving transistor is connected to a respective first voltage supply line of a plurality of first voltage supply lines;

a second electrode of the driving transistor is connected to an anode of a light emitting element;

a gate electrode of the first transistor is connected to a respective first gate line of a plurality of first gate lines;

a gate electrode of the second transistor is connected to a respective second gate line of a plurality of second gate lines;

first electrodes of the first transistor and the second transistor are connected to a respective data line of the plurality of data lines; and the second capacitor electrode is configured to be provided with a low voltage signal.

20. A display apparatus, comprising the array substrate of claim 1, and one or more integrated circuits connected to the array substrate;
- wherein the array substrate comprises a plurality of light emitting elements;
- a respective light emitting element of the plurality of light emitting elements comprises an anode of the plurality of anodes; and
- the plurality of anodes are connected to the one or more integrated circuits.

* * * * *